(12) United States Patent
Oka et al.

(10) Patent No.: US 11,089,293 B2
(45) Date of Patent: Aug. 10, 2021

(54) IMAGING DEVICE

(71) Applicant: Sony Semiconductor Solutions Corporation, Kanagawa (JP)

(72) Inventors: Takumi Oka, Kanagawa (JP); Naoki Kawazu, Kanagawa (JP); Atsushi Suzuki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/768,390

(22) PCT Filed: Nov. 7, 2018

(86) PCT No.: PCT/JP2018/041307
§ 371 (c)(1),
(2) Date: May 29, 2020

(87) PCT Pub. No.: WO2019/111624
PCT Pub. Date: Jun. 13, 2019

(65) Prior Publication Data
US 2020/0322597 A1 Oct. 8, 2020

(30) Foreign Application Priority Data
Dec. 6, 2017 (JP) .............................. JP2017-234360

(51) Int. Cl.
*H04N 5/3745* (2011.01)
*H04N 5/376* (2011.01)
*H04N 17/00* (2006.01)

(52) U.S. Cl.
CPC .......... *H04N 17/002* (2013.01); *H04N 5/376* (2013.01); *H04N 5/37455* (2013.01)

(58) Field of Classification Search
CPC .......... G01R 31/2856; H01L 27/14605; H04N 5/367
(Continued)

(56) References Cited
U.S. PATENT DOCUMENTS

| 2005/0024510 A1* | 2/2005 | Lapstun ................. H04N 5/378 348/294 |
| 2005/0068436 A1* | 3/2005 | Fraenkel ................ H04N 5/235 348/294 |

(Continued)

FOREIGN PATENT DOCUMENTS

| JP | 2009-118427 A | 5/2009 |
| JP | 2014-017834 A | 1/2014 |
| WO | 2006/120815 A1 | 11/2006 |

*Primary Examiner* — Paulos M Natnael
(74) *Attorney, Agent, or Firm* — Michael Best & Friedrich LLP

(57) ABSTRACT

In one example, an imaging device including a plurality of pixel circuits a first control line, a second control line, a first voltage supply line, a second voltage supply line, a first light-receiving element, and a diagnosis unit is disclosed. The pixel circuits each includes a first terminal, a second terminal, a third terminal, an accumulation unit, a first transistor, a second transistor, and an output unit. The first transistor is couples the third terminal to the accumulation unit on the basis of a voltage of the first terminal. The second transistor supplies a predetermined voltage to the accumulation unit on the basis of a voltage of the second terminal. The output unit to outputs a signal corresponding to a voltage in the accumulation unit.

19 Claims, 38 Drawing Sheets

(58) Field of Classification Search
USPC .................................................. 348/207.99
See application file for complete search history.

(56) References Cited

U.S. PATENT DOCUMENTS

| | | | | |
|---|---|---|---|---|
| 2005/0231620 | A1* | 10/2005 | Fraenkel | H04N 5/378 348/308 |
| 2006/0054783 | A1* | 3/2006 | Voronov | H04N 5/2351 250/208.1 |
| 2013/0083204 | A1* | 4/2013 | Solhusvik | H04N 5/378 348/187 |
| 2013/0110444 | A1* | 5/2013 | Pahr | H04N 17/002 702/116 |

* cited by examiner

[FIG. 1]
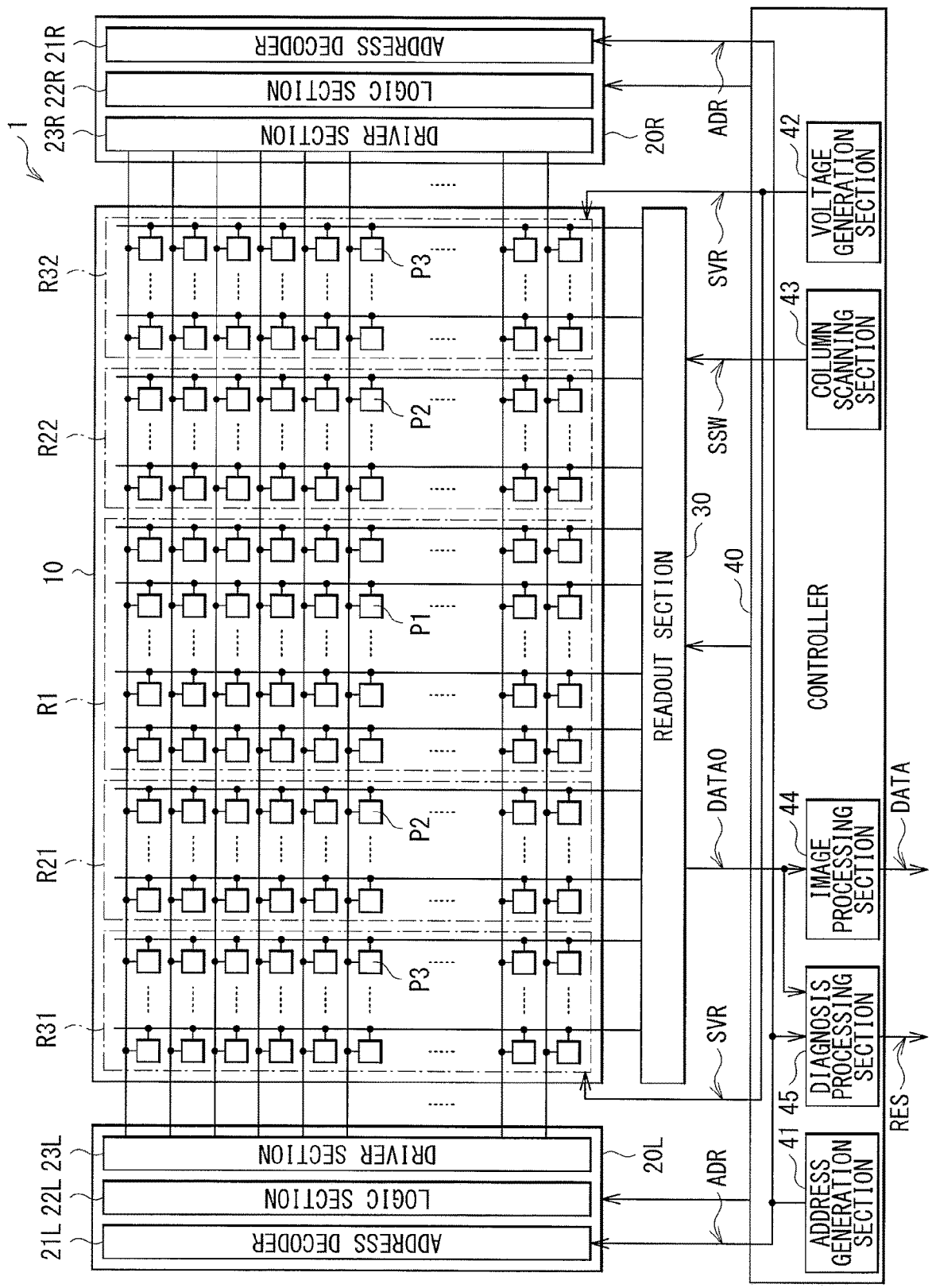

[FIG. 2]
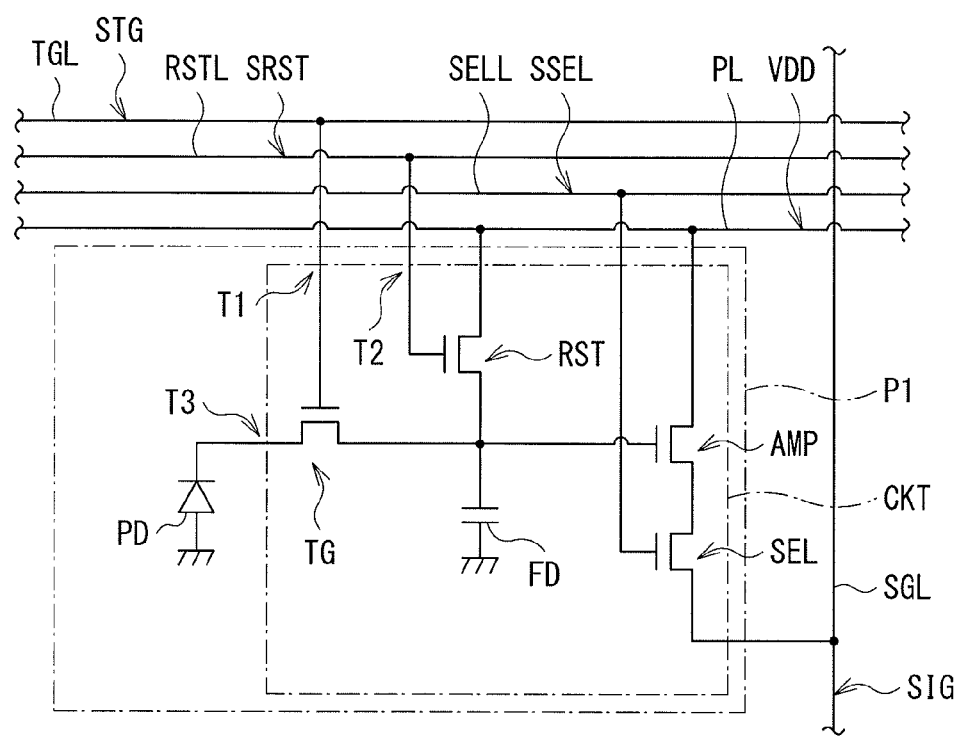

[ FIG. 3A ]
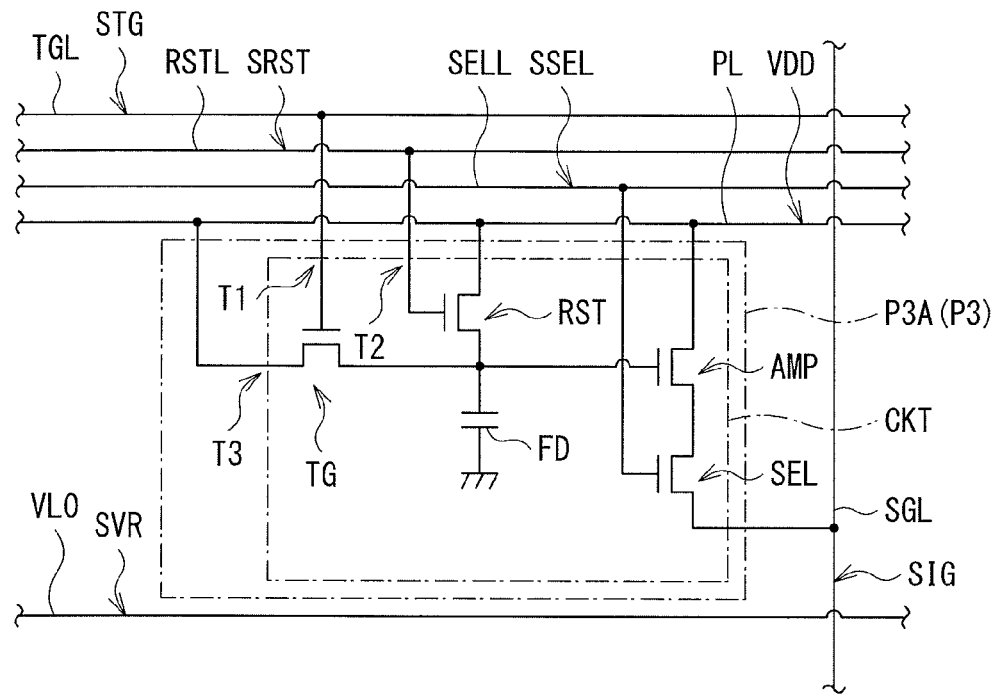
[ FIG. 3B ]
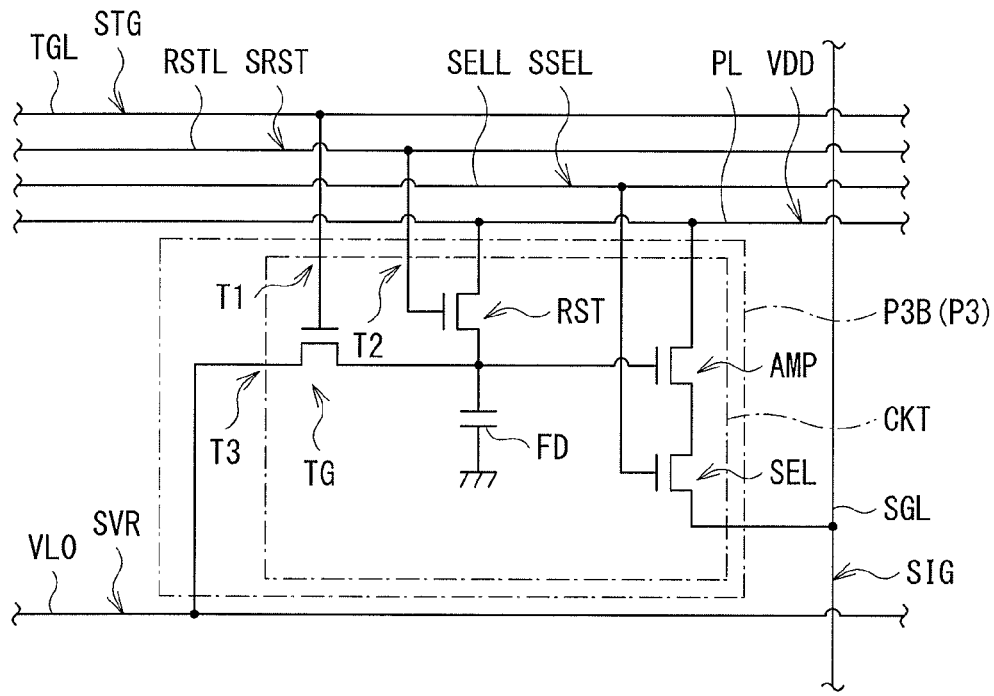

[FIG. 4]
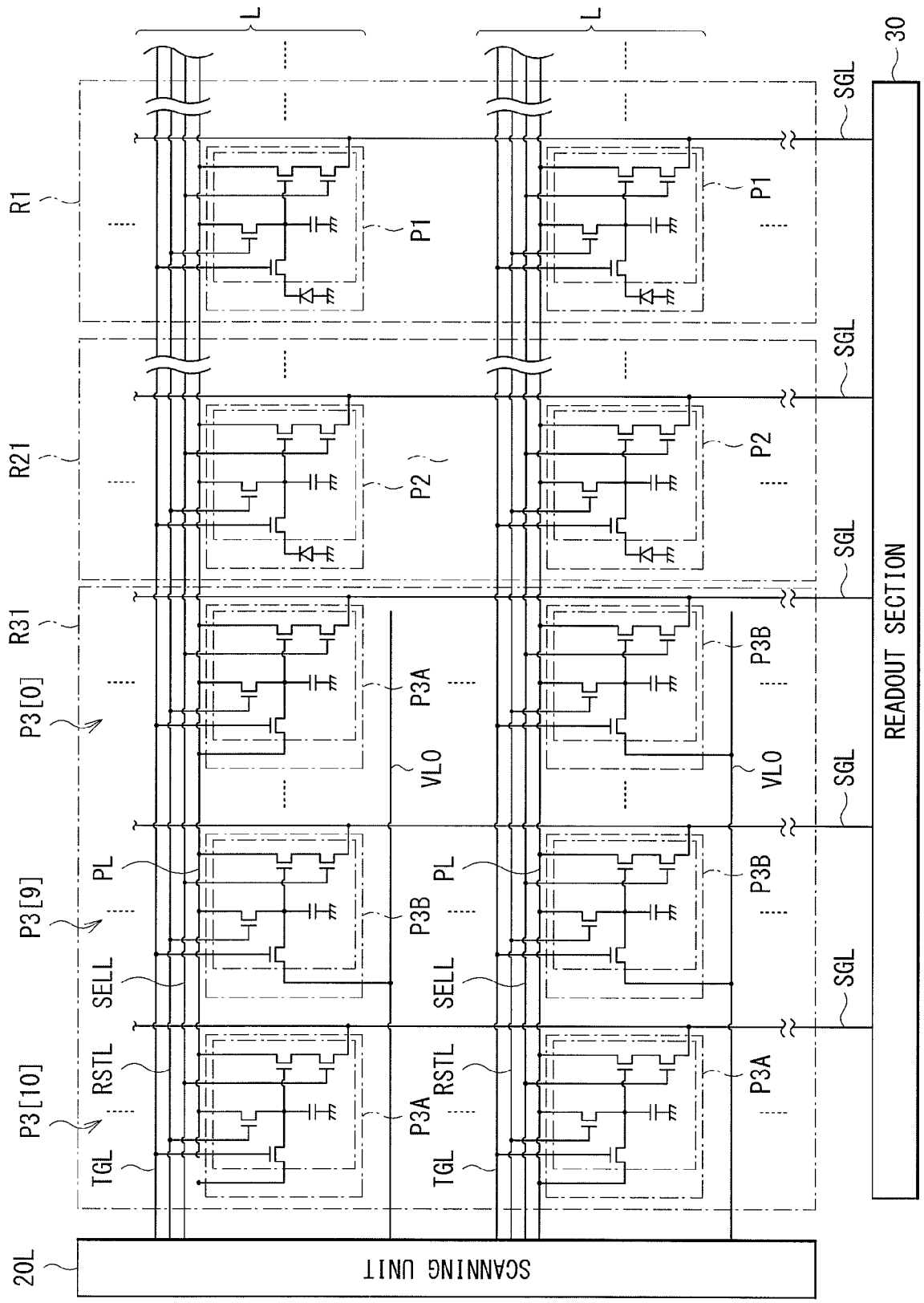

[ FIG. 5 ]

| | P3[10] | P3[9] | P3[8] | P3[7] | P3[6] | P3[5] | P3[4] | P3[3] | P3[2] | P3[1] | P3[0] | 0:P3A 1:P3B |
|---|---|---|---|---|---|---|---|---|---|---|---|---|
| PIXEL LINE L[0] | 0 | 0 | 0 | 0 | 0 | 0 | 0 | 0 | 0 | 0 | 0 | INFL |
| PIXEL LINE L[1] | 0 | 0 | 0 | 0 | 0 | 0 | 0 | 0 | 0 | 0 | 1 | |
| PIXEL LINE L[2] | 0 | 0 | 0 | 0 | 0 | 0 | 0 | 0 | 0 | 1 | 0 | |
| PIXEL LINE L[3] | 0 | 0 | 0 | 0 | 0 | 0 | 0 | 0 | 0 | 1 | 1 | |
| PIXEL LINE L[4] | 0 | 0 | 0 | 0 | 0 | 0 | 0 | 0 | 1 | 0 | 0 | |
| PIXEL LINE L[5] | 0 | 0 | 0 | 0 | 0 | 0 | 0 | 0 | 1 | 0 | 1 | |
| PIXEL LINE L[6] | 0 | 0 | 0 | 0 | 0 | 0 | 0 | 0 | 1 | 1 | 0 | |
| PIXEL LINE L[7] | 0 | 0 | 0 | 0 | 0 | 0 | 0 | 0 | 1 | 1 | 1 | |
| PIXEL LINE L[8] | 0 | 0 | 0 | 0 | 0 | 0 | 0 | 1 | 0 | 0 | 0 | |

[ FIG. 6 ]
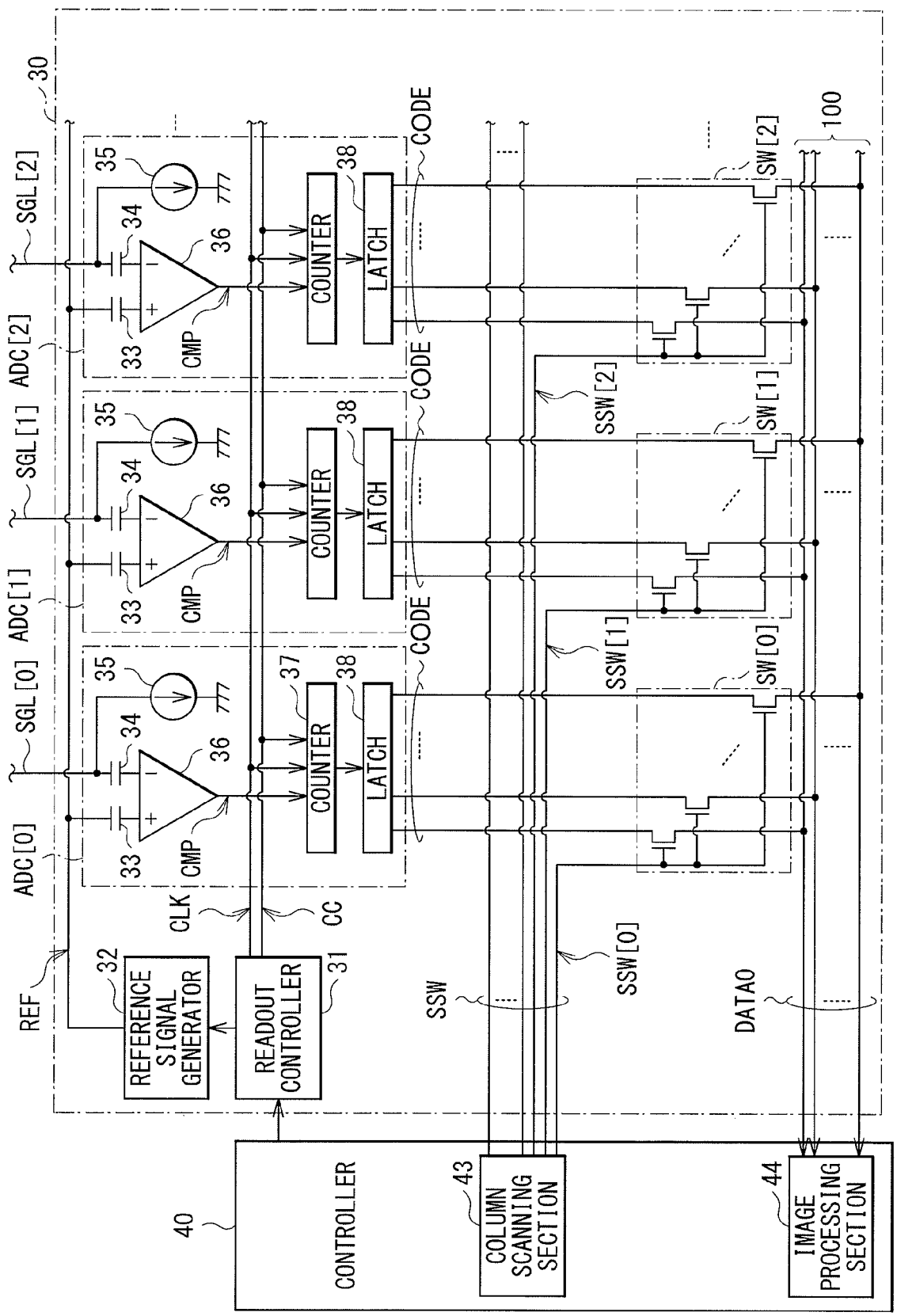

[ FIG. 7 ]
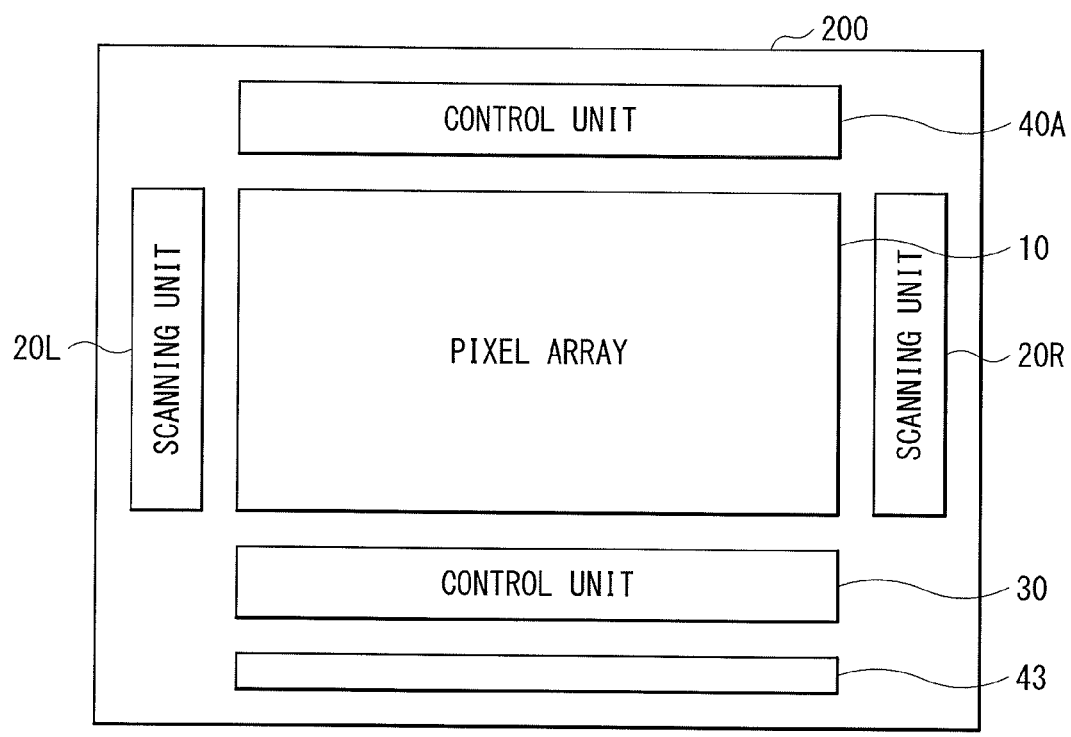

[FIG. 8]
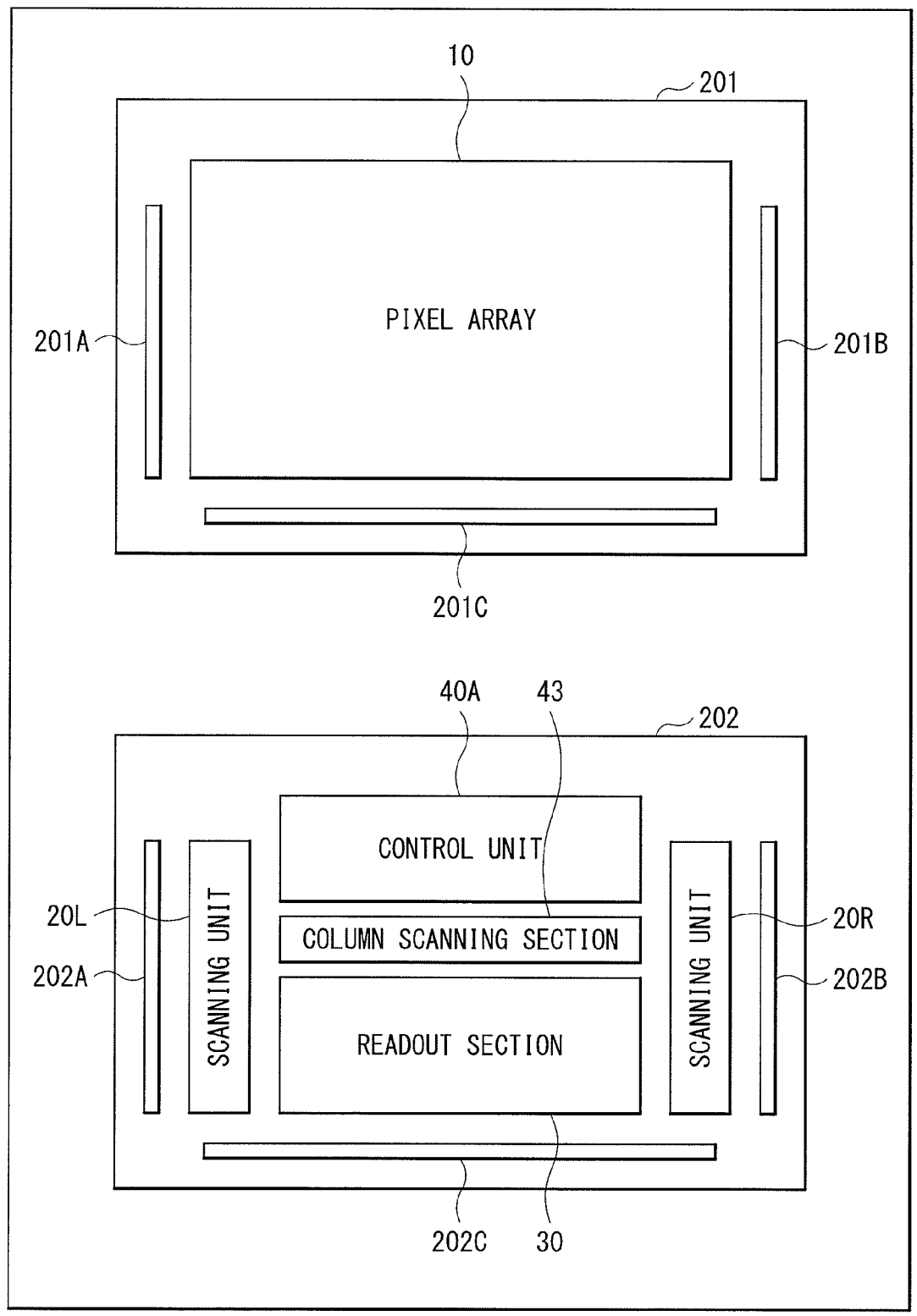

[ FIG. 9 ]
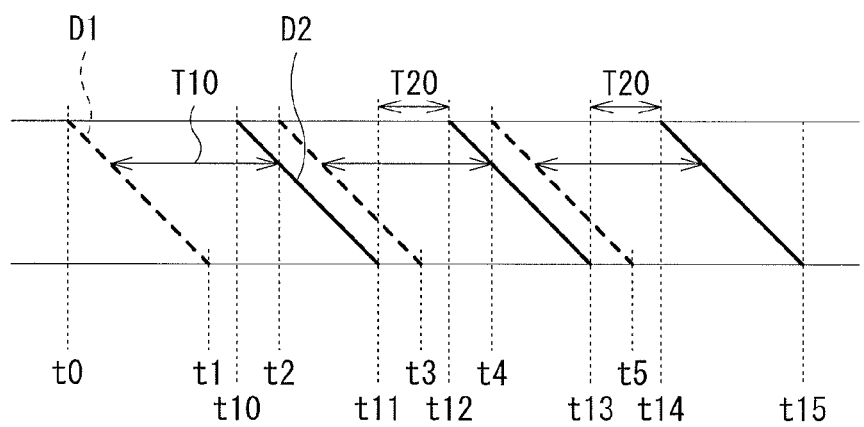

[FIG. 10]
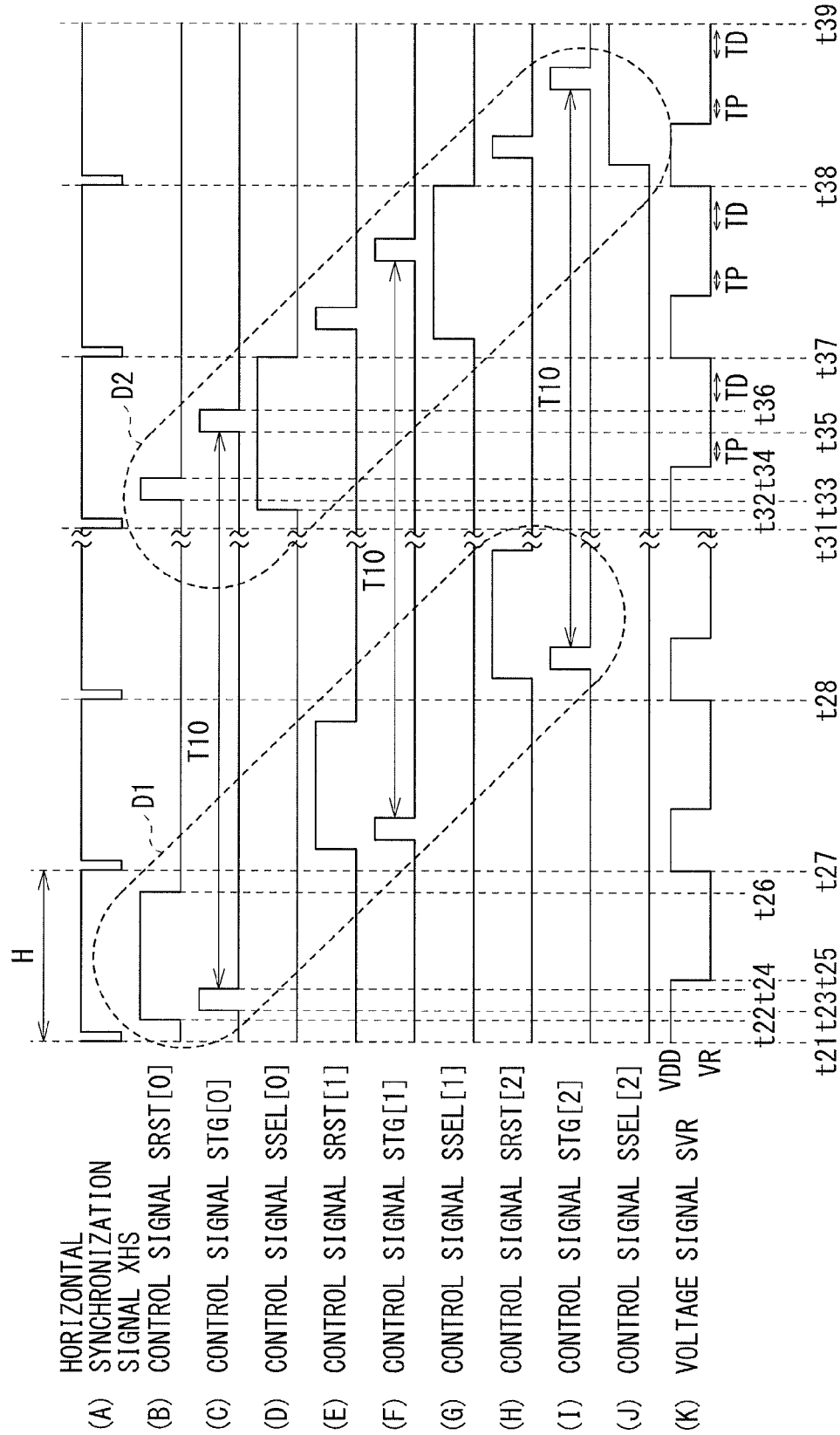

[ FIG. 11 ]
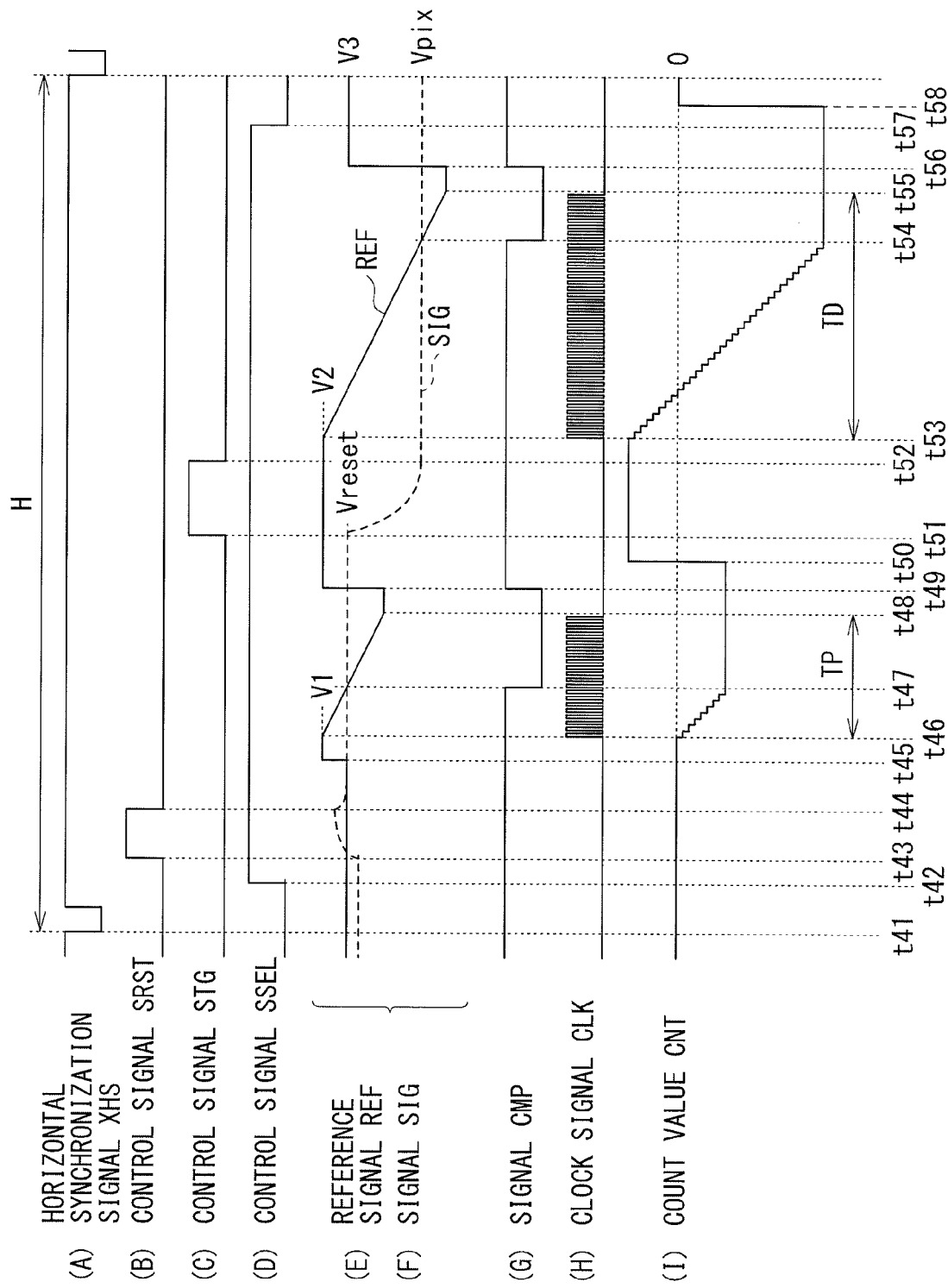

[ FIG. 12 ]
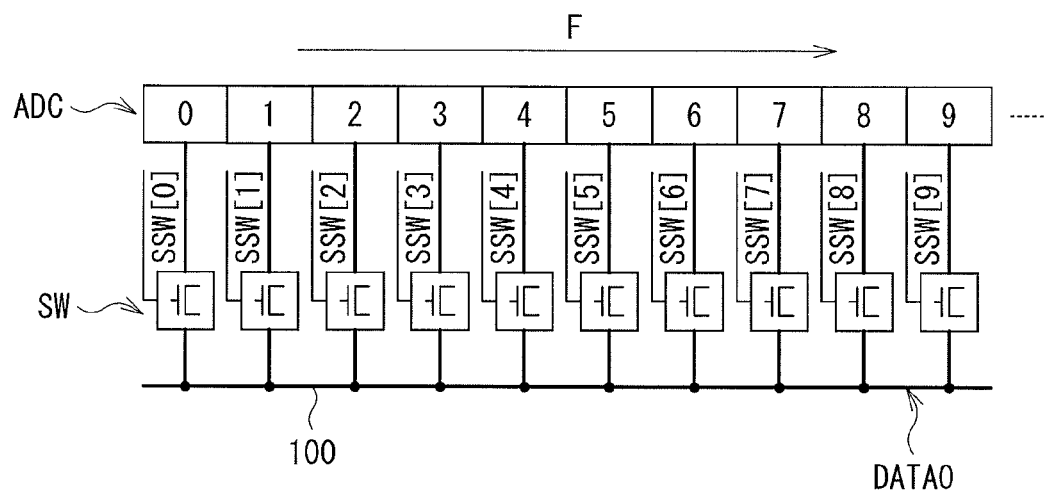

[FIG. 13]
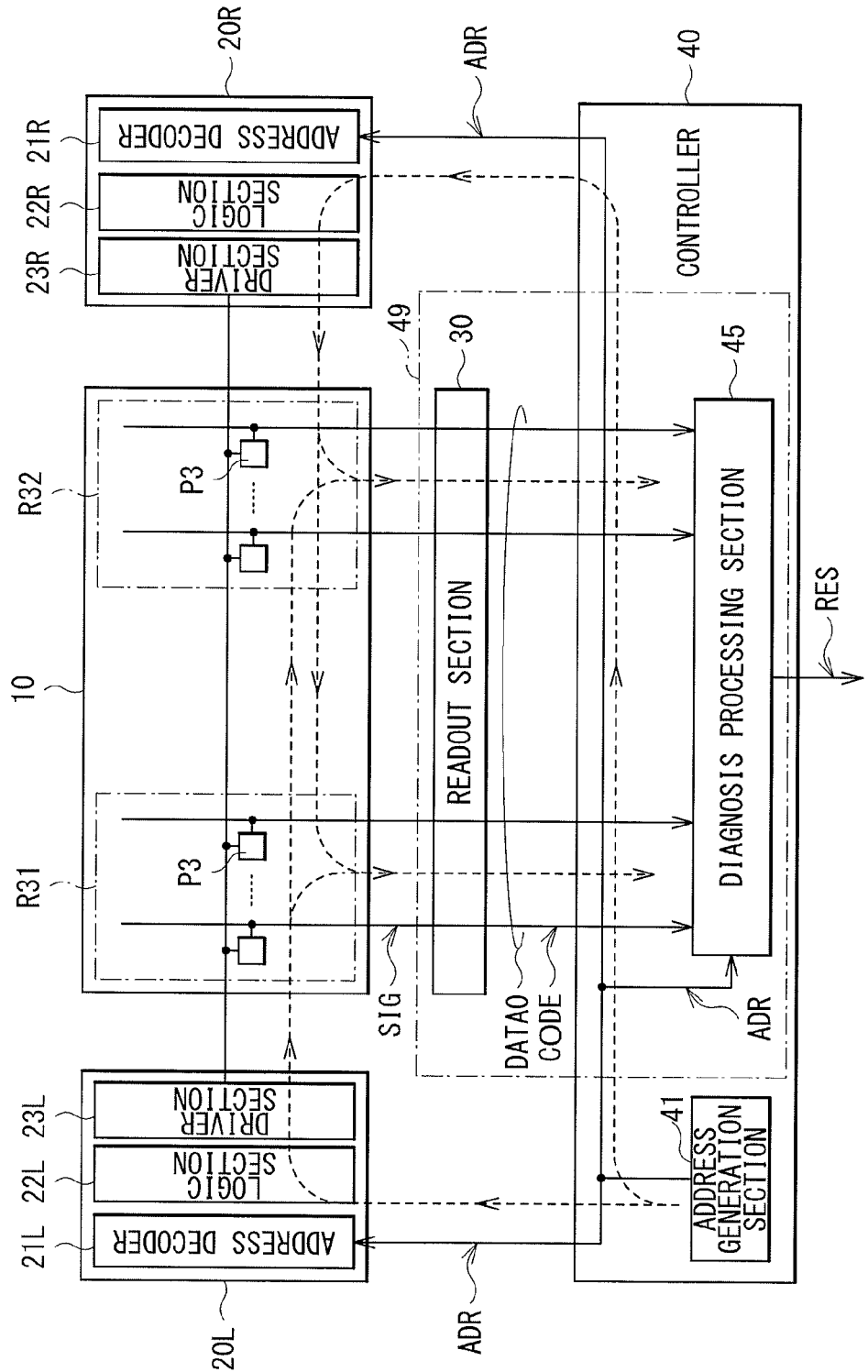

[ FIG. 14 ]
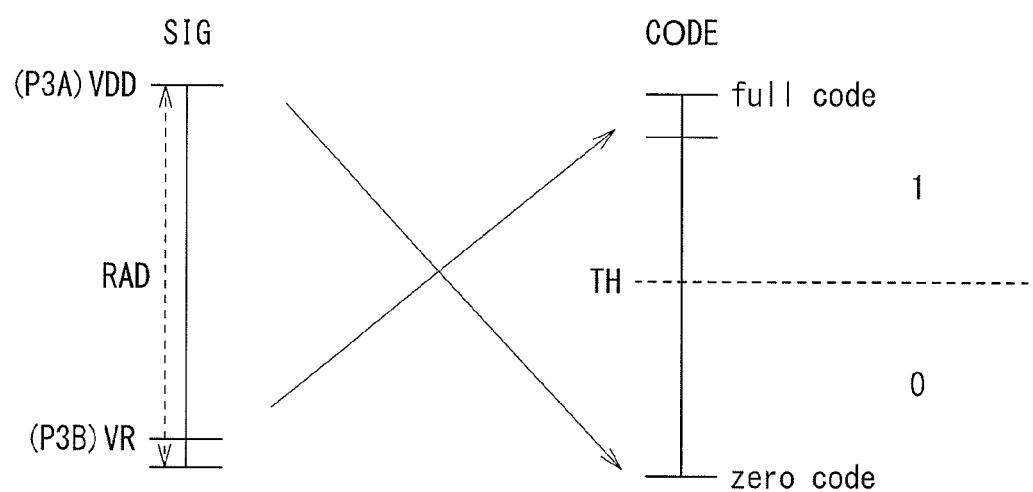

[FIG. 15]
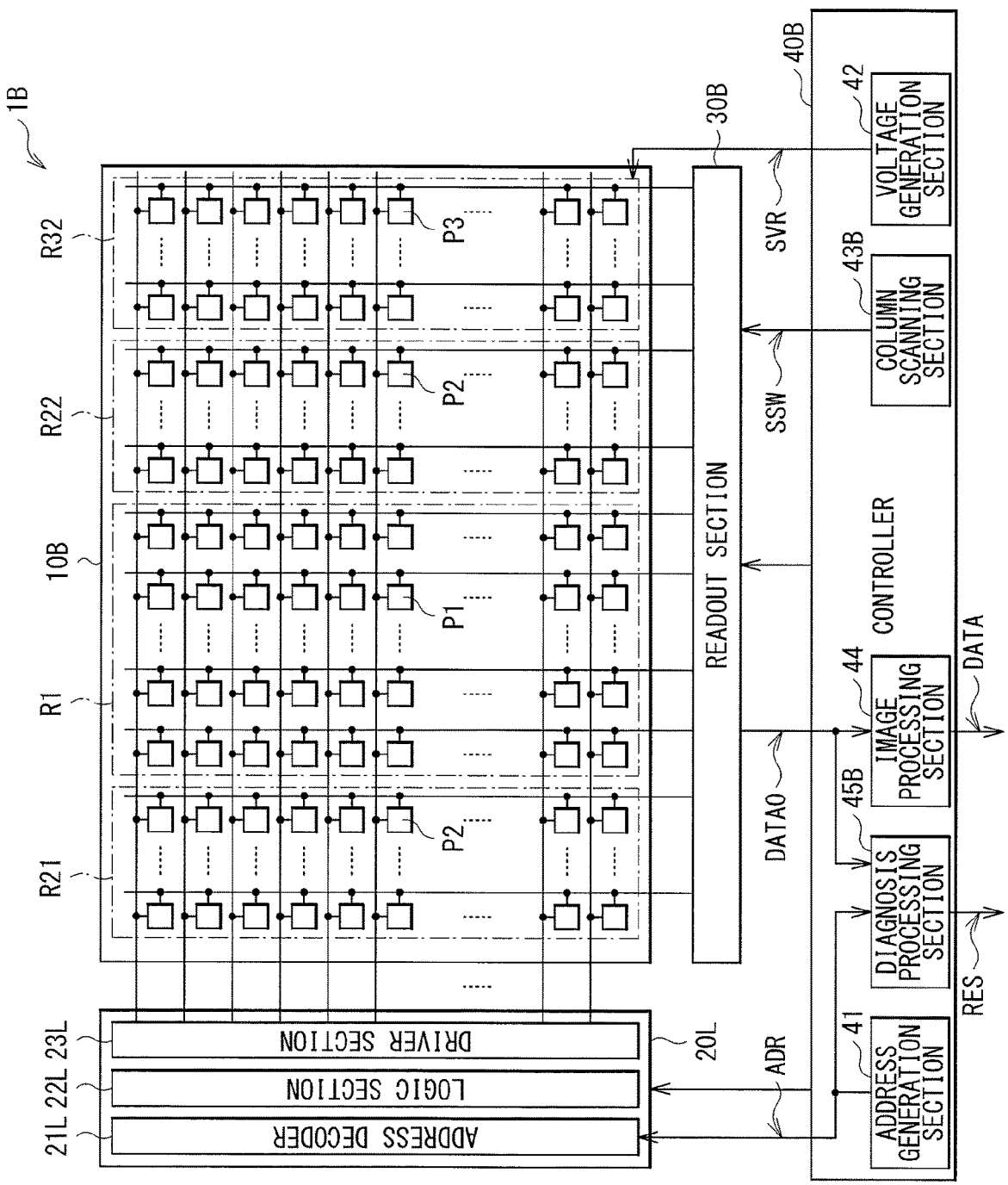

[ FIG. 16A ]
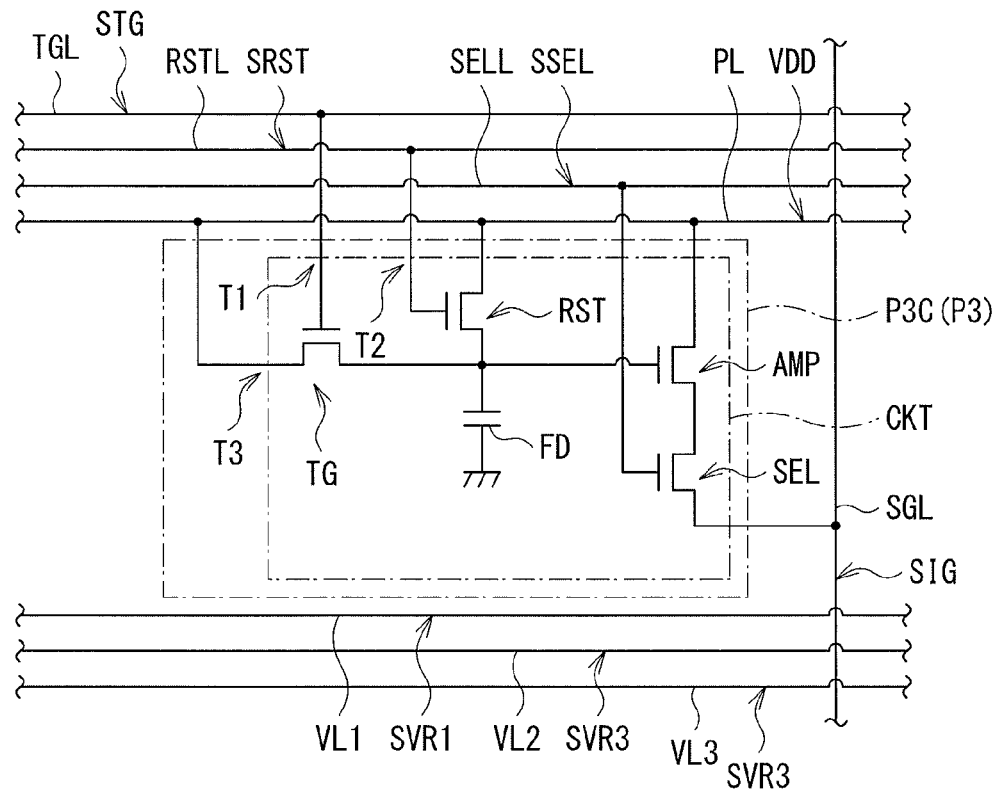
[ FIG. 16B ]
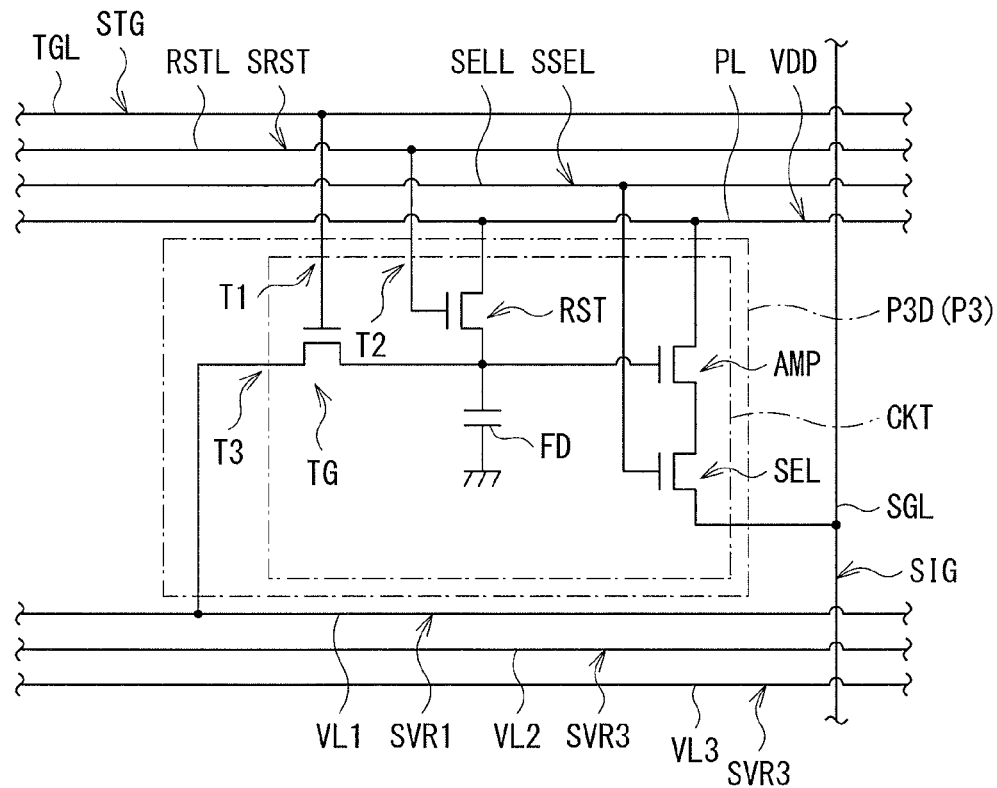

[ FIG. 16C ]
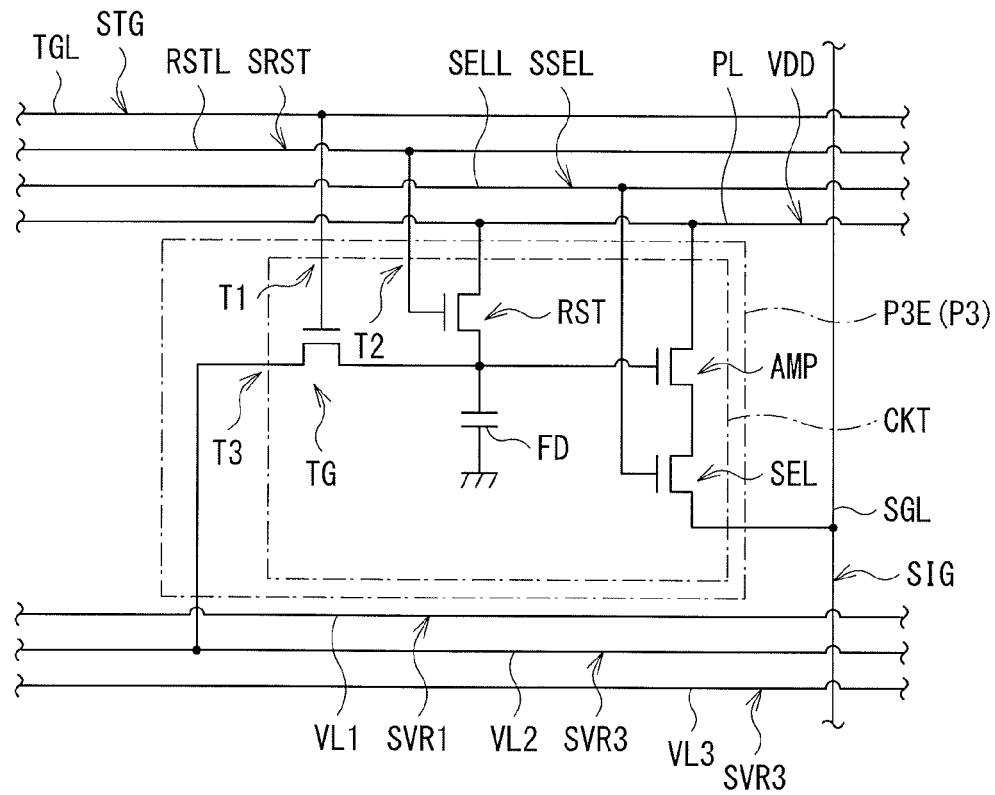
[ FIG. 16D ]
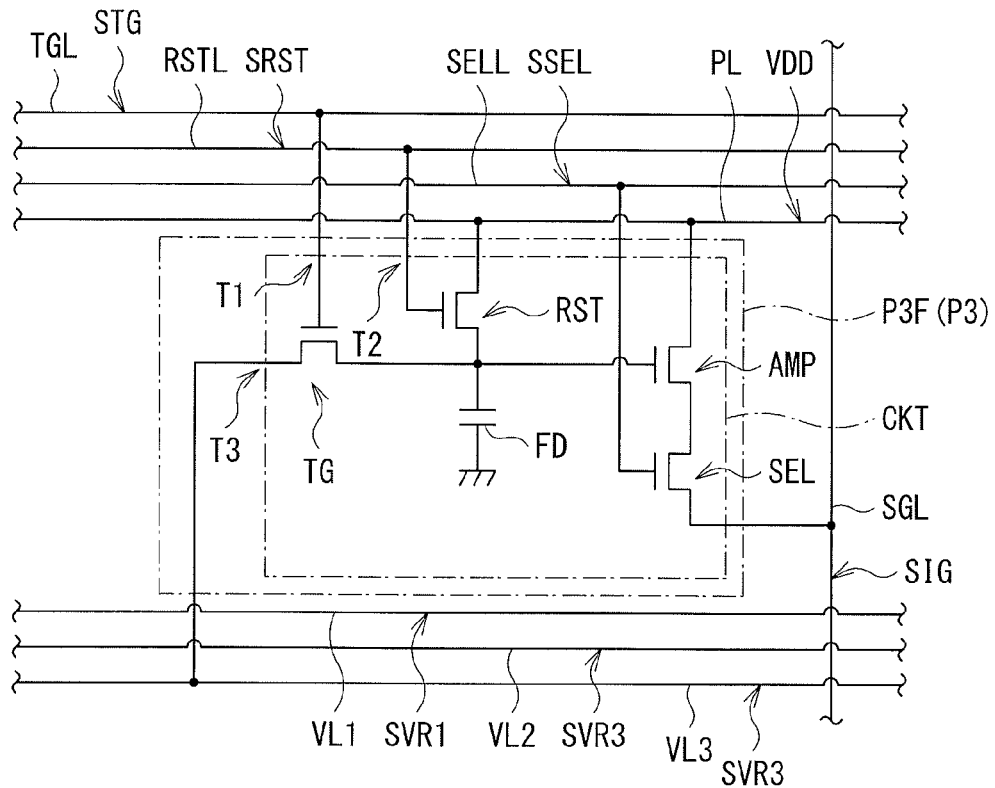

|  | P3[5] | P3[4] | P3[3] | P3[2] | P3[1] | P3[0] |
|---|---|---|---|---|---|---|
| PIXEL LINE L[0] | 00 | 00 | 00 | 00 | 00 | 00 |
| PIXEL LINE L[1] | 00 | 00 | 00 | 00 | 00 | 01 |
| PIXEL LINE L[2] | 00 | 00 | 00 | 00 | 00 | 10 |
| PIXEL LINE L[3] | 00 | 00 | 00 | 00 | 00 | 11 |
| PIXEL LINE L[4] | 00 | 00 | 00 | 00 | 01 | 00 |
| PIXEL LINE L[5] | 00 | 00 | 00 | 00 | 01 | 01 |
| PIXEL LINE L[6] | 00 | 00 | 00 | 00 | 01 | 10 |
| PIXEL LINE L[7] | 00 | 00 | 00 | 00 | 01 | 11 |
| PIXEL LINE L[8] | 00 | 00 | 00 | 00 | 10 | 00 |

INFL

[ FIG. 18 ]
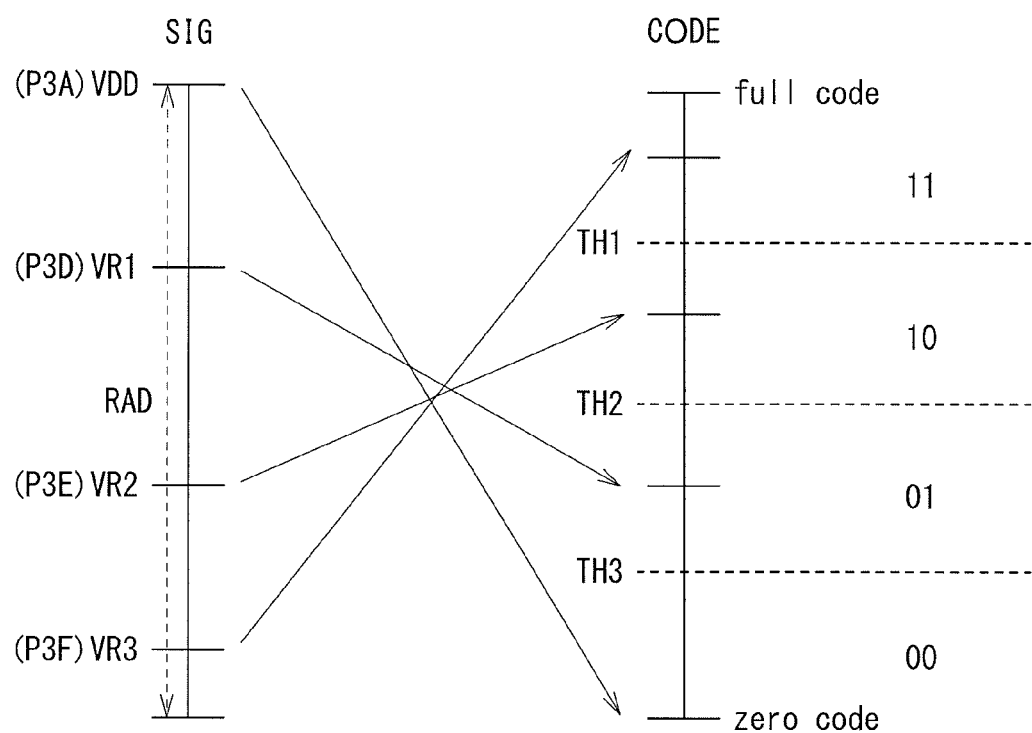

[ FIG. 19 ]

|  | P3[12] | P3[11] | P3[10] | P3[9] | P3[8] | P3[7] | P3[6] | P3[5] | P3[4] | P3[3] | P3[2] | P3[1] | P3[0] | 0:P3A 1:P3B |
|---|---|---|---|---|---|---|---|---|---|---|---|---|---|---|
| PIXEL LINE L[0] | 0 | 0 | 0 | 0 | 0 | 0 | 0 | 0 | 0 | 0 | 0 | 0 | 0 | |
| PIXEL LINE L[1] | 0 | 1 | 0 | 0 | 0 | 0 | 0 | 0 | 0 | 0 | 0 | 0 | 1 | |
| PIXEL LINE L[2] | 1 | 0 | 0 | 0 | 0 | 0 | 0 | 0 | 0 | 0 | 0 | 1 | 0 | |
| PIXEL LINE L[3] | 0 | 0 | 0 | 0 | 0 | 0 | 0 | 0 | 0 | 0 | 0 | 1 | 1 | |
| PIXEL LINE L[4] | 0 | 1 | 0 | 0 | 0 | 0 | 0 | 0 | 0 | 0 | 1 | 0 | 0 | |
| PIXEL LINE L[5] | 1 | 1 | 0 | 0 | 0 | 0 | 0 | 0 | 0 | 0 | 1 | 0 | 1 | |
| PIXEL LINE L[6] | 0 | 0 | 0 | 0 | 0 | 0 | 0 | 0 | 0 | 0 | 1 | 1 | 0 | |
| PIXEL LINE L[7] | 0 | 1 | 0 | 0 | 0 | 0 | 0 | 0 | 0 | 0 | 1 | 1 | 1 | |
| PIXEL LINE L[8] | 1 | 0 | 0 | 0 | 0 | 0 | 0 | 0 | 0 | 1 | 0 | 0 | 0 | |

INFP: P3[12], P3[11]
INFL: P3[10]–P3[0]

[ FIG. 20 ]
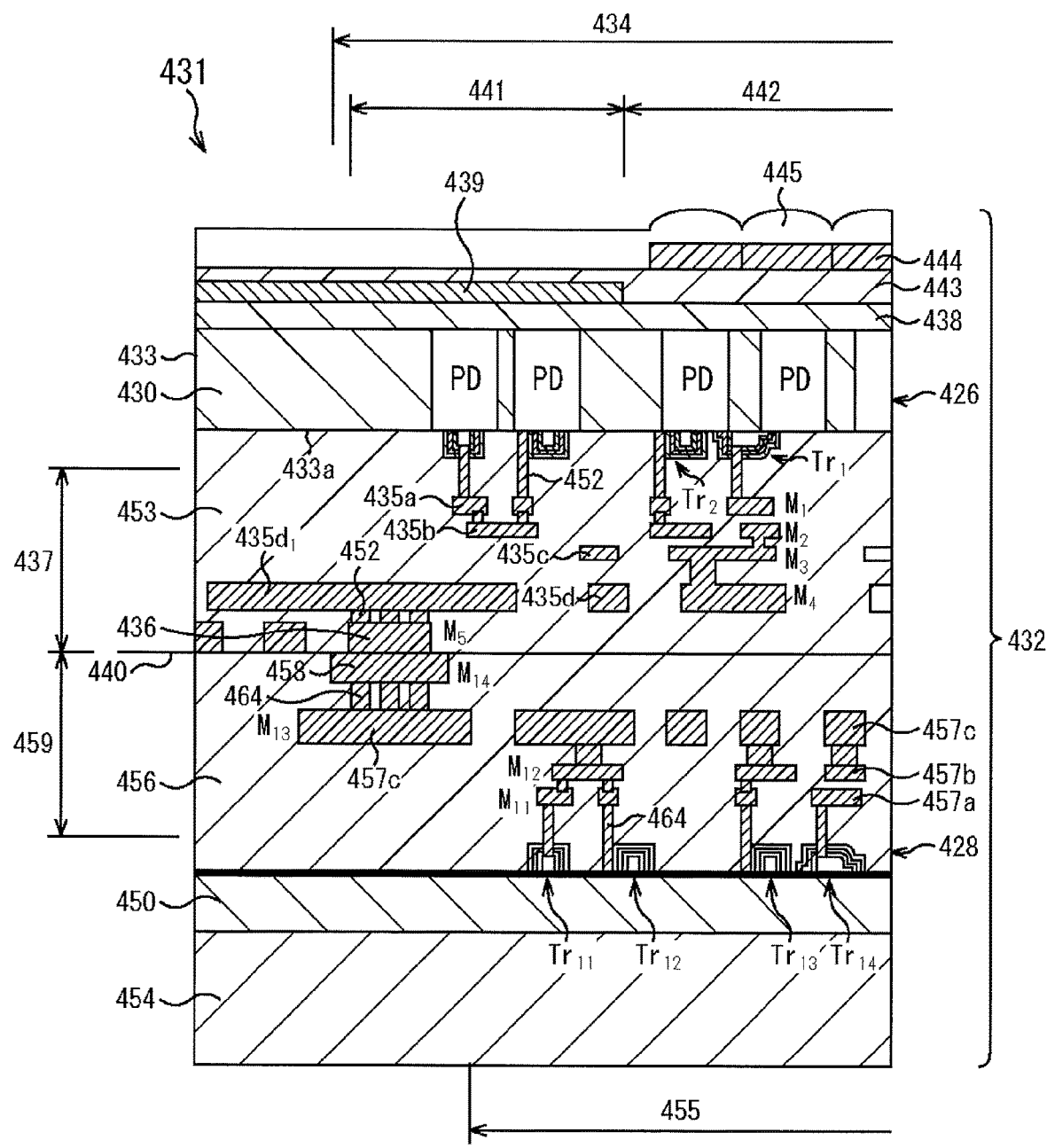

[ FIG. 21 ]
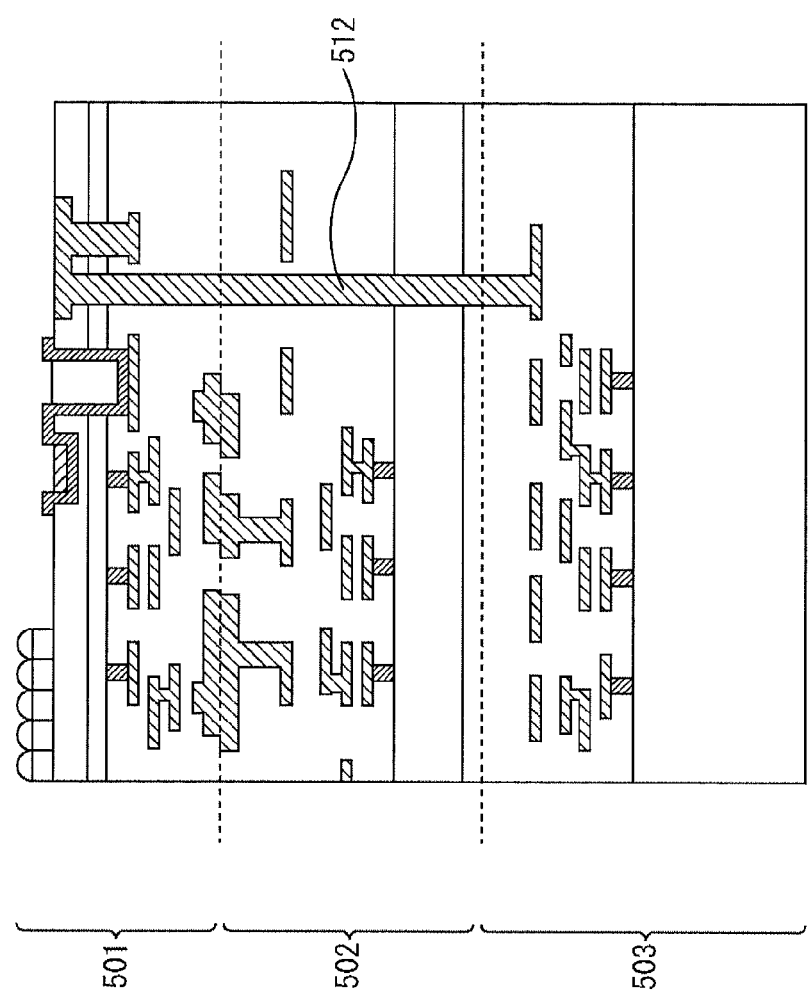

[ FIG. 22 ]
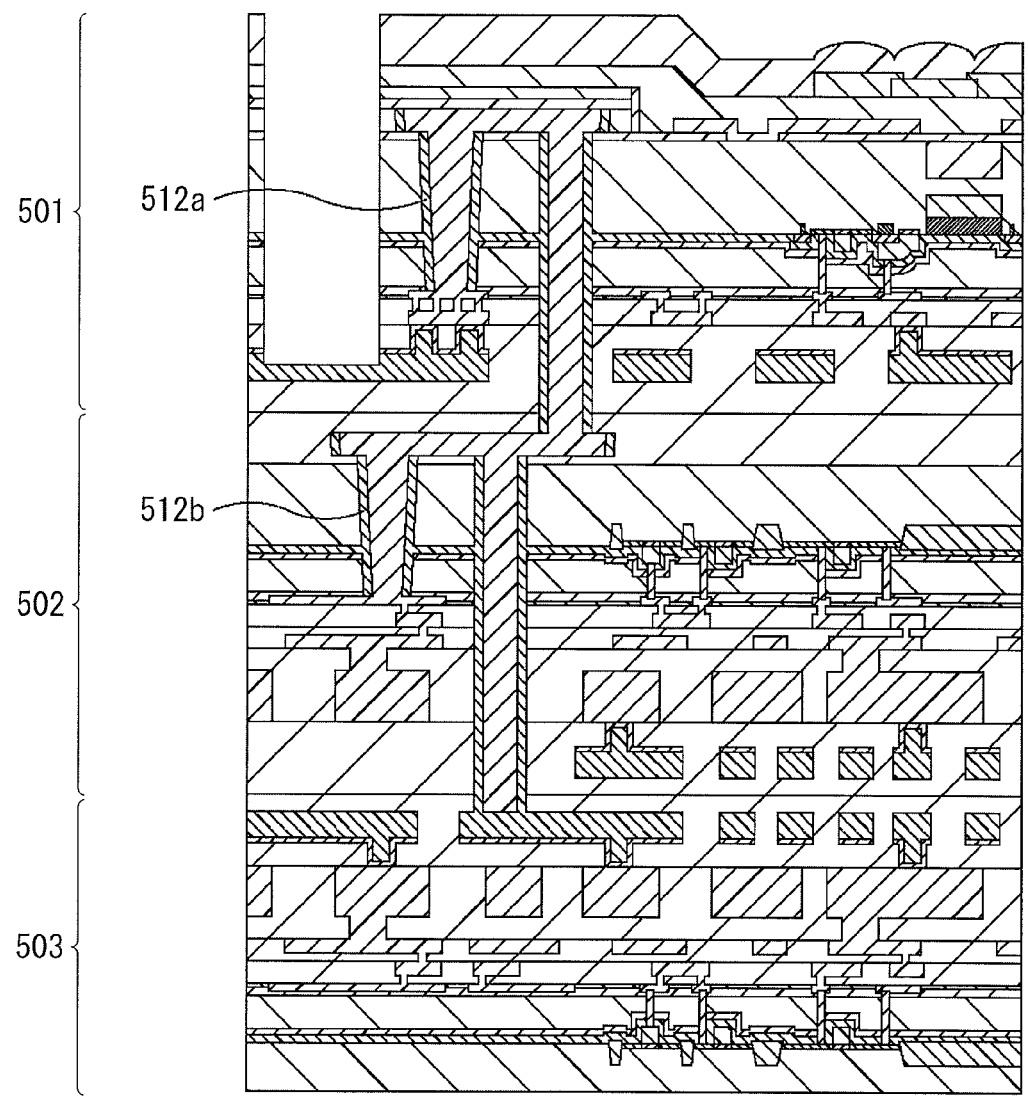

[ FIG. 23 ]
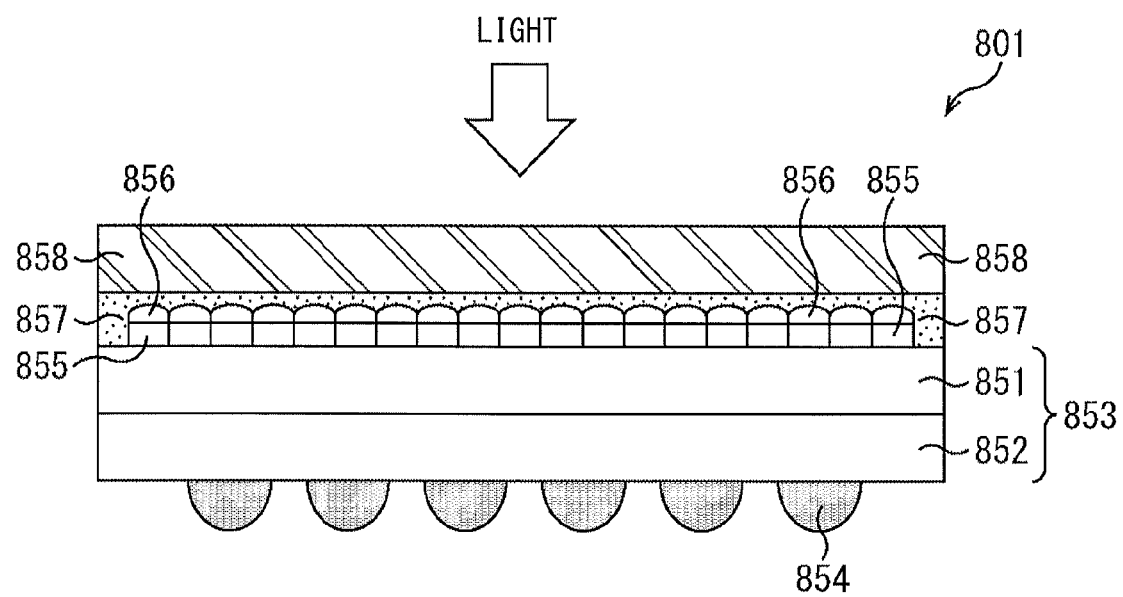

[ FIG. 24 ]
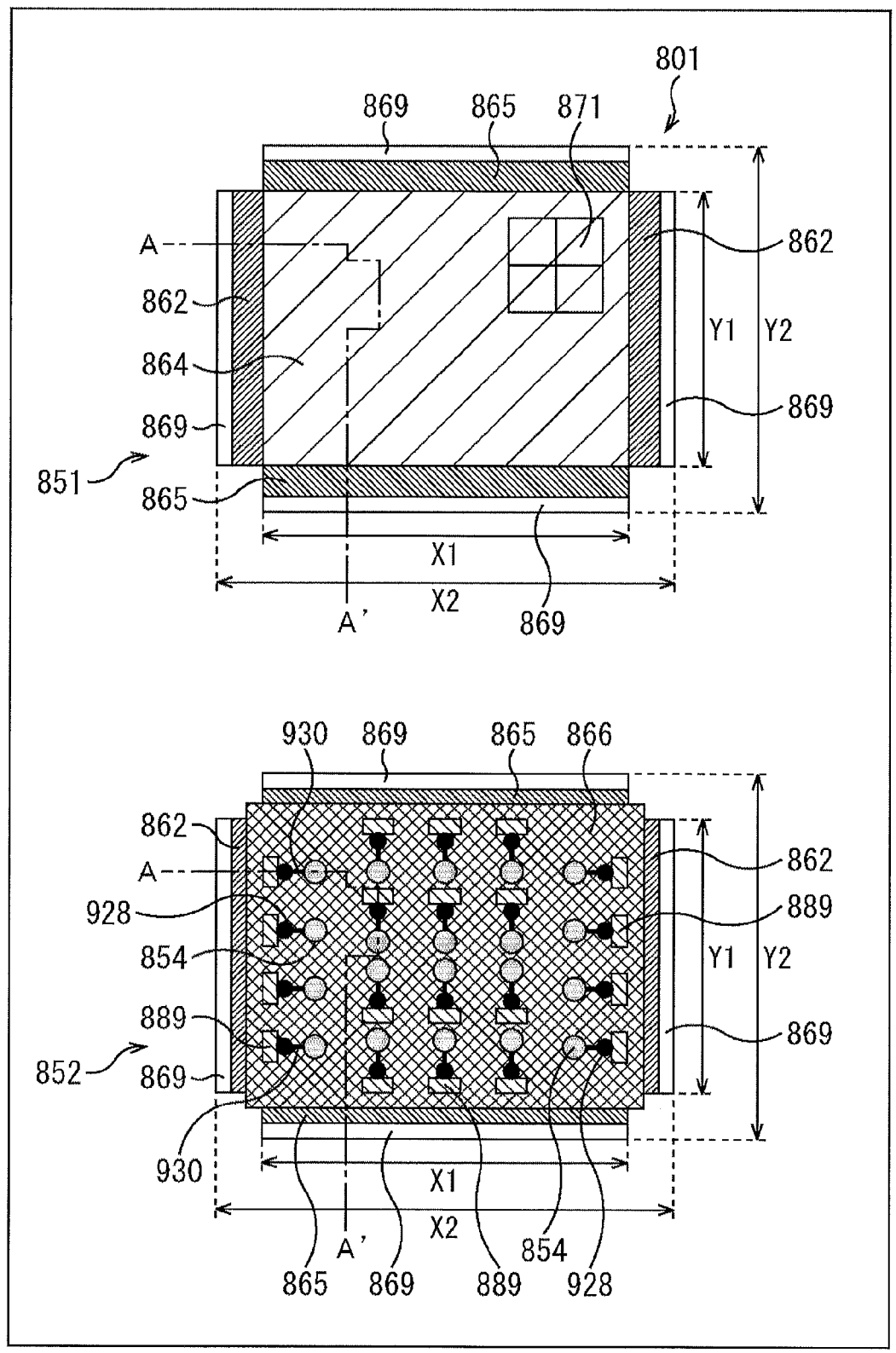

[FIG. 25]
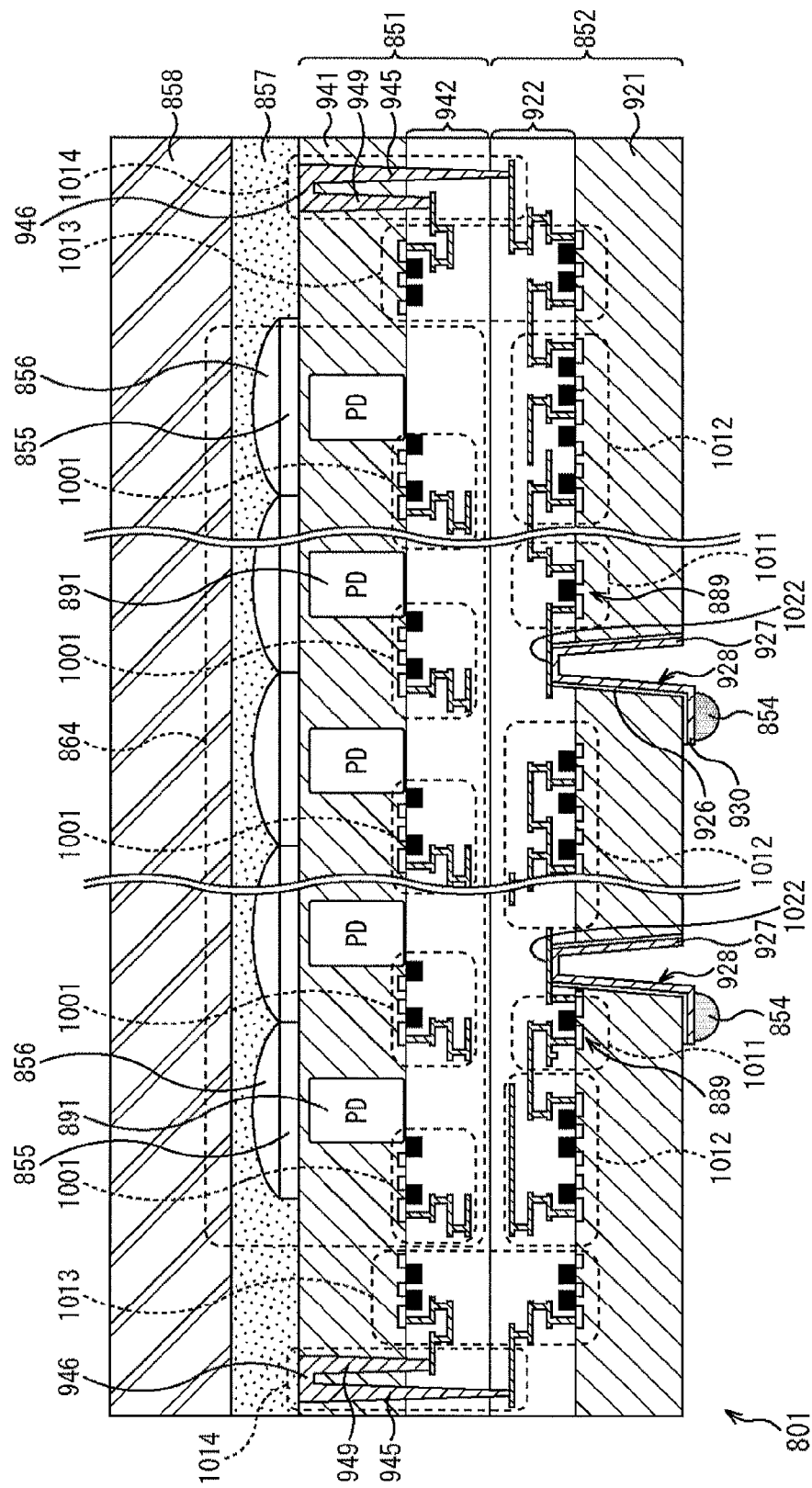

[ FIG. 26 ]
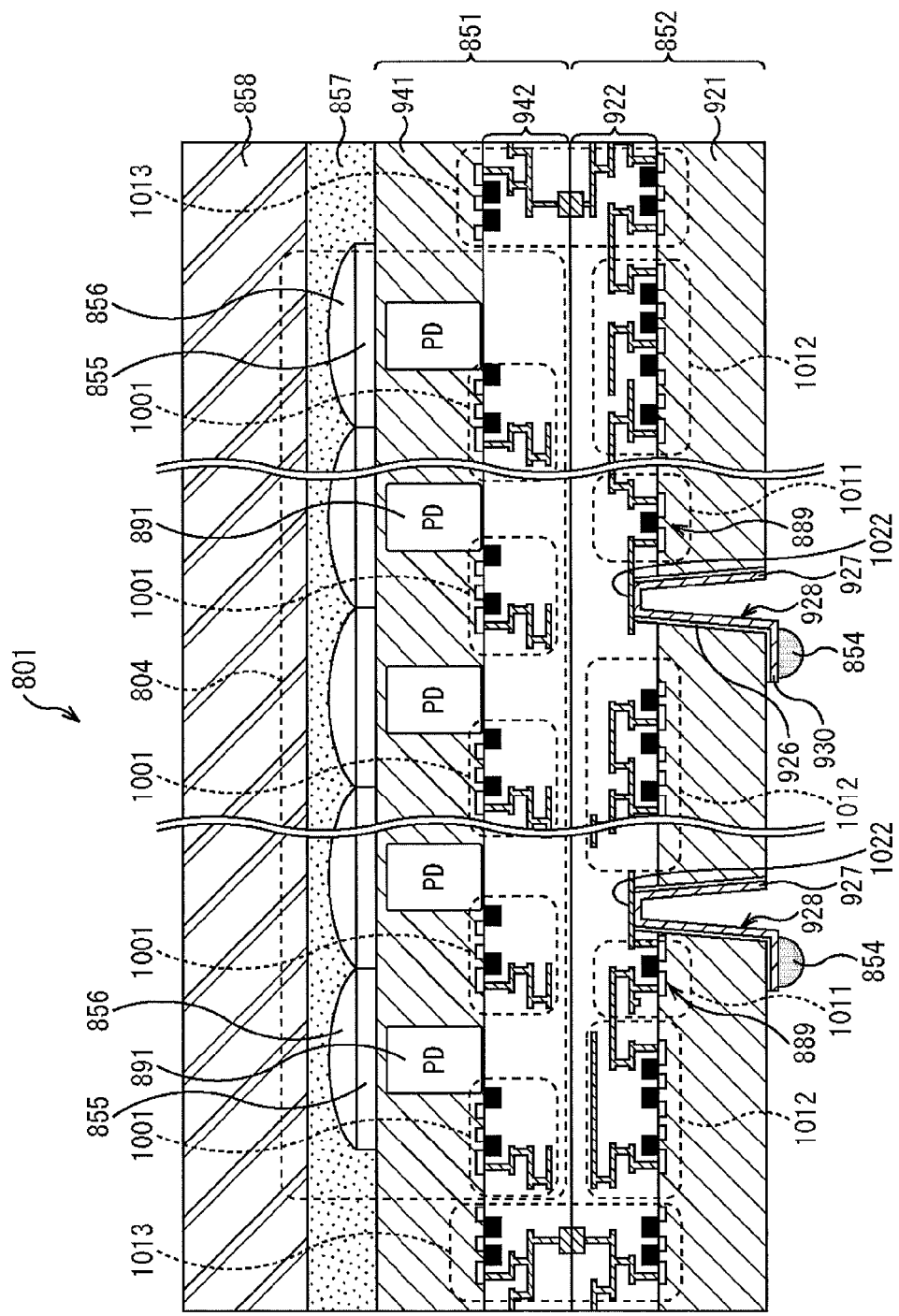

[ FIG. 27 ]
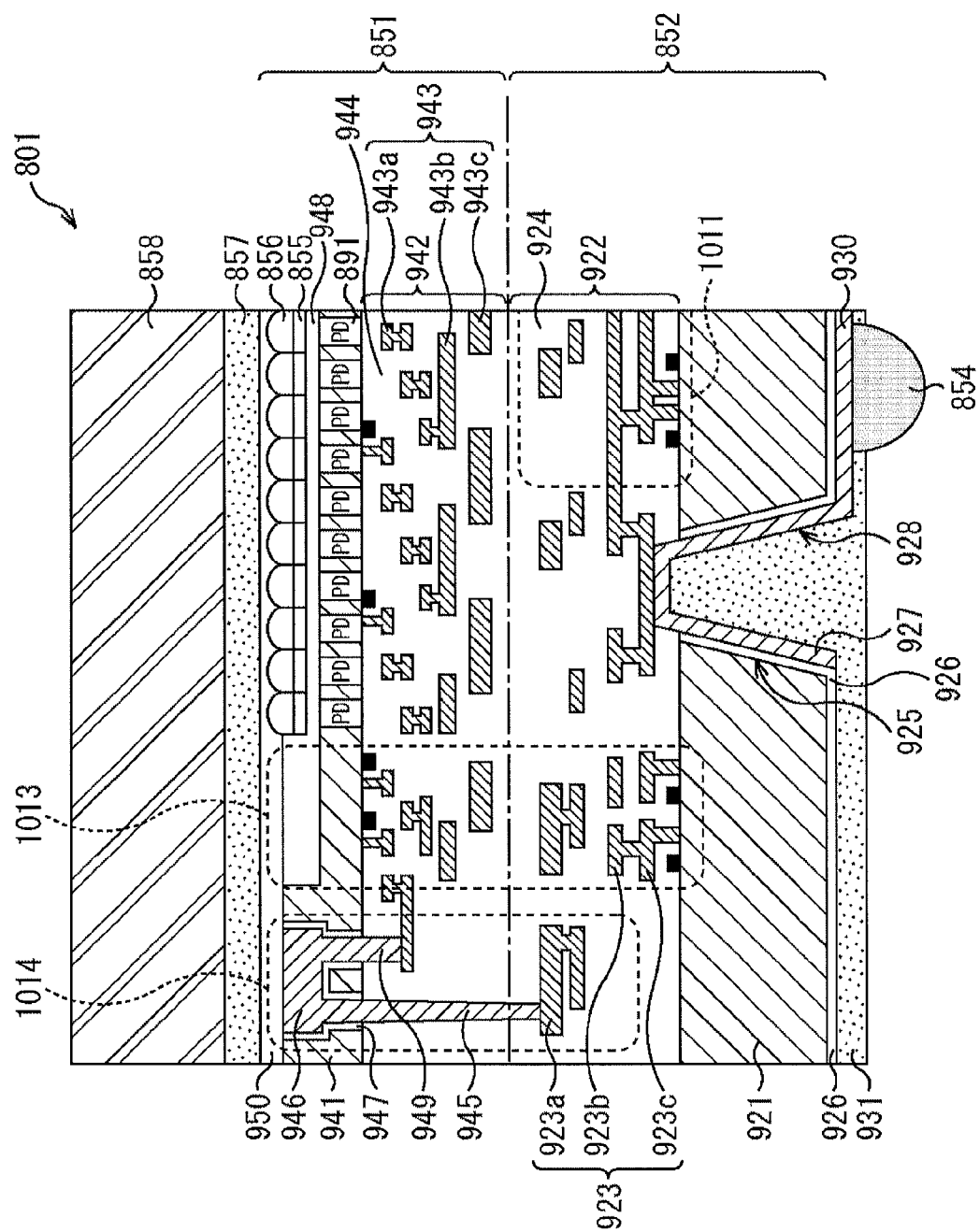

[ FIG. 28A ]
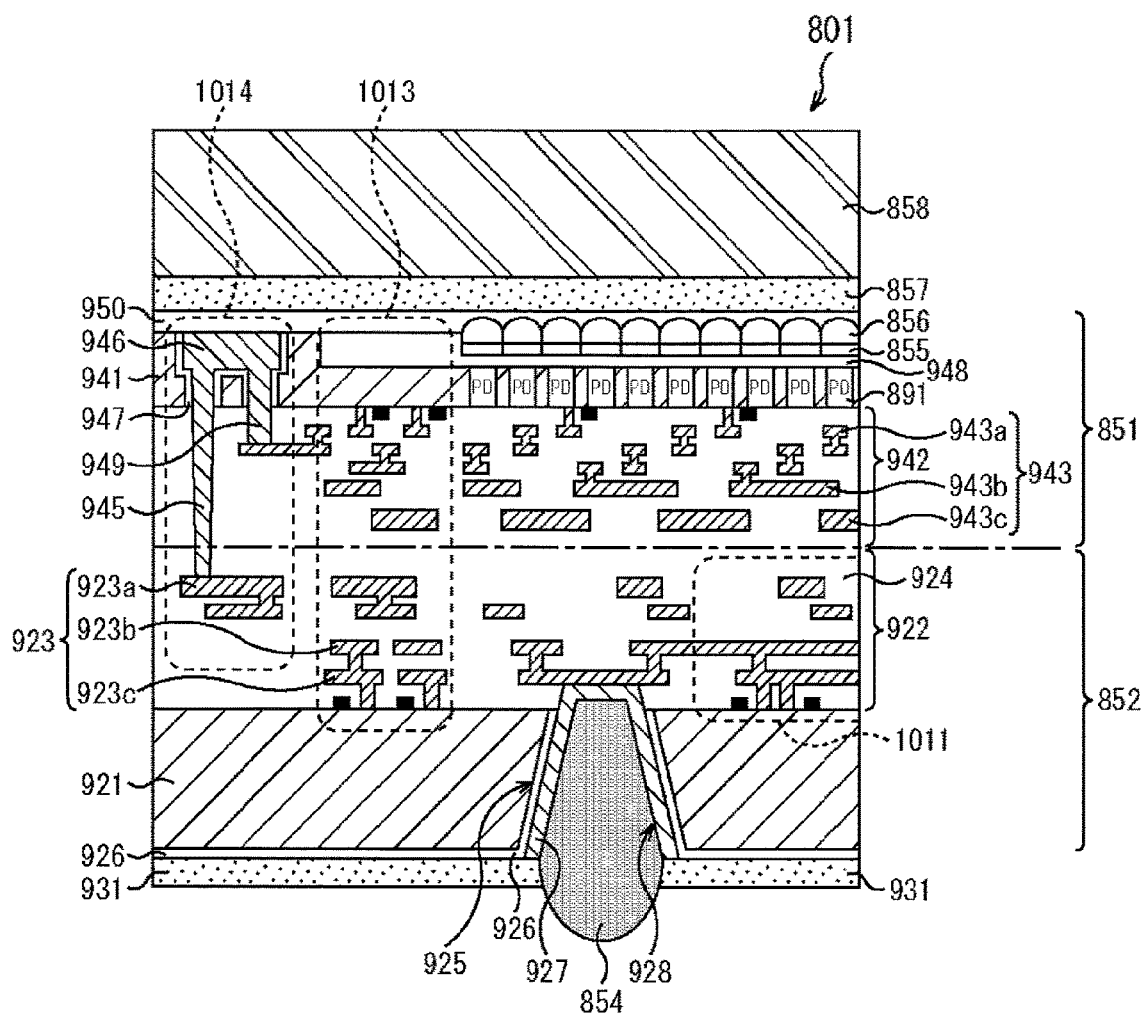
[ FIG. 28B ]
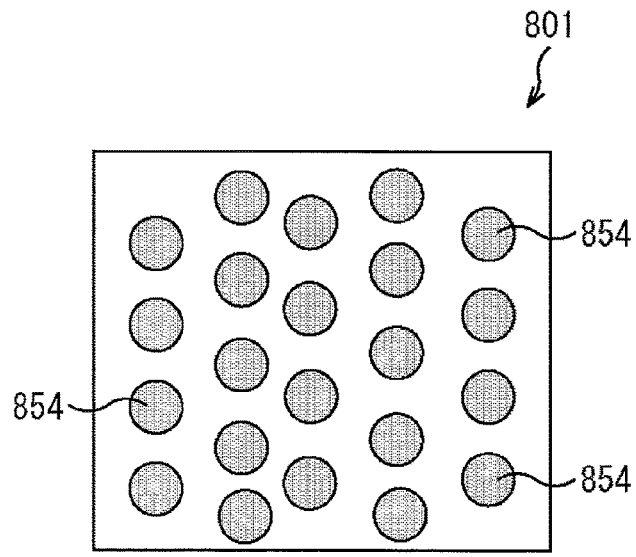

[FIG. 29]
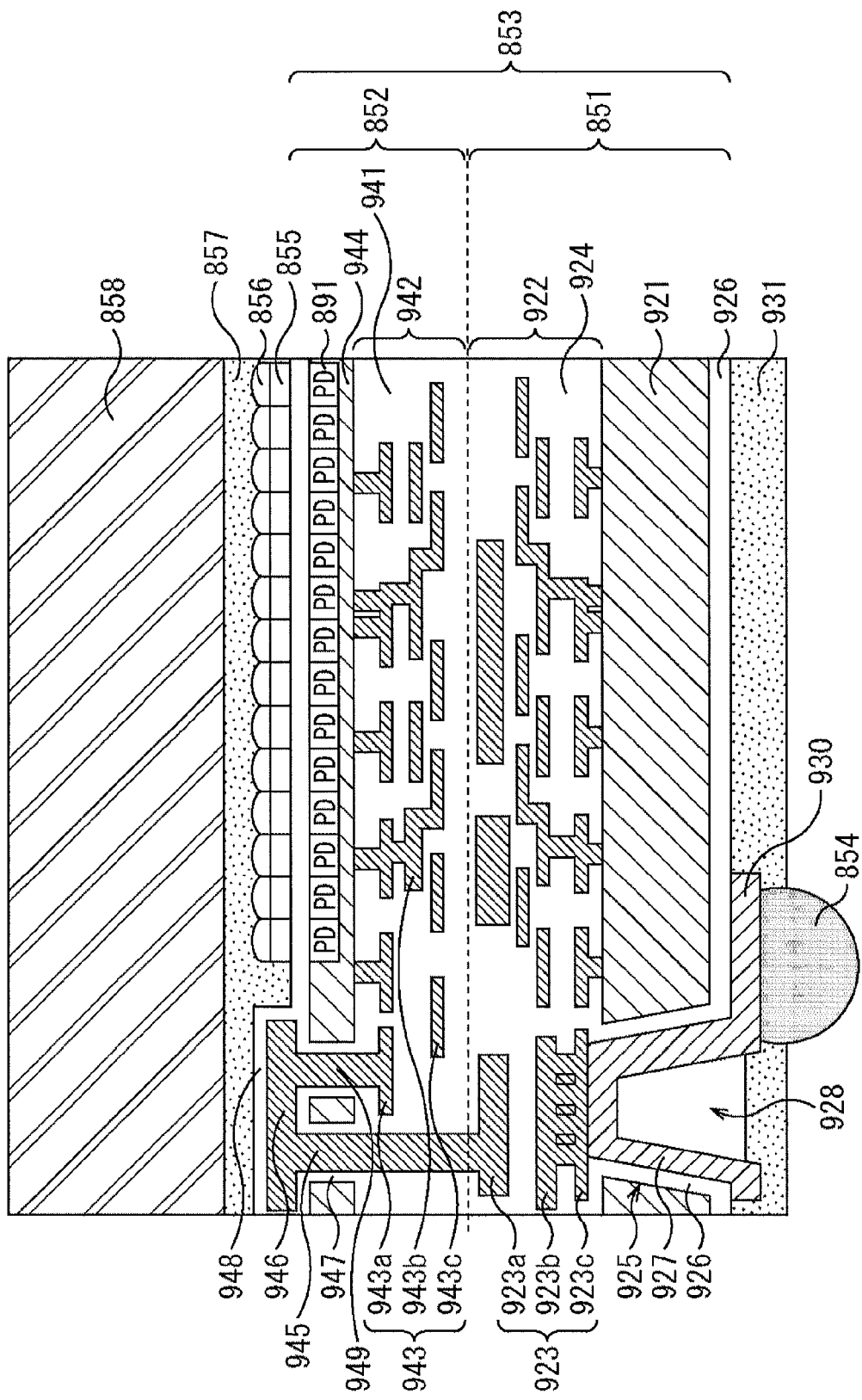

[ FIG. 30 ]
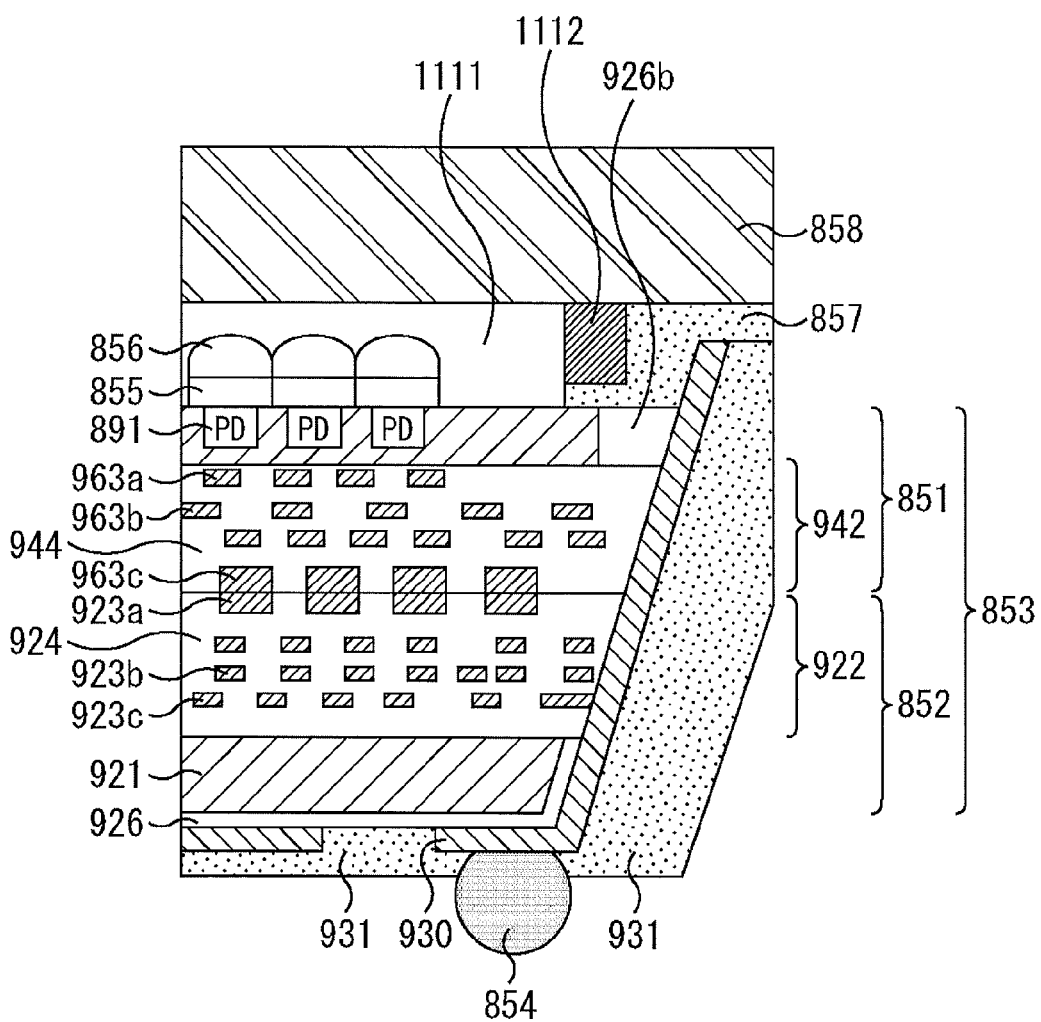

[FIG. 31]
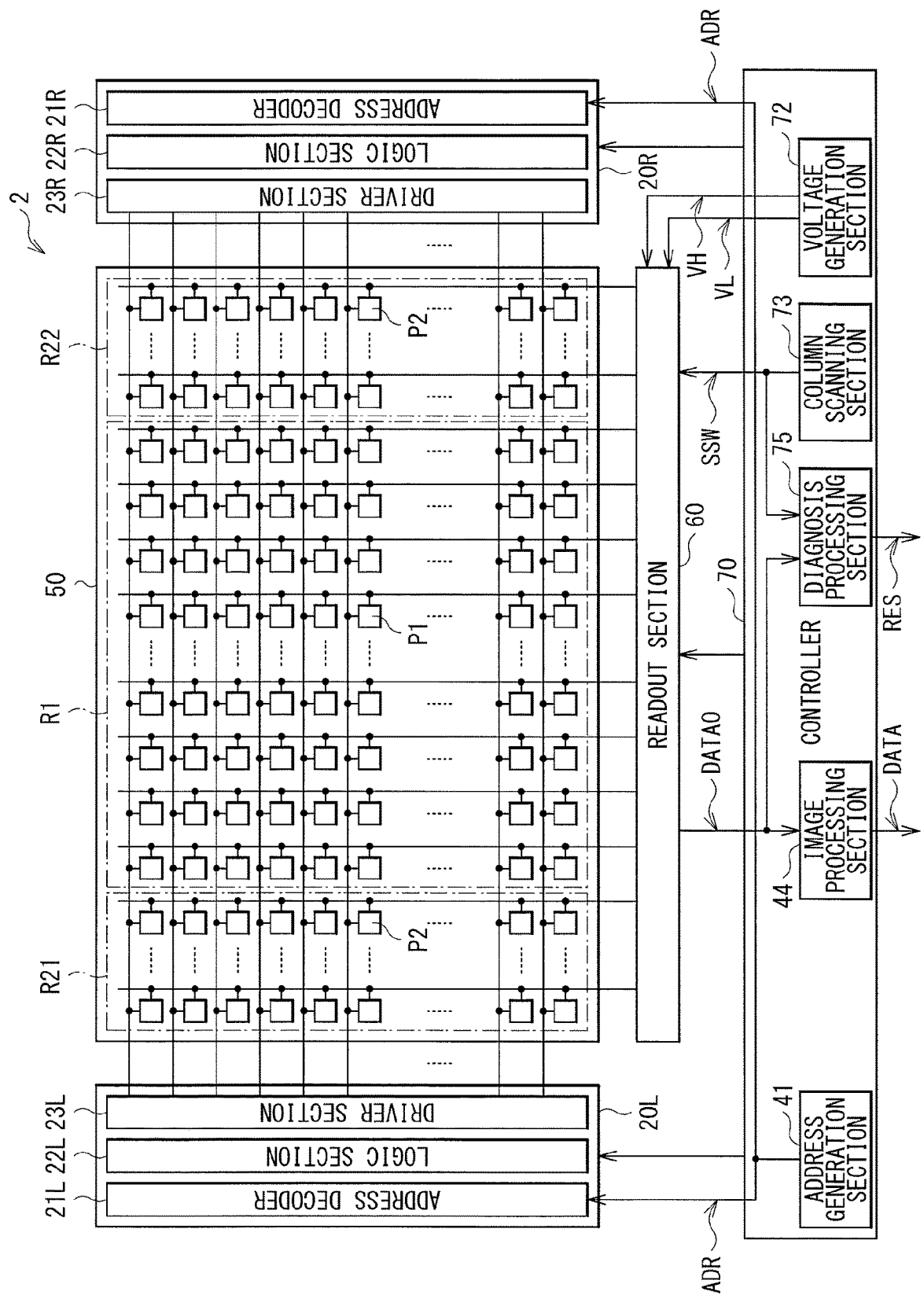

[ FIG. 32 ]
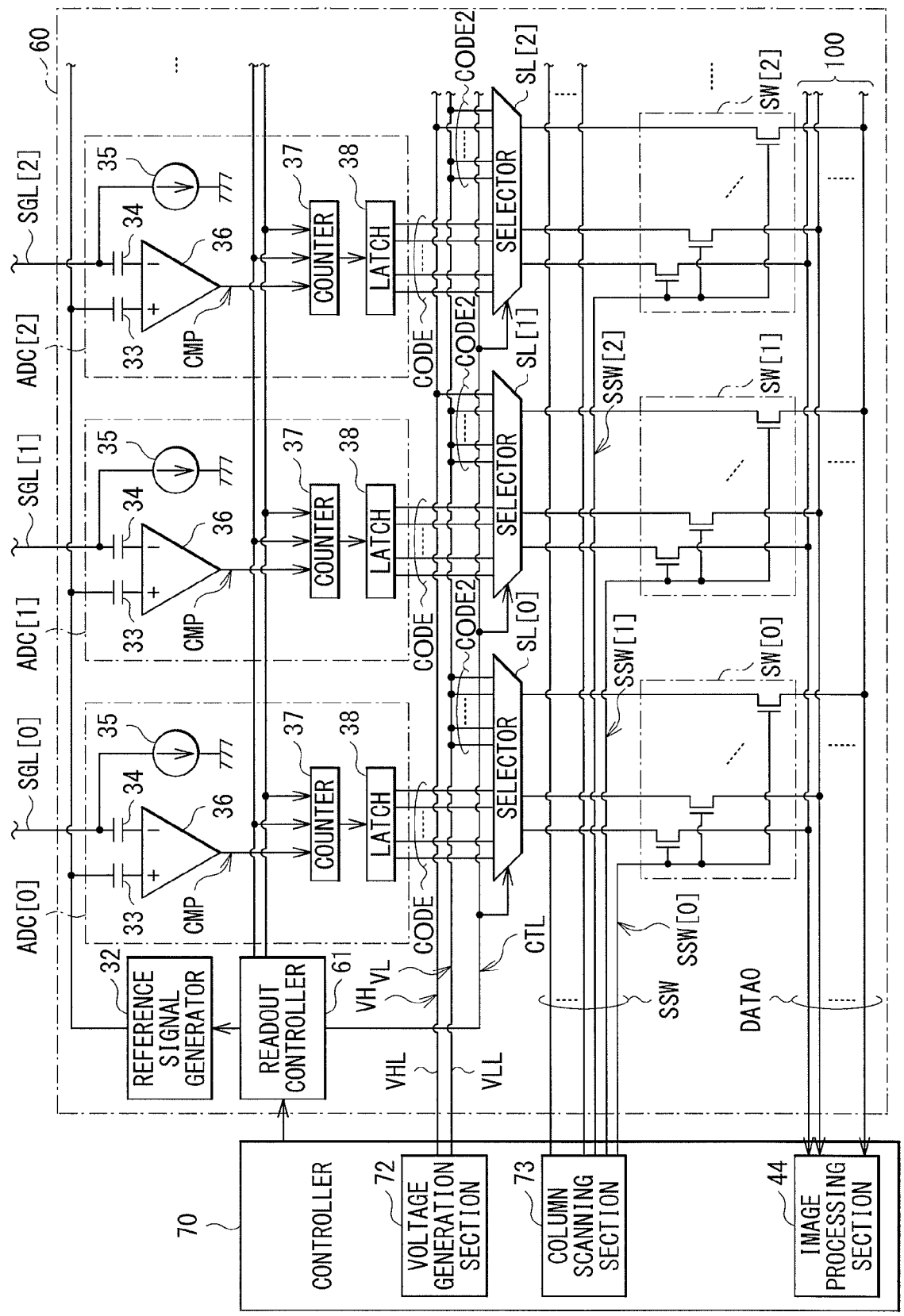

[ FIG. 33 ]

|  | DIGITAL CODE CODE2 |
|---|---|
| AD CONVERTER ADC[0] | 000000000000 |
| AD CONVERTER ADC[1] | 000000000001 |
| AD CONVERTER ADC[2] | 000000000010 |
| AD CONVERTER ADC[3] | 000000000011 |
| AD CONVERTER ADC[4] | 000000000100 |
| AD CONVERTER ADC[5] | 000000000101 |
| AD CONVERTER ADC[6] | 000000000110 |
| AD CONVERTER ADC[7] | 000000000111 |
| AD CONVERTER ADC[8] | 000000001000 |

INFA

[ FIG. 34 ]
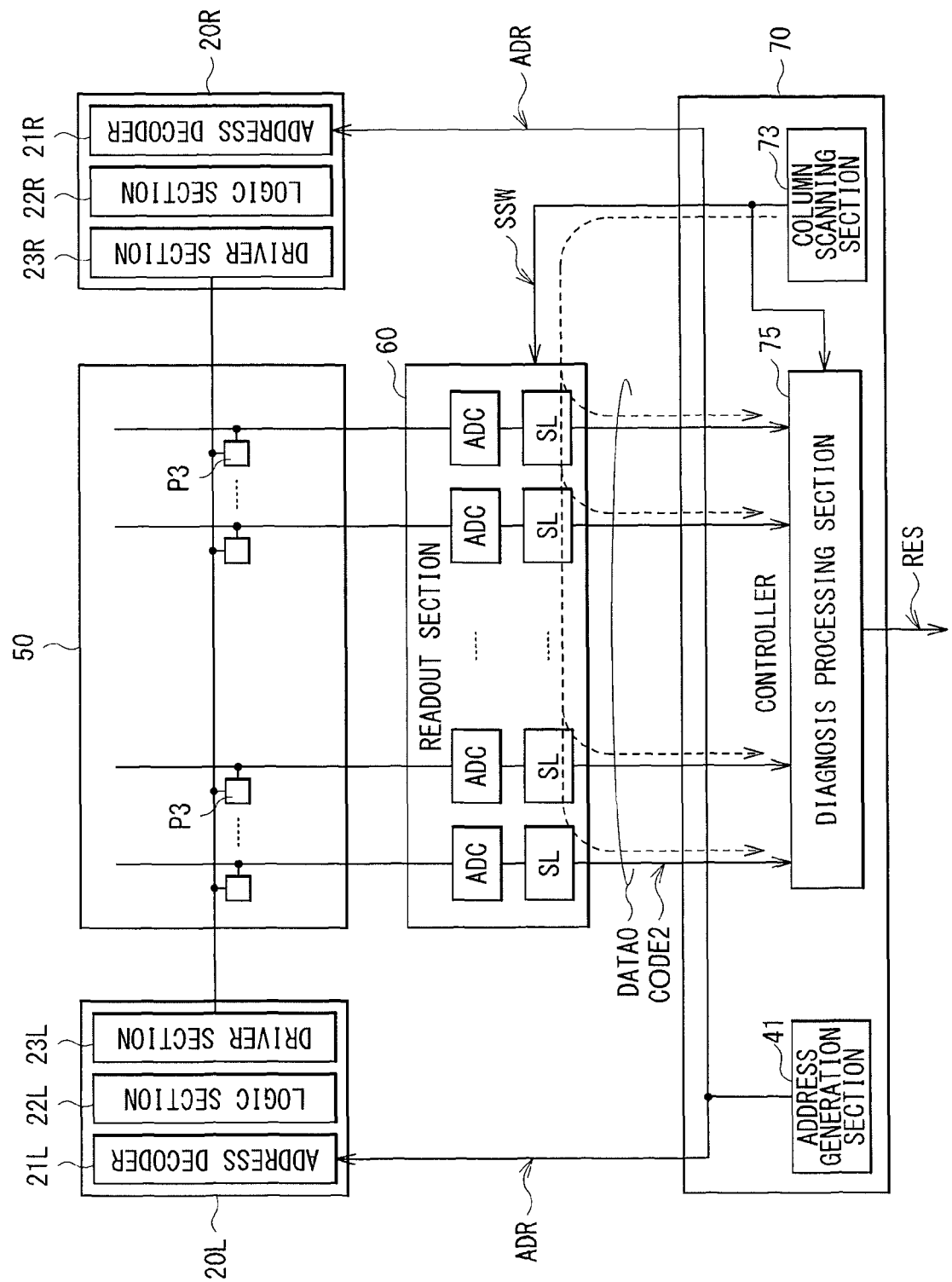

[ FIG. 35 ]
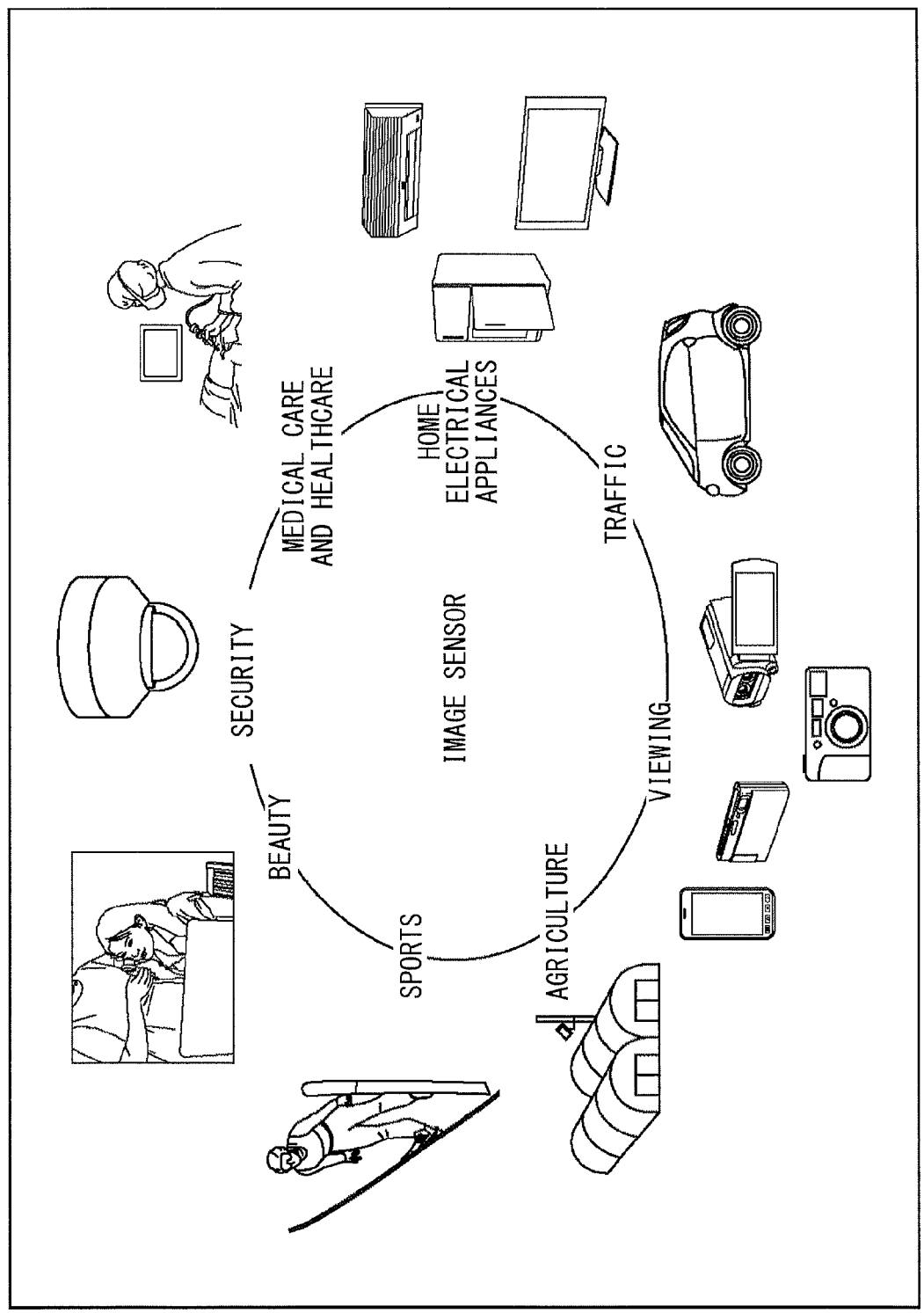

[FIG. 36]
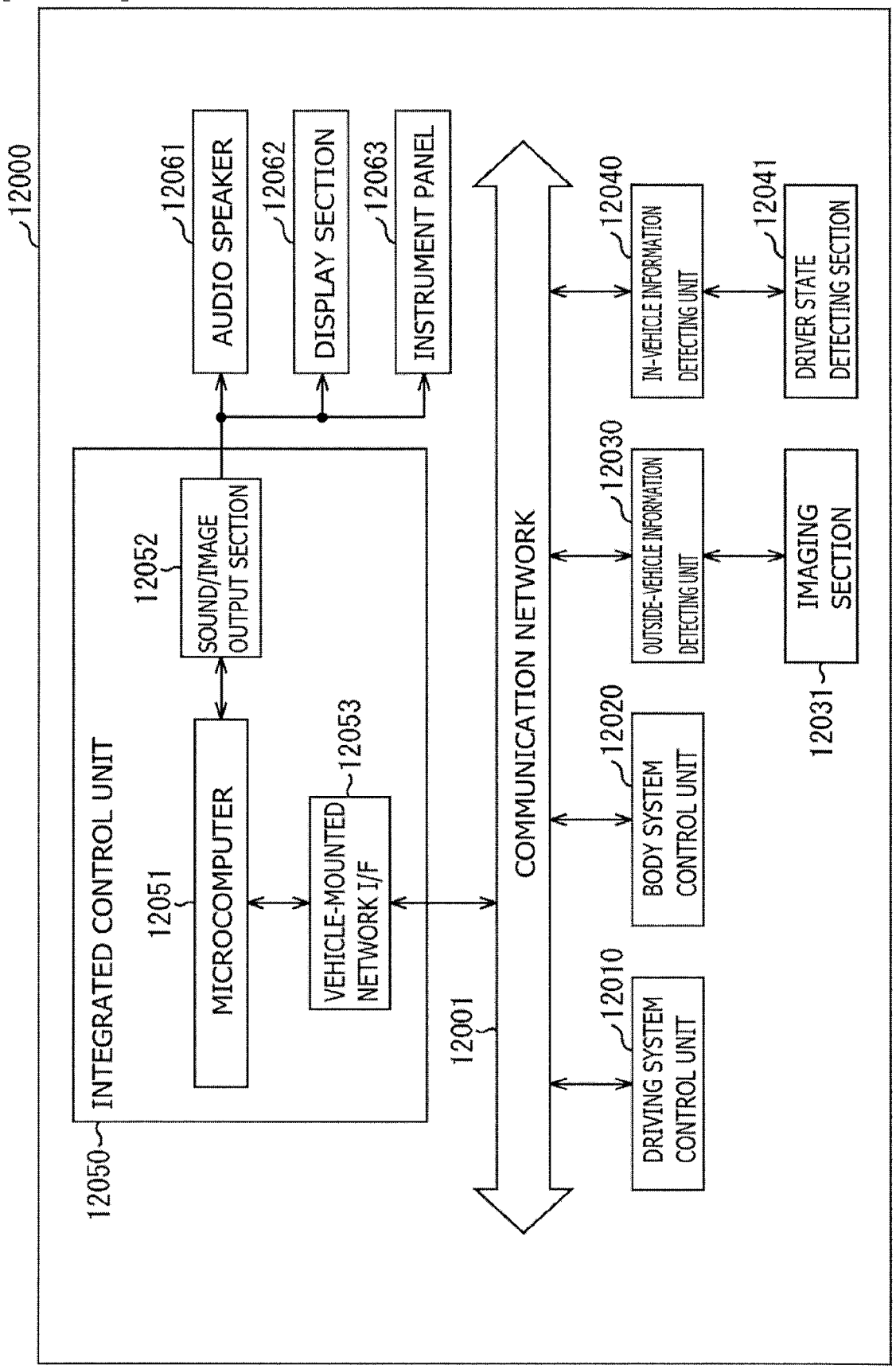

[ FIG. 37 ]
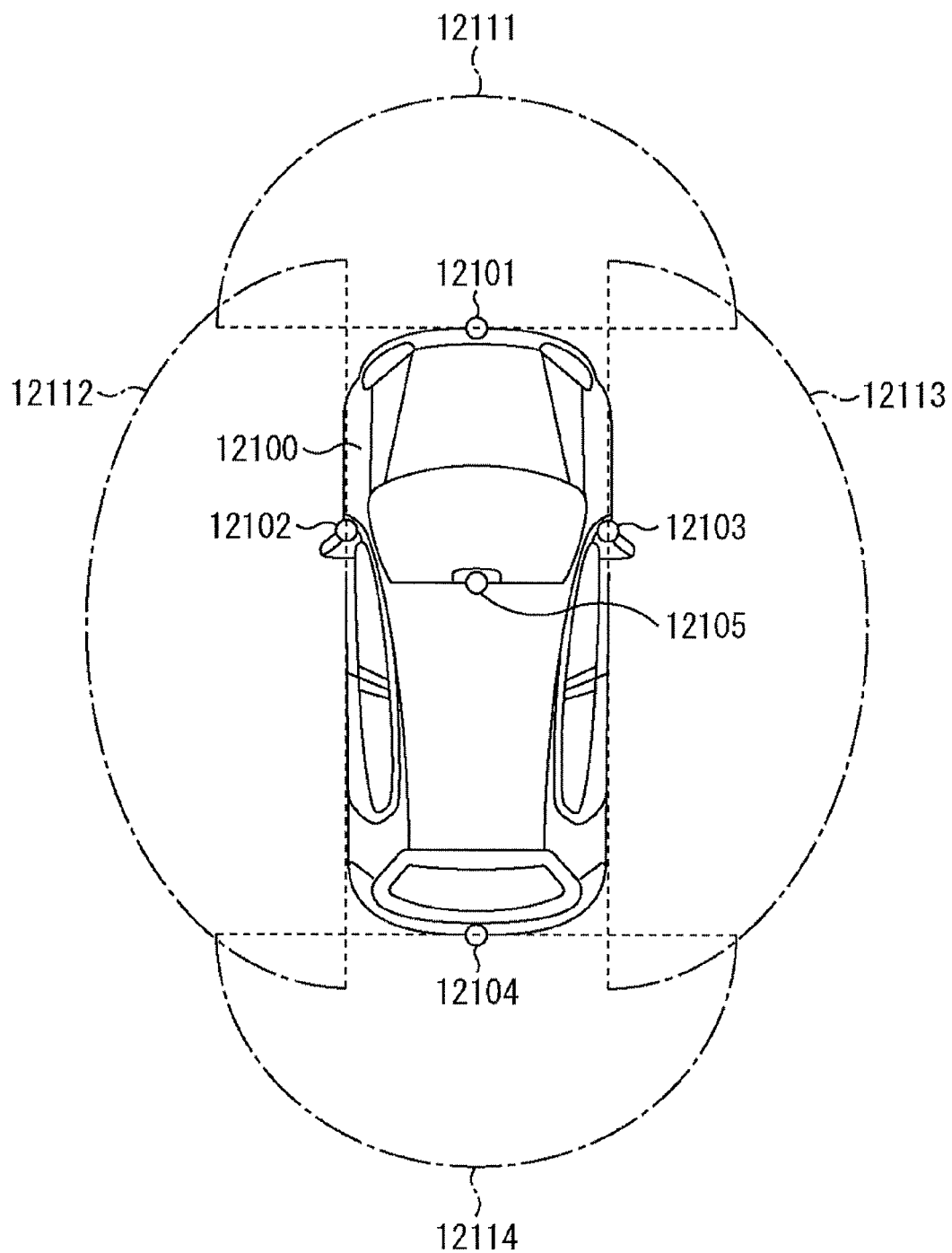

IMAGING DEVICE

TECHNICAL FIELD

The present disclosure relates to an imaging device that captures an image.

BACKGROUND ART

In general, in imaging devices, pixels each including a photodiode are disposed in a matrix, and each of the pixels generates an electrical signal corresponding to the amount of received light. Then, for example, an AD conversion circuit (Analog to Digital Converter) converts the electrical signal (analog signal) generated in each of the pixels into a digital signal. Some of such imaging devices have a BIST (Built-in self test) function (e.g., PTL 1).

CITATION LIST

Patent Literature

PTL 1: Specification of U.S. Unexamined Patent Application Publication No. 2005/0231620

SUMMARY OF THE INVENTION

As described above, imaging devices are desired to perform a self-diagnosis by a BIST function to diagnose the presence or absence of a malfunction.

It is desirable to provide an imaging device that is able to perform a self-diagnosis.

A first imaging device according to an embodiment of the present disclosure includes a plurality of pixel circuits; a first control line; a second control line; a first voltage supply line; a second voltage supply line; a first light-receiving element; and a diagnosis unit. The plurality of pixel circuits each includes a first terminal, a second terminal, a third terminal, an accumulation unit, a first transistor, a second transistor, and an output unit. The plurality of pixel circuits includes a first pixel circuit, a second pixel circuit, and a third pixel circuit. The accumulation unit is configured to accumulate an electric charge. The first transistor is configured to couple the third terminal to the accumulation unit on the basis of a voltage of the first terminal. The second transistor is configured to supply a predetermined voltage to the accumulation unit on the basis of a voltage of the second terminal. The output unit is configured to output a signal corresponding to a voltage in the accumulation unit. The first control line extends in a first direction. The first control line is coupled to the respective first terminals of the first pixel circuit, the second pixel circuit, and the third pixel circuit. The second control line extends in the first direction. The second control line is coupled to the respective second terminals of the first pixel circuit, the second pixel circuit, and the third pixel circuit. The first voltage supply line is coupled to the third terminal of the first pixel circuit. The second voltage supply line is coupled to the third terminal of the second pixel circuit. The light-receiving element is coupled to the third terminal of the third pixel circuit. The diagnosis unit is configured to perform a diagnosis process on the basis of a first signal and a second signal. The first signal is outputted from the output unit of the first pixel circuit. The second signal is outputted from the output unit of the second pixel circuit.

A second imaging device according to an embodiment of the present disclosure includes a plurality of pixel circuits; a first control line; a second control line; a first voltage supply line; a second voltage supply line; and a first light-receiving element. The plurality of pixel circuits each includes a first terminal, a second terminal, a third terminal, an accumulation unit, a first transistor, a second transistor, and an output unit. The plurality of pixel circuits includes a first pixel circuit, a second pixel circuit, and a third pixel circuit. The accumulation unit is configured to accumulate an electric charge. The first transistor is configured to couple the third terminal to the accumulation unit on the basis of a voltage of the first terminal. The second transistor is configured to supply a predetermined voltage to the accumulation unit on the basis of a voltage of the second terminal. The output unit is configured to output a signal corresponding to a voltage in the accumulation unit. The first control line extends in a first direction. The first control line is coupled to the respective first terminals of the first pixel circuit, the second pixel circuit, and the third pixel circuit. The second control line extends in the first direction. The second control line is coupled to the respective second terminals of the first pixel circuit, the second pixel circuit, and the third pixel circuit. The first voltage supply line is coupled to the third terminal of the first pixel circuit. The second voltage supply line is coupled to the third terminal of the second pixel circuit. The light-receiving element is coupled to the third terminal of the third pixel circuit.

A third imaging device according to an embodiment of the present disclosure includes a first pixel circuit, a first signal line, a first conversion circuit, a first selector, a transfer section, and a diagnosis unit. The first signal line is coupled to the first pixel circuit. The first conversion circuit is configured to generate a first digital code by performing AD conversion on the basis of a signal in the first signal line. The first selector includes a first input terminal and a second input terminal. The first input terminal is supplied with the first digital code. The second input terminal is supplied with a first fixed digital code. The first selector is configured to select and output any one of the first digital code or the first fixed digital code. The transfer section is configured to transfer a digital code outputted from the first selector. The diagnosis unit is configured to perform the diagnosis process on the basis of the first fixed digital code transferred by the transfer section.

In the first imaging device according to the embodiment of the present disclosure, the first control line is coupled to the respective first terminals of the first pixel circuit, the second pixel circuit, and the third pixel circuit. The second control line is coupled to the respective second terminals of the first pixel circuit, the second pixel circuit, and the third pixel circuit. The first voltage supply line is coupled to the third terminal of the first pixel circuit. The second voltage supply line is coupled to the third terminal of the second pixel circuit. The first light-receiving element is coupled to the third terminal of the third pixel circuit. The diagnosis process is performed on the basis of the first signal and the second signal. The first signal is outputted from the output unit of the first pixel circuit. The second signal is outputted from the output unit of the second pixel circuit.

In the second imaging device according to the embodiment of the present disclosure, the first control line is coupled to the respective first terminals of the first pixel circuit, the second pixel circuit, and the third pixel circuit. The second control line is coupled to the respective second terminals of the first pixel circuit, the second pixel circuit, and the third pixel circuit. The first voltage supply line is coupled to the third terminal of the first pixel circuit. The second voltage supply line is coupled to the third terminal of the second pixel circuit. The first light-receiving element is coupled to the third terminal of the third pixel circuit.

In the third imaging device according to the embodiment of the present disclosure, AD conversion is performed on the basis of the signal in the first signal line to which the first pixel circuit is coupled, thereby generating the first digital code. The first selector selects and outputs any one of the first digital code or the first fixed digital code. The digital code outputted from the first selector is transferred to the diagnosis unit. The diagnosis unit then performs the diagnosis process on the basis of the first fixed digital code.

In the first imaging device and the second imaging device according to the respective embodiments of the present disclosure, the first voltage supply line is coupled to the third terminal of the first pixel circuit, and the second voltage supply line is coupled to the third terminal of the second pixel circuit. Accordingly, it is possible to perform a self-diagnosis.

The third imaging device according to the embodiment of the present disclosure is provided with the first selector that is configured to select and output any one of the first digital code or the first fixed digital code. Accordingly, it is possible to perform a self-diagnosis.

It is to be noted that the effects described here are not necessarily limited, but any of effects described in the present disclosure may be included.

BRIEF DESCRIPTION OF DRAWING

FIG. 1 is a block diagram illustrating a configuration example of an imaging device according to a first embodiment of the present disclosure.

FIG. 2 is a circuit diagram illustrating a configuration example of a pixel illustrated in FIG. 1.

FIG. 3A is a circuit diagram illustrating a configuration example of a dummy pixel illustrated in FIG. 1.

FIG. 3B is another circuit diagram illustrating a configuration example of the dummy pixel illustrated in FIG. 1.

FIG. 4 is a circuit diagram illustrating a configuration example of a pixel array illustrated in FIG. 1.

FIG. 5 is a table indicating a disposition example of the dummy pixels illustrated in FIGS. 3A and 3B.

FIG. 6 is a circuit diagram illustrating a configuration example of a readout section illustrated in FIG. 1.

FIG. 7 is an explanatory diagram illustrating an implementation example of the imaging device illustrated in FIG. 1.

FIG. 8 is an explanatory diagram illustrating another implementation example of the imaging device illustrated in FIG. 1.

FIG. 9 is a timing diagram illustrating an operation example of the imaging device illustrated in FIG. 1.

FIG. 10 is a timing waveform diagram illustrating an operation example of the imaging device illustrated in FIG. 1.

FIG. 11 is another timing waveform diagram illustrating an operation example of the imaging device illustrated in FIG. 1.

FIG. 12 is an explanatory diagram illustrating an operation example of a readout section illustrated in FIG. 6.

FIG. 13 is a schematic diagram illustrating an operation example of a diagnosis process according to the first embodiment.

FIG. 14 is an explanatory diagram illustrating an operation example of a readout section and a diagnosis processing section illustrated in FIG. 1.

FIG. 15 is a block diagram illustrating a configuration example of an imaging device according to a modification example of the first embodiment.

FIG. 16A is a circuit diagram of a configuration example of a dummy pixel according to another modification example of the first embodiment.

FIG. 16B is another circuit diagram of a configuration example of a dummy pixel according to another modification example of the first embodiment.

FIG. 16C is another circuit diagram of a configuration example of a dummy pixel according to another modification example of the first embodiment.

FIG. 16D is another circuit diagram of a configuration example of a dummy pixel according to another modification example of the first embodiment.

FIG. 17 is a table indicating a disposition example of the dummy pixels illustrated in FIGS. 16A to 16D.

FIG. 18 is an explanatory diagram illustrating an operation example of a readout section and diagnosis processing section according to another modification example of the first embodiment.

FIG. 19 is a table indicating a disposition example of dummy pixels according to another modification example of the first embodiment.

FIG. 20 is a structure diagram illustrating another implementation example of the imaging device illustrated in FIG. 1.

FIG. 21 is a structure diagram illustrating another implementation example of the imaging device illustrated in FIG. 1.

FIG. 22 is a structure diagram illustrating another implementation example of the imaging device illustrated in FIG. 1.

FIG. 23 is a structure diagram illustrating another implementation example of the imaging device illustrated in FIG. 1.

FIG. 24 is a structure diagram illustrating another implementation example of the imaging device illustrated in FIG. 1.

FIG. 25 is a structure diagram illustrating another implementation example of the imaging device illustrated in FIG. 1.

FIG. 26 is a structure diagram illustrating another implementation example of the imaging device illustrated in FIG. 1.

FIG. 27 is a structure diagram illustrating another implementation example of the imaging device illustrated in FIG. 1.

FIG. 28A is a structure diagram illustrating another implementation example of the imaging device illustrated in FIG. 1.

FIG. 28B is a structure diagram illustrating another implementation example of the imaging device illustrated in FIG. 1.

FIG. 29 is a structure diagram illustrating another implementation example of the imaging device illustrated in FIG. 1.

FIG. 30 is a structure diagram illustrating another implementation example of the imaging device illustrated in FIG. 1.

FIG. 31 is a block diagram illustrating a configuration example of an imaging device according to a second embodiment.

FIG. 32 is a circuit diagram illustrating a configuration example of a readout section illustrated in FIG. 31.

FIG. 33 is a table indicating an example of a fixed digital code illustrated in FIG. 32.

FIG. 34 is a schematic diagram illustrating an operation example of a diagnosis process according to the second embodiment.

FIG. 35 is an explanatory diagram illustrating a usage example of the imaging device.

FIG. 36 is a block diagram depicting an example of schematic configuration of a vehicle control system.

FIG. 37 is a diagram of assistance in explaining an example of installation positions of an outside-vehicle information detecting section and an imaging section.

MODES FOR CARRYING OUT THE INVENTION

The following describes embodiments of the present disclosure in detail with reference to the drawings. It is to be noted that description is given in the following order.

1. First Embodiment

2. Second Embodiment

3. Usage Examples of Imaging Device

4. Example of Application to Mobile Body

1. First Embodiment

[Configuration Example]

FIG. 1 illustrates a configuration example of an imaging device (imaging device 1) according to an embodiment. The imaging device 1 includes a pixel array 10, two scanning units 20L and 20R, a readout section 30, and a controller 40.

The pixel array 10 includes a plurality of pixels P1 arranged in a matrix. The pixels P1 each include a photodiode PD (described below), and generate a pixel voltage Vpix corresponding to the amount of received light. The plurality of these pixels P1 is disposed in a normal pixel region R1.

Further, the pixel array 10 includes a plurality of light-shielded pixels P2 and a plurality of dummy pixels P3 (dummy pixels P3A and P3B) in addition to the plurality of pixels P1. Each of the light-shielded pixels P2 is a pixel that includes a photodiode PD (described below). For the light-shielded pixel P2, light is blocked. As described below, the light-shielded pixel P2 is used to detect a dark current of the photodiode PD. The plurality of light-shielded pixels P2 is disposed in light-shielded pixel regions R21 and R22. Each of the dummy pixels P3 is a pixel that does not include the photodiode PD. The plurality of dummy pixels P3 is disposed in dummy pixel regions R31 and R32. In this example, in the pixel array 10, the dummy pixel region R31, the light-shielded pixel region R21, the normal pixel region R1, the light-shielded pixel region R22, and the dummy pixel region R32 are provided in this order from left to right in the horizontal direction (lateral direction in FIG. 1).

The following describes the pixel P1, the light-shielded pixel P2, and the dummy pixel P3 in detail.

FIG. 2 illustrates a configuration example of the pixel P1 in the normal pixel region R1. The pixel array 10 includes a plurality of control lines TGL, a plurality of control lines RSTL, a plurality of control lines SELL, a plurality of power lines PL, and a plurality of signal lines SGL in the normal pixel region R1.

The control lines TGL each extend in the horizontal direction (lateral direction in FIG. 2). An end of the control line TGL is coupled to the scanning unit 20L. The other end is coupled to the scanning unit 20R. That is, the control line TGL is disposed to extend through the dummy pixel region R31, the light-shielded pixel region R21, the normal pixel region R1, the light-shielded pixel region R22, and the dummy pixel region R32. The scanning units 20L and 20R apply control signals STG to the control line TGL.

The control lines RSTL each extend in the horizontal direction. An end of the control line RSTL is coupled to the scanning unit 20L. The other end is coupled to the scanning unit 20R. That is, the control line RSTL is disposed to extend through the dummy pixel region R31, the light-shielded pixel region R21, the normal pixel region R1, the light-shielded pixel region R22, and the dummy pixel region R32. The scanning units 20L and 20R apply control signals SRST to the control line RSTL.

The control lines SELL each extend in the horizontal direction. An end of the control line SELL is coupled to the scanning unit 20L. The other end is coupled to the scanning unit 20R. That is, the control line SELL is disposed to extend through the dummy pixel region R31, the light-shielded pixel region R21, the normal pixel region R1, the light-shielded pixel region R22, and the dummy pixel region R32. The scanning units 20L and 20R apply control signals SSEL to the control line SELL.

The power lines PL are each coupled to a voltage generation section 42 (described below) of the controller 40. The voltage generation section 42 applies a power supply voltage VDD to this power line PL.

The signal lines SGL each extend in the vertical direction (longitudinal direction in FIG. 2), and an end thereof is coupled to the readout section 30.

The pixel P1 includes the photodiode PD and a pixel circuit CKT. The pixel circuit CKT includes transistors TG, RST, AMP, and SEL, and a floating diffusion FD. Each of the transistors TG, RST, AMP, and SEL is an N-type MOS (Metal Oxide Semiconductor) transistor in this example.

The photodiode PD is a photoelectric converter that generates and accumulates electric charges in an amount corresponding to the amount of received light. The photodiode PD has the anode grounded, and the cathode coupled to the source of the transistor TG.

The gate of the transistor TG is coupled to the control line TGL through a terminal T1 of the pixel circuit CKT. The source thereof is coupled to the cathode of the photodiode PD through a terminal T3 of the pixel circuit CKT. The drain thereof is coupled to the floating diffusion FD.

The floating diffusion FD accumulates electric charges supplied from the photodiode PD, and includes, for example, a diffusion layer formed on a surface of a semiconductor substrate. FIG. 2 illustrates the floating diffusion FD by using a symbol of a capacitor.

In this configuration, in the pixel P1, the transistor TG is turned on on the basis of the control signal STG, and the electric charges generated in the photodiode PD of the pixel P1 are transferred to the floating diffusion FD (electric charge transfer operation).

The gate of the transistor RST is coupled to the control line RSTL through a terminal T2 of the pixel circuit CKT. The drain thereof is coupled to the power line PL. The source thereof is coupled to the floating diffusion FD.

In this configuration, in the pixel P1, the transistor RST is turned on on the basis of the control signal SRST before electric charges are transferred from the photodiode PD to the floating diffusion FD, and the power supply voltage VDD is supplied to the floating diffusion FD. This causes the voltage of the floating diffusion FD in the pixel P1 to be reset (reset operation).

The transistor AMP has the gate coupled to the floating diffusion FD, the drain coupled to the power line PL, and the source coupled to the drain of the transistor SEL.

The transistor SEL has the gate coupled to the control line SELL, the drain coupled to the source of the transistor AMP, and the source coupled to the signal line SGL.

In this configuration, in the pixel P1, turning on the transistor SEL causes the transistor AMP to be coupled to a current source 35 (described below) of the readout section 30. This causes the transistor AMP to operate as a so-called source follower and output, as a signal SIG, a voltage corresponding to the voltage of the floating diffusion FD to the signal line SGL through the transistor SEL. Specifically, the transistor AMP outputs a reset voltage Vreset as the signal SIG in a P-phase (Pre-charge phase) period TP after the voltage of the floating diffusion FD is reset. The reset voltage Vreset corresponds to the voltage of the floating diffusion FD in the P-phase period TP. In addition, the transistor AMP outputs a pixel voltage Vpix corresponding to the amount of received light as the signal SIG in a D-phase (Data phase) period TD after an electric charge is transferred from the photodiode PD to the floating diffusion FD. The pixel voltage Vpix corresponds to the voltage of the floating diffusion FD in the D-phase period TD.

Next, the light-shielded pixels P2 in the light-shielded pixel regions R21 and R22 are described. The pixel array 10 includes the plurality of control lines TGL, the plurality of control lines RSTL, the plurality of control lines SELL, the plurality of power lines PL, and the plurality of signal lines SGL in the light-shielded pixel regions R21 and R22 similarly to the normal pixel region R1 (FIG. 2).

Similarly to the pixel P1 (FIG. 2), the light-shielded pixel P2 includes the photodiode PD and the pixel circuit CKT. The light-shielded pixel P2 is different from the pixel P1 in that light is blocked by metal such as tungsten not to enter the photodiode PD. The light-shielded pixel P2 is used to generate a reference signal for adjusting the black level of the pixel P1.

In this configuration, in the light-shielded pixel P2, as with the pixel P1, turning on the transistor SEL causes the transistor AMP to output, to the signal line SGL, the signal SIG corresponding to the voltage of the floating diffusion FD through the transistor SEL. Light is shielded in the light-shielded pixel P2; therefore, the voltage of the floating diffusion FD in the D-phase period TD is a voltage corresponding to a dark current of the photodiode PD. Accordingly, the transistor AMP outputs, as the signal SIG, the pixel voltage Vpix corresponding to the dark current in the D-phase period TD.

FIGS. 3A and 3B each illustrate a configuration example of the dummy pixel P3 in each of the dummy pixel regions R31 and R32. FIG. 3A illustrates an example of a dummy pixel P3A, and FIG. 3B illustrates an example of a dummy pixel P3B. The pixel array 10 includes the plurality of control lines TGL, the plurality of control lines RSTL, the plurality of control lines SELL, the plurality of power lines PL, a plurality of voltage supply lines VL0, and the plurality of signal lines SGL in the dummy pixel regions R31 and R32. The voltage supply lines VL0 are each coupled to the voltage generation section 42 (described below) of the controller 40. The voltage generation section 42 applies a single voltage signal SVR to the plurality of voltage supply lines VL0. This voltage signal SVR is a signal that changes between a predetermined voltage VR and the power supply voltage VDD. The voltage signal SVR is set at the power supply voltage VDD in a period in which the transistors TG and RST are both turned on, and set at the voltage VR in the D-phase period TD.

The dummy pixels P3 (dummy pixels P3A and P3B) each include the pixel circuit CKT. The sources of the respective transistors TG of the dummy pixels P3A and P3B have different coupling destinations. Specifically, the source of the transistor TG of the dummy pixel P3A is coupled to the power line PL as illustrated in FIG. 3A, and the source of the transistor TG of the dummy pixel P3B is coupled to the voltage supply line VL0 as illustrated in FIG. 3B.

In this configuration, in the dummy pixel P3, as with the pixel P1, turning on the transistor SEL causes the transistor AMP to output, to the signal line SGL, the signal SIG corresponding to the voltage of the floating diffusion FD through the transistor SEL. The source of the transistor TG of the dummy pixel P3A is coupled to the power line PL, and thus the voltage of the floating diffusion FD in the D-phase period TD is the power supply voltage VDD. This causes the transistor AMP of the dummy pixel P3A to output the voltage corresponding to the power supply voltage VDD as the signal SIG in the D-phase period TD. In addition, the source of the transistor TG of the dummy pixel P3B is coupled to the voltage supply line VL0. The voltage of the voltage signal SVR applied to this voltage supply line VL0 is set at the voltage VR in the D-phase period TD, and thus the voltage of the floating diffusion FD in the D-phase period TD is the voltage VR. This causes the transistor AMP of the dummy pixel P3B to output the voltage corresponding to the voltage VR as the signal SIG in the D-phase period TD.

FIG. 4 illustrates the arrangement of the pixels P1, the light-shielded pixels P2, and the dummy pixels P3 in the pixel array 10. In FIG. 4, the dummy pixel region R31, the light-shielded pixel region R21, and the normal pixel region R1 are drawn. A pixel line L includes the pixel P1, the light-shielded pixel P2, and dummy pixels P3 for one row. The pixel P1, the light-shielded pixel P2, and the dummy pixels P3 belonging to the certain pixel line L are coupled to the one control line TGL, coupled to the one control line RSTL, and coupled to the one control line SELL. In this example, the one pixel line L includes the eleven dummy pixels P3 (dummy pixels P3[10] to P3[0]) in the dummy pixel region R31. Each of these dummy pixels P3[10] to P3[0] is the dummy pixel P3A (FIG. 3A) or the dummy pixel P3B (FIG. 3B).

FIG. 5 illustrates the arrangement of the dummy pixels P3A and P3B in the dummy pixel region R31. In FIG. 5, "0" represents the dummy pixel P3A, and "1" represents the dummy pixel P3B. For example, the 0th pixel line L[0] has "00000000000" as the arrangement of the dummy pixels P3. That is, all the eleven dummy pixels P3[10] to P3[0] are the dummy pixels P3A. The first pixel line L[1] has "00000000001" as the arrangement of the dummy pixels P3. That is, the dummy pixel P3[0] is the dummy pixel P3B, and the other dummy pixels P3[10] to P3[1] are the dummy pixels P3A. The second pixel line L[2] has "00000000010" as the arrangement of the dummy pixels P3. That is, the dummy pixel P3[1] is the dummy pixel P3B, and the other dummy pixels P3[10] to P3[2] and P3[0] are the dummy pixels P3A. In this way, the arrangement of the dummy pixels P3 is set to differ between the pixel lines L. Especially in this example, the arrangement of the dummy pixels P3 is arrangement corresponding to the ordinal number of the pixel line L expressed as a binary number. In this example, the eleven dummy pixels P3 are provided, and it is thus possible to express the respective cardinal numbers of the 2048 pixel lines L. That is, the arrangement of the eleven dummy pixels P3 functions as line identification information INFL for identifying the pixel line L.

It is to be noted that the dummy pixel region R31 has been described in FIGS. 4 and 5, but the same applies to the dummy pixel region R32. That is, the one pixel line L includes the eleven dummy pixels P3 in the dummy pixel region R32. Each of these dummy pixels P3 is the dummy pixel P3A or the dummy pixel P3B. Similarly to FIG. 5, the arrangement of the dummy pixels P3 in the dummy pixel region R32 represents the cardinal number of the pixel line L expressed as a binary number. That is, the arrangement of the eleven dummy pixels P3 in the dummy pixel region R32 is the same as the arrangement of the eleven dummy pixels P3 in the dummy pixel region R31.

The two scanning units 20L and 20R (FIG. 1) each sequentially drive the pixels P1, the light-shielded pixels P2, and the dummy pixels P3 in the pixel array 10 in units of the pixel lines L on the basis of an instruction from the controller 40. The scanning unit 20L includes an address decoder 21L, a logic section 22L, and a driver section 23L. The scanning unit 20R similarly includes an address decoder 21R, a logic section 22R, and a driver section 23R.

The address decoder 21L selects the pixel line L in the pixel array 10 on the basis of an address signal ADR supplied from the controller 40. The pixel line L corresponds to the address indicated by the address signal ADR. The logic section 22L generates signals STG1, SRST1, and SSEL1 corresponding to the respective pixel lines L on the basis of an instruction from the address decoder 21L. The driver section 23L generates control signals STG, SRST, and SSEL corresponding to the respective pixel lines L on the basis of the signals STG1, SRST1, and SSEL1 corresponding to the respective pixel lines L. The same applies to the address decoder 21R, the logic section 22R, and the driver section 23R. The address signal ADR supplied to the address decoder 21R is the same as the address signal ADR supplied to the address decoder 21L. The address decoders 21L and 21R thus selects the same pixel line L on the basis of the address signal ADR. This causes the scanning units 20L and 20R to sequentially drive the pixels P1, the light-shielded pixels P2, and the dummy pixels P3 in the pixel array 10 from both the left and right sides of the pixel array 10 in units of the pixel lines L.

The readout section 30 performs AD conversion on the basis of the signal SIG supplied from the pixel array 10 through the signal line SGL, thereby generating an image signal DATA0.

FIG. 6 illustrates a configuration example of the readout section 30. It is to be noted that the controller 40 is also drawn in FIG. 6 in addition to the readout section 30. The readout section 30 includes a readout controller 31, a reference signal generator 32, a plurality of AD (Analog to Digital) converters ADC (AD converters ADC[0], ADC[1], ADC[2], . . . ), a plurality of switches SW (switches SW[0], SW[1], SW[2], . . . ), and a bus wiring line 100.

The readout controller 31 controls a readout operation of the readout section 30 on the basis of an instruction from the controller 40. Specifically, the readout controller 31 supplies a control signal to the reference signal generator 32, thereby causing the reference signal generator 32 to generate a reference signal REF (described below). In addition, the readout controller 31 supplies a clock signal CLK and a control signal CC to the plurality of AD converters ADC, thereby controlling AD conversion operations of the plurality of AD converters ADC.

The reference signal generator 32 generates the reference signal REF. The reference signal REF has a so-called ramp waveform in which the voltage level is gradually decreased with the lapse of time in the P-phase period TP and the D-phase period TD. Then, the reference signal generator 32 supplies the generated reference signal REF to the plurality of AD converters ADC.

The AD converters ADC each perform AD conversion on the basis of the signal SIG supplied from the pixel array 10 to convert the voltage of the signal SIG into a digital code CODE. The plurality of AD converters ADC is provided in association with the plurality of signal lines SGL. Specifically, the 0th AD converter ADC[0] is provided in association with a 0th signal line SGL[0], the first AD converter ADC[1] is provided in association with a first signal line SGL[1], and the second AD converter ADC[2] is provided in association with a second signal line SGL[2].

The AD converters ADC each include capacitors 33 and 34, the current source 35, a comparator 36, a counter 37, and a latch 38. The capacitor 33 has one end supplied with the reference signal REF and the other end coupled to the positive input terminal of the comparator 36. The capacitor 34 has one end coupled to the signal line SGL and the other end coupled to the negative input terminal of the comparator 36. The current source 35 allows a current having a predetermined current value to flow from the signal line SGL to the ground. The comparator 36 compares an input voltage at the positive input terminal and an input voltage at the negative input terminal, and outputs a result of the comparison as the signal CMP. The comparator 36 has the positive input terminal supplied with the reference signal REF through the capacitor 33, and the negative input terminal supplied with the signal SIG through the capacitor 34. This comparator 36 also has a function of performing zero adjustment that causes the positive input terminal and the negative input terminal to be electrically coupled in a predetermined period before the P-phase period TP. The counter 37 performs a counting operation on the basis of the signal CMP supplied from the comparator 36, and the clock signal CLK and the control signal CC supplied from the readout controller 31. The latch 38 retains a count value CNT as a digital code CODE. The count value CNT is obtained by the counter 37. The digital code CODE has a plurality of bits.

The switches SW each supply the bus wiring line 100 with the digital code CODE outputted from the AD converter ADC on the basis of a control signal SSW supplied from the controller 50. The plurality of switches SW is provided in association with the plurality of AD converters ADC. Specifically, the 0th switch SW[0] is provided in association with the 0th AD converter ADC[0], the first switch SW[1] is provided in association with the first AD converter ADC[1], and the second switch SW[2] is provided in association with the second AD converter ADC[2].

The switches SW each include the same number of transistors as the number of bits of the digital code CODE in this example. These transistors are controlled to be turned on and off on the basis of the respective bits of the control signals SSW (control signals SSW[0], SSW[1], SSW[2], . . . ) supplied from the controller 40. Specifically, for example, turning on the respective transistors on the basis of the control signal SSW[0] causes the 0th switch SW[0] to supply the digital code CODE outputted from the 0th AD converter ADC[0] to the bus wiring line 100. Similarly, for example, turning on the respective transistors on the basis of the control signal SSW[1] causes the first switch SW[1] to supply the digital code CODE outputted from the first AD converter ADC[1] to the bus wiring line 100. The same applies to the other switches SW.

The bus wiring line 100 includes a plurality of wiring lines, and transmits the digital codes CODE outputted from the AD converters ADC. The readout section 30 uses this bus wiring line 100 to sequentially transfer the plurality of digital codes CODE supplied from the AD converters ADC to the controller 40 as the image signals DATA0 (data transfer operation).

The controller 40 (FIG. 1) supplies the scanning units 20L and 20R and the readout section 30 with control signals to control the operation of the imaging device 1. The controller 40 includes an address generation section 41, the voltage generation section 42, a column scanning section 43, an image processing section 44, and a diagnosis processing section 45.

The address generation section 41 determines the pixel line L to be driven in the pixel array 10, and generates the address signal ADR indicating the address corresponding to the pixel line L. The address generation section 41 then supplies the generated address signal ADR to the address decoder 21L of the scanning unit 20L and the address decoder 21R of the scanning unit 20R.

The voltage generation section 42 generates the voltage signal SVR and the power supply voltage VDD. The voltage signal SVR is a signal that changes between the predetermined voltage VR and the power supply voltage VDD. The voltage signal SVR is set at the power supply voltage VDD in the period in which the transistors TG and RST are both turned on, and set at the voltage VR in the D-phase period TD. The voltage generation section 42 then supplies the generated voltage signal SVR to the plurality of voltage supply lines VL0 in the pixel array 10, and supplies the generated power supply voltage VDD to the plurality of power lines PL in the pixel array 10.

The column scanning section 43 determines the AD converter ADC to be subjected to a data transfer operation in the readout section 30, and generates the control signal SSW on the basis of a result of the determination. The column scanning section 43 then supplies the generated control signal SSW to the plurality of switches SW of the readout section 30.

The image processing section 44 performs predetermined image processing on an image indicated by the image signal DATA0. Examples of the predetermined image processing include a dark current correction process of subtracting a contribution portion of a dark current of the photodiode PD from the digital code CODE included in the image signal DATA0. Specifically, the image processing section 44 corrects the digital code CODE for the pixel P1 on the basis of the digital code CODE for the light-shielded pixel P2, thereby performing the dark current correction process. The image processing section 44 performs such predetermined image processing to output the image signal DATA indicating an image that has been subjected to image processing.

The diagnosis processing section 45 performs a diagnosis process on the basis of the address signal ADR and the image signal DATA0. Specifically, the diagnosis processing section 45 obtains the line identification information INFL on the basis of the digital code CODE for the dummy pixel P3 included in the image signal DATA0, and compares the address indicated by the address signal ADR and this line identification information INFL to diagnose whether or not the imaging device 1 is performing a desired operation. The diagnosis processing section 45 then outputs a result (diagnosis result RES) of the diagnosis process.

Next, an implementation example of the imaging device 1 is described with reference to some examples.

FIG. 7 illustrates an implementation example E1 of the imaging device 1. In this implementation example E1, the imaging device 1 is formed as one semiconductor chip 200. The pixel array 10 is disposed around the center of the semiconductor chip 200. The scanning unit 20L is disposed on the left side of the pixel array 10, and the scanning unit 20R is disposed on the right side of the pixel array 10. The readout section 30 and the column scanning section 43 of the controller 40 are disposed below the pixel array 10. Above the pixel array 10, a control unit 40A is formed. This control unit 40A corresponds to circuits other than the column scanning section 43 of the controller 40.

In this configuration, the address generation section 41 in the control unit 40A supplies the address signal ADR to the scanning units 20L and 20R. The scanning units 20L and 20R supply the control signals STG, SRST, and SSEL to the pixel array 10. The voltage generation section 42 in the control unit 40A supplies the voltage signal SVR and the power supply voltage VDD to the pixel array 10. The pixel array 10 supplies the signal SIG to the readout section 30. The readout section 30 supplies the image signal DATA0 to the image processing section 44 and the diagnosis processing section 45 in the control unit 40A. The imaging device 1 performs a diagnosis process. This allows the imaging device 1 to detect, for example, an operational malfunction of each circuit, or a connection malfunction such as an open circuit or a short circuit of various wiring lines in the semiconductor chip 200.

FIG. 8 illustrates another implementation example E2 of the imaging device 1. In this implementation example E2, the imaging device 1 is formed as two semiconductor chips 201 and 202.

In this example, the pixel array 10 is formed in the semiconductor chip 201. That is, the plurality of pixels P1, the plurality of light-shielded pixels P2, the plurality of dummy pixels P3, the control lines TGL, RSTL, and SELL, the power line PL, the voltage supply line VL0, and the signal line SGL are formed in the semiconductor chip 201. In addition, electrode regions 201A, 201B, and 201C are provided in the semiconductor chip 201. The electrode region 201A is provided close to the left side of the semiconductor chip 201, the electrode region 201B is provided close to the right side of the semiconductor chip 201, and the electrode region 201C is provided close to the lower side of the semiconductor chip 201. A plurality of electrodes is formed in the electrode region 201A, and the plurality of these electrodes is, for example, coupled to the control lines TGL, RSTL, and SELL, the power line PL, and the voltage supply line VL0 in the pixel array 10 through a via such as TCV (Through Chip Via). A plurality of electrodes is formed in the electrode region 201B, and the plurality of these electrodes is, for example, coupled to the control lines TGL, RSTL, and SELL, the power line PL, and the voltage supply line VL0 in the pixel array 10 through a via such as TCV. A plurality of electrodes is formed in the electrode region 201B, and the plurality of these electrodes is coupled to, for example, the plurality of signal lines SGL in the pixel array 10 through a via such as TCV.

In this example, the scanning units 20L and 20R, the control unit 40A, the column scanning section 43, and the readout section 30 are formed in the semiconductor chip 202. The control unit 40A, the column scanning section 43, and the readout section 30 are disposed around the center of the semiconductor chip 202. The scanning unit 20L is disposed on the left of the control unit 40A, the column scanning section 43, and the readout section 30, and the scanning unit 20R is disposed on the right side of the control unit 40A, the column scanning section 43, and the readout section 30. In addition, electrode regions 202A, 202B, and 202C are provided in the semiconductor chip 202. The electrode region 202A is provided close to the left side of the semiconductor chip 202 to be adjacent to the scanning unit 20L, and the electrode region 202B is provided close to the right side of the semiconductor chip 202 to be adjacent to the scanning unit 20R. The electrode region 202C is provided close to the lower side of the semiconductor chip 202 to be adjacent to the readout section 30. A plurality of electrodes is formed in the electrode region 202A, and the plurality of these electrodes is coupled to, for example, the scanning unit 20L, and the voltage generation section 42 in the control unit 40A through a via such as TCV. A plurality of electrodes is formed in the electrode region 202B, and the plurality of these electrodes is coupled to, for example, the scanning unit 20R, and the voltage generation section 42 in the control unit 40A through a via such as TCV. A plurality of electrodes is formed in the electrode region 202C, and the plurality of these electrodes is coupled to, for example, the readout section 30 through a via such as TCV.

In this implementation example E2, the semiconductor chip 201 and the semiconductor chip 202 are bonded to each other. This electrically couples the plurality of electrodes in the electrode region 201A of the semiconductor chip 201 to the plurality of electrodes in the electrode region 202A of the semiconductor chip 202, electrically couples the plurality of electrodes in the electrode region 201B of the semiconductor chip 201 to the plurality of electrodes in the electrode region 202B of the semiconductor chip 202, and electrically couples the plurality of electrodes in the electrode region 201C of the semiconductor chip 201 to the plurality of electrodes in the electrode region 202C of the semiconductor chip 202.

In this configuration, the address generation section 41 in the control unit 40A of the semiconductor chip 202 supplies the address signal ADR to the scanning units 20L and 20R. The scanning units 20L and 20R of the semiconductor chip 202 supply the control signals STG, SRST, and SSEL to the pixel array 10 of the semiconductor chip 201 through the plurality of electrodes in the respective electrode regions 201A and 202A and the plurality of electrodes in the respective electrode regions 201B and 202B. The voltage generation section 42 in the control unit 40A of the semiconductor chip 202 supplies the voltage signal SVR and the power supply voltage VDD to the pixel array 10 of the semiconductor chip 201 through the plurality of electrodes in the respective electrode regions 201A and 202A and the plurality of electrodes in the respective electrode regions 201B and 202B. The pixel array 10 of the semiconductor chip 201 supplies the signals SIG to the readout section 30 of the semiconductor chip 202 through the plurality of electrodes in the respective electrode regions 201C and 201C. In the semiconductor chip 202, the readout section 30 supplies the image signal DATA0 to the image processing section 44 and the diagnosis processing section 45 in the control unit 40A. The imaging device 1 performs a diagnosis process. This allows the imaging device 1 to detect, for example, an operational malfunction of each circuit, a connection malfunction such as an open circuit or a short circuit of various wiring lines in each of the semiconductor chips 201 and 202, or a connection failure between the semiconductor chip 201 and the semiconductor chip 202.

In addition, disposing the pixel array 10 mainly in the semiconductor chip 201 in this way makes it possible to manufacture the semiconductor chip 201 by using a semiconductor manufacturing process specific to pixels. That is, the semiconductor chip 201 includes no transistor but the pixel array 10; therefore, for example, even in a case where an annealing process at 1000 degrees Celsius is performed, circuits other than the pixel array 10 are not influenced. Accordingly, in manufacturing of the semiconductor chip 201, it is possible to introduce, for example, a high-temperature process for measures against white spots, and as a result, it is possible to improve characteristics of the imaging device 1.

Here, the terminal T1 corresponds to a specific example of a "first terminal" in the present disclosure. The terminal T2 corresponds to a specific example of a "second terminal" in the present disclosure. The terminal T3 corresponds to a specific example of a "third terminal" in the present disclosure. The floating diffusion FD corresponds to a specific example of an "accumulation unit" in the present disclosure. The transistor TG corresponds to a specific example of the "first transistor" in the present disclosure. The transistor RST corresponds to a specific example of the "second transistor" in the present disclosure. The transistors AMP and SEL correspond to specific examples of an "output unit" in the present disclosure. The pixel circuit CKT of the dummy pixel P3B corresponds to a specific example of a "first pixel circuit" in the present disclosure. The pixel circuit CKT of the dummy pixel P3A corresponds to a specific example of a "second pixel circuit" in the present disclosure. The pixel circuit CKT of the pixel P1 corresponds to a specific example of a "third pixel circuit" in the present disclosure. The pixel circuit CKT of the dummy pixel P3C corresponds to a specific example of a "fourth pixel circuit" in the present disclosure. The pixel circuit CKT of the light-shielded pixel P2 corresponds to a specific example of a "fifth pixel circuit" in the present disclosure. The pixel circuit CKT of the dummy pixel P3E corresponds to a specific example of a "sixth pixel circuit" in the present disclosure. The respective pixel circuits CKT of the dummy pixel P3A and the dummy pixel P3B present in the dummy pixel region R32 correspond to specific examples of a "seventh pixel circuit" and an "eighth pixel circuit" in the present disclosure. The control lines TGL correspond to specific examples of a "first control line" and a "third control line" in the present disclosure. The control lines RSTL correspond to specific examples of a "second control line" and a "fourth control line" in the present disclosure. The voltage supply line VL0 corresponds to a specific example of a "first voltage supply line" in the present disclosure. The power line PL corresponds to a specific example of a "second voltage supply line" in the present disclosure. The voltage supply line VL2 corresponds to a specific example of a "third voltage supply line" in the present disclosure. The photodiode PD corresponds to a specific example of a "first light-receiving element" in the present disclosure. The scanning units 20L and 20R correspond to specific examples of a "driving unit" in the present disclosure. The scanning unit 20L corresponds to a specific example of a "first driving unit" in the present disclosure, and the scanning unit 20R corresponds to a specific example of a "second driving unit" in the present disclosure. A diagnosis unit 49 corresponds to a specific example of a "diagnosis unit" in the present disclosure. The plurality of AD converters corresponds to specific examples of a "conversion circuit" in the present disclosure. The diagnosis processing section 45 corresponds to a specific example of a "diagnosis circuit" in the present disclosure. The voltage generation section 42 corresponds to a specific example of a "voltage supply section" in the present disclosure. The voltage signal SVR corresponds to a specific example of a "first voltage signal" in the present disclosure. The dummy pixel region R31 corresponds to a specific example of a "first region" in the present disclosure. The normal pixel region R1 corresponds to a specific example of a "second region" in the present disclosure. The dummy pixel region R32 corresponds to a specific example of a "third region" in the present disclosure.

[Operations and Workings]

Next, the operations and workings of the imaging device 1 according to the present embodiment are described.

(Overview of Overall Operation)

First, an overview of the overall operation of the imaging device 1 is described with reference to FIG. 1. The address generation section 41 of the controller 40 determines the pixel line L to be driven in the pixel array 10, and generates the address signal ADR indicating the address corresponding to the pixel line L. The two scanning units 20L and 20R each sequentially drive the pixels P1, the light-shielded pixels P2, and the dummy pixels P3 in the pixel array 10 in units of the pixel lines L on the basis of an instruction from the controller 40. The voltage generation section 42 of the controller 40 generates the voltage signal SVR and the power supply voltage VDD. The pixel array 10 supplies the signal SIG to the readout section 30. The AD converter ADC of the readout section 30 performs AD conversion on the basis of the signal SIG to generate the digital code CODE. The column scanning section 43 of the controller 40 determines the AD converter ADC to be subjected to a data transfer operation, and generates the control signal SSW on the basis of a result of the determination. The switch SW of the readout section 30 supplies the digital code CODE outputted from the AD converters ADC to the bus wiring line 100 on the basis of this control signal SSW. In this way, the readout section 30 generates the image signal DATA0. The image processing section 44 of the controller 40 performs predetermined image processing an image indicated by the image signal DATA0 to generate an image signal DATA. The diagnosis processing section 45 of the controller 40 performs a diagnosis process on the basis of the address signal ADR and the image signal DATA0, and outputs the diagnosis result RES.

(Detailed Operation)

In the imaging device 1, the plurality of pixels P1 in the normal pixel region R1 each accumulates electric charges in accordance with the amount of received light, and outputs, as the signal SIG, the pixel voltage Vpix corresponding to the amount of received light. The following describes this operation in detail.

FIG. 9 illustrates an example of an operation of scanning the pixels P1 in the normal pixel region R1. FIG. 10 illustrates an operation example of the imaging device 1. (A) illustrates the waveform of a horizontal synchronization signal XHS. (B) to (D) respectively illustrate the waveforms of control signals SRST[0], STG[0], and SSEL[0] in control lines RSTL[0], TGL[0], and SELL[0] each corresponding to the 0th pixel line L[0]. (E) to (G) respectively illustrate the waveforms of control signals SRST[1], STG[1], and SSEL[1] in control lines RSTL[1], TGL[1], and SELL[1] each corresponding to the first pixel line L[1]. (H) to (J) respectively illustrate the waveforms of control signals SRST[2], STG[2], and SSEL[2] in control lines RSTL[2], TGL[2], and SELL[2] each corresponding to the second pixel line L[2]. (K) illustrates the waveform of the voltage signal SVR.

As illustrated in FIG. 9, the imaging device 1 performs accumulation start driving D1 on the pixels P1 in the normal pixel region R1 in order from top in the vertical direction in the period from a timing t0 to a timing t1.

Specifically, for example, as illustrated in FIG. 10, in a horizontal period H starting at a timing t21, the voltage generation section 42 first changes the voltage of the voltage signal SVR from the voltage VR to the power supply voltage VDD at the timing t21 (FIG. 10(K)). Next, the scanning units 20L and 20R change the voltage of the control signal SRST[0] from a low level to a high level at a timing t22 (FIG. 10(B)), and change the voltage of the control signal STG[0] from the low level to the high level at a timing t23 (FIG. 10(C)). This turns on both transistors TG and RST in the pixel P1 belonging to the 0th pixel line L[0], and sets the voltage of the floating diffusion FD and the voltage of the cathode of the photodiode PD at the power supply voltage VDD. The scanning units 20L and 20R then change the voltage of the control signal STG[0] from the high level to the low level at a timing t24 (FIG. 10(C)). This turns off the transistor TG in this pixel P1, and causes the photodiode PD to accumulate electric charges in accordance with the amount of received light. In this way, an accumulation period T10 starts in this pixel P1. Next, the voltage generation section 42 changes the voltage of the voltage signal SVR from the power supply voltage VDD to the voltage VR at a timing t25 (FIG. 10(K)), and the scanning units 20L and 20R change the voltage of the control signal SRST[0] from the high level to the low level at a timing t26 (FIG. 10(B)). This turns off the transistor RST in this pixel P1.

In the horizontal period H starting at this timing t21, the light-shielded pixel P2 and the dummy pixel P3 belonging to the 0th pixel line L[0] are driven similarly to the pixel P1 belonging to this pixel line L[0]. That is, the pixel P1, the light-shielded pixel P2, and the dummy pixel P3 belonging to the pixel line L[0] are coupled to the same control line TGL, the same control line RSTL, and the same control line SELL, and thus driven similarly.

The transistors TG and RST are both turned on in the light-shielded pixel P2 belonging to this pixel line L[0] in the period from a timing t23 to a timing 24, and the voltage of the floating diffusion FD and the voltage of the cathode of the photodiode PD are set at the power supply voltage VDD. At the timing t24, the transistor TG is then turned off, and the photodiode PD starts to accumulate electric charges. In this light-shielded pixel P2, light is blocked not to enter the photodiode PD, and the photodiode PD thus starts to accumulate electric charges caused by a dark current.

In addition, the dummy pixel P3 belonging to this pixel line L[0] does not include the photodiode PD, and the operation of the dummy pixel P3 is thus different slightly from those of the pixel P1 and the light-shielded pixel P2. In the dummy pixel P3A, as illustrated in FIG. 3A, the source of the transistor TG is coupled to the power line PL. Accordingly, when the transistors TG and RST are both turned on in the period from the timing t23 to the timing t24, the voltage of the floating diffusion FD is set at the power supply voltage VDD. In addition, in the dummy pixel P3B, as illustrated in FIG. 3B, the source of the transistor TG is coupled to the voltage supply line VL0. Accordingly, when the transistors TG and RST are both turned on, the voltage of the floating diffusion FD is set at the power supply voltage VDD. That is, as illustrated in FIG. 10(K), the voltage of the voltage signal SVR in the voltage supply line VL0 is set at the power supply voltage VDD in the period from the timing t23 to the timing t24, and it is thus possible to set the voltage of the floating diffusion FD at the power supply voltage VDD while reducing the possibility of a great current flowing from the power line PL to the voltage supply line VL0.

Similarly, in the horizontal period H starting at a timing t27, the pixel P1 belonging to the first pixel line L[1] starts to accumulate electric charges in accordance with the amount of received light. In the horizontal period H starting at a timing t28, the pixel P1 belonging to the second pixel line L[2] starts to accumulate electric charges in accordance with the amount of received light.

The imaging device 1 performs the accumulation start driving D1 in this way to sequentially cause the pixels P1 to start to accumulate electric charges. Then, in the respective pixels P1, electric charges are accumulated in the accumulation period T10 before readout driving D2 is performed.

As illustrated in FIG. 9, the imaging device 1 then performs the readout driving D1 on the pixels P1 in the normal pixel region R1 in order from top in the vertical direction in the period from a timing t10 to a timing tn.

Specifically, for example, as illustrated in FIG. 10, in a horizontal period H starting at a timing t31, the voltage generation section 42 first changes the voltage of the voltage signal SVR from the voltage VR to the power supply voltage VDD at the timing t31 (FIG. 10(K)). Next, the scanning units 20L and 20R then change the voltage of the control signal SSEL[0] from the low level to the high level at a timing t32 (FIG. 10(D)). This turns on the transistor SEL in the pixel P1 belonging to the 0th pixel line L[0], and electrically couples this pixel P1 to the readout section 30. Next, the scanning units 20L and 20R set the voltage of the control signal SRST[0] at the high level in the period from a timing t33 to a timing t34 (FIG. 10(B)). Accordingly, in this pixel P1, the transistor RST is turned on. The floating diffusion FD1 is supplied with the power supply voltage VDD, and the voltage of the floating diffusion FD is reset (reset operation). In the P-phase period TP after this timing t34, this pixel P1 then outputs the reset voltage Vreset as the signal SIG. The reset voltage Vreset corresponds to the voltage of the floating diffusion FD in the P-phase period TP. In addition, the voltage generation section 42 changes the voltage of the voltage signal SVR from the power supply voltage VDD to the voltage VR (FIG. 10(K)). Next, the scanning units 20L and 20R set the voltage of the control signal STG[0] at the high level from a timing t35 to a timing t36 (FIG. 10(C)). Accordingly, in this pixel P1, the transistor TG is turned on. Electric charges generated in the photodiode PD are transferred to the floating diffusion FD (electric charge transfer operation). In this way, the accumulation period T10 ends in this pixel P1. In the D-phase period TD after this timing t36, this pixel P1 then outputs the pixel voltage Vpix as the signal SIG. The pixel voltage Vpix corresponds to the voltage of the floating diffusion FD in the P-phase period TP. Afterwards, the scanning units 20L and 20R then change the voltage of the control signal SSEL[0] from the high level to the low level (FIG. 10(D)). Accordingly, in this pixel P1, the transistor SEL is turned off. The pixel P1 is electrically uncoupled from the readout section 30. The readout section 30 performs AD conversion on the basis of this signal SIG (reset voltage Vreset and pixel voltage Vpix), thereby generating the digital code CODE.

In the horizontal period H starting at this timing t31, the light-shielded pixel P2 and the dummy pixel P3 belonging to the 0th pixel line L[0] are driven similarly to the pixel P1 belonging to this pixel line L[0].

The light-shielded pixel P2 belonging to this pixel line L[0] outputs the reset voltage Vreset as the signal SIG in the P-phase period TP, and outputs the pixel voltage Vpix as the signal SIG in the D-phase period TD. In this light-shielded pixel P2, light is blocked not to enter the photodiode PD, and thus this pixel voltage Vpix is a voltage corresponding to a dark current.

In addition, the dummy pixel P3 belonging to this pixel line L[0] does not include the photodiode PD, and the operation of the dummy pixel P3 is thus different slightly from those of the pixel P1 and the light-shielded pixel P2. As illustrated in FIG. 3A, the source of the transistor TG of the dummy pixel P3A is coupled to the power line PL. Accordingly, the dummy pixel P3A outputs the reset voltage Vreset as the signal SIG in the P-phase period TP, and outputs a voltage corresponding to the power supply voltage VDD as the signal SIG in the D-phase period TD. In addition, as illustrated in FIG. 3B, the source of the transistor TG of the dummy pixel P3B is coupled to the voltage supply line VL0. Accordingly, the dummy pixel P3B outputs the reset voltage Vreset as the signal SIG in the P-phase period TP, and outputs a voltage corresponding to the voltage VR as the signal SIG in the D-phase period TD.

Similarly, in the horizontal period H starting at a timing t37, the pixel P1 belonging to the first pixel line L[1] outputs the signal SIG, and the readout section 30 performs AD conversion on the basis of this signal SIG, thereby generating the digital code CODE. In addition, in the horizontal period H starting at a timing t38, the pixel P1 belonging to the second pixel line L[2] outputs the signal SIG, and the readout section 30 performs AD conversion on the basis of this signal SIG, thereby generating the digital code CODE.

In this way, the imaging device 1 performs the readout driving D2, thereby sequentially performing AD conversion on the basis of the signals SIG (the reset voltage Vreset and the pixel voltage Vpix) outputted from the pixels P1 to generate the digital codes CODE.

The imaging device 1 repeats such accumulation start driving D1 and readout driving D2. Specifically, as illustrated in FIG. 9, the imaging device 1 performs the accumulation start driving D1 in the period from the timing t2 to the timing t3, and performs the readout driving D2 in the period from the timing t12 to the timing t13. In addition, the imaging device 1 performs the accumulation start driving D1 in the period from the timing t4 to the timing t5, and performs the readout driving D2 in the period from the timing t14 to the timing t15.

Next, the readout driving D2 is described in detail.

FIG. 11 illustrates an operation example of the readout driving D2 in the pixel P1 of interest. (A) illustrates the waveform of the horizontal synchronization signal XHS. (B) illustrates the waveform of the control signal SRST. (C) illustrates the waveform of the control signal STG. (D) illustrates the waveform of the control signal SSEL. (E) illustrates the waveform of the reference signal REF. (F) illustrates the waveform of the signal SIG. (G) illustrates the waveform of the signal CMP outputted from the comparator 36 of the AD converter ADC. (H) illustrates the waveform of the clock signal CLK. (I) illustrates the count value CNT of the counter 37 of the AD converter ADC. Here, in FIGS. 11(E) and (F), the waveforms of the respective signals are plotted on the same voltage axis. The reference signal REF in FIG. 11(E) indicates a waveform at the positive input terminal of the comparator 36, and the signal SIG in FIG. 11(F) indicates a waveform at the negative input terminal of the comparator 36.

In the imaging device 1, in a certain horizontal period (H), first, each of the scanning units 20L and 20R performs an reset operation on the pixel P1, and the AD converter ADC performs AD conversion on the basis of the reset voltage Vreset outputted from the pixel P1 in the following P-phase period TP. Then, each of the scanning units 20L and 20R performs an electric charge transfer operation on the pixel P1, and the AD converter ADC performs AD conversion on the basis of the pixel voltage Vpix outputted from the pixel P1 in the D-phase period TD. The following describes this operation in detail.

First, the horizontal period H starts at a timing t41, and then each of the scanning units 20L and 20R changes the voltage of the control signal SSEL from the low level to the high level at a timing t42 (FIG. 11(D)). This turns on the transistor SEL in the pixel P1. The pixel P1 is electrically coupled to the signal line SGL.

Next, at a timing t43, each of the scanning units 20L and 20R changes the voltage of the control signal SRST from the low level to the high level (FIG. 11(B)). This turns on the transistor RST in the pixel P1, and sets the voltage of the floating diffusion FD at the power supply voltage VDD (reset operation). In addition, in the period from a timing t43 to a timing t45, the comparator 36 performs zero adjustment that causes the positive input terminal and the negative input terminal to be coupled.

Next, at a timing t44, each of the scanning units 20L and 20R changes the voltage of the control signal SRST from the high level to the low level (FIG. 11(B)). This turns off the transistor RST in the pixel P1. Then, from this timing t44 onward, the pixel P1 outputs a voltage (reset voltage Vreset) corresponding to the voltage of the floating diffusion FD at this time (FIG. 11(F)).

Next, at the timing t45, the comparator 36 terminates the zero adjustment, and electrically uncouples the positive input terminal and the negative input terminal. Then, at this timing t45, the reference signal generator 32 changes the voltage of the reference signal REF to a voltage V1 (FIG. 11(E)).

Next, in the period (P-phase period TP) from a timing t46 to a timing t48, the readout section 30 performs AD conversion on the basis of the reset voltage Vreset. Specifically, first, at the timing t46, the readout controller 31 starts to generate the clock signal CLK (FIG. 11(H)). Simultaneously with this, the reference signal generator 32 starts to decrease the voltage of the reference signal REF from the voltage V1 at a predetermined change rate (FIG. 11(E)). Accordingly, the counter 37 of the AD converter ADC starts a counting operation to sequentially change the count value CNT (FIG. 11(I)).

Then, at the timing t47, the voltage of the reference signal REF falls below the voltage (reset Vreset) of the signal SIG (FIGS. 11(E) and (F)). Accordingly, the comparator 36 of the AD converter ADC changes the voltage of the signal CMP from the high level to the low level (FIG. 11(G)). As a result, the counter 37 stops the counting operation (FIG. 11(I)).

Next, at the timing t48, the readout controller 31 stops generating the clock signal CLK at the end of the P-phase period TP (FIG. 11(H)). Simultaneously with this, the reference signal generator 32 stops changing the voltage of the reference signal REF, and changes the voltage of the reference signal REF to a voltage V2 at the following timing t49 (FIG. 11(E)). Accordingly, the voltage of the reference signal REF exceeds the voltage (reset voltage Vreset) of the signal SIG (FIGS. 11(E) and (F)), and the comparator 36 of the AD converter ADC thus changes the voltage of the signal CMP from the low level to the high level (FIG. 11(G)).

Next, at a timing t50, the counter 37 of the AD converter ADC reverses the polarity of the count value CNT on the basis of the control signal CC (FIG. 11(I)).

Next, at a timing t51, each of the scanning units 20L and 20R changes the voltage of the control signal STG from the low level to the high level (FIG. 11(C)). This turns on the transistor TG in this pixel P1. As a result, electric charges generated in the photodiode PD are transferred to the floating diffusion FD (electric charge transfer operation). Accordingly, the voltage of the signal SIG is decreased (FIG. 11(F)).

At a timing t52, each of the scanning units 20L and 20R then changes the voltage of the control signal STG from the high level to the low level (FIG. 11(C)). This turns off the transistor TG in the pixel P1. Then, from this timing t52 onward, the pixel P1 outputs a voltage (pixel voltage Vpix) corresponding to the voltage of the floating diffusion FD at this time (FIG. 11(F)).

Next, in the period (D-phase period TD) from a timing t53 to a timing t55, the readout section 30 performs AD conversion on the basis of the pixel voltage Vpix. Specifically, first, at the timing t53, the readout controller 31 starts to generate the clock signal CLK (FIG. 11(H)). Simultaneously with this, the reference signal generator 32 starts to decrease the voltage of the reference signal REF from the voltage V2 at a predetermined change rate (FIG. 11(E)). Accordingly, the counter 37 of the AD converter ADC starts a counting operation to sequentially change the count value CNT (FIG. 11(I)).

Then, at the timing t54, the voltage of the reference signal REF falls below the voltage (pixel Vpix) of the signal SIG (FIGS. 11(E) and (F)). Accordingly, the comparator 36 of the AD converter ADC changes the voltage of the signal CMP from the high level to the low level (FIG. 11(G)). As a result, the counter 37 stops the counting operation (FIG. 11(I)). In this way, the AD converter ADC obtains the count value CNT corresponding to a difference between the pixel voltage Vpix and the reset voltage Vreset. Then, the latch 38 of the AD converter ADC outputs this count value CNT while retaining the count value CNT as the digital code CODE.

Next, at the timing t55, the readout controller 31 stops generating the clock signal CLK at the end of the D-phase period TD (FIG. 11(H)). Simultaneously with this, the reference signal generator 32 stops changing the voltage of the reference signal REF, and changes the voltage of the reference signal REF to a voltage V3 at the following timing t56 (FIG. 11E)). Accordingly, the voltage of the reference signal REF exceeds the voltage (pixel voltage Vpix) of the signal SIG (FIGS. 11(E) and (F)), and the comparator 36 of the AD converter ADC thus changes the voltage of the signal CMP from the low level to the high level (FIG. 11(G)).

Next, at a timing t57, each of the scanning units 20L and 20R changes the voltage of the control signal SSEL from the high level to the low level (FIG. 11(D)). This turns off the transistor SEL in the pixel P1, and electrically uncouples the pixel P1 from the signal line SGL.

At a timing t58, the counter 37 of the AD converter ADC then resets the count value CNT at "0" on the basis of the control signal CC (FIG. 11(I)).

As described above, in the imaging device 1, the counting operation is performed on the basis of the reset voltage Vreset in the P-phase period TP, and after the polarity of the count value CTN is reversed, the counting operation is performed on the basis of the pixel voltage Vpix in the D-phase period TD. This allows the imaging device 1 to acquire the digital code CODE corresponding to a voltage difference between the pixel voltage Vpix and the reset voltage Vreset. In the imaging device 1, such correlated double sampling is performed, and it is thus possible to remove a noise component included in the pixel voltage Vpix. As a result, it is possible to increase the image quality of a captured image.

The readout section 30 supplies the digital codes CODE outputted from the plurality of AD converters ADC to the image processing section 44 of the controller 40 as the image signal DATA0 through the bus wiring line 100. Next, this data transfer operation is described in detail.

FIG. 12 schematically illustrates an example of a data transfer operation of the readout section 30. In FIG. 12, a bold line represents a bus wiring line for a plurality of bits. In FIG. 12, for example, "0" in the AD converters ADC indicates the 0th AD converter ADC[0], and "1" indicates the first AD converter ADC[1].

The column scanning section 43 generates the control signals SSW to cause the plurality of AD converters ADC of the readout section 30 to be sequentially subjected to data transfer operations. As the respective bits of the control signals SSW, for example, the control signal SSW[0], the control signal SSW[1], the control signal SSW[2], . . . become active in this order. This first supplies the digital code CODE of the 0th AD converter ADC[0] to the bus wiring line 100 in the readout section 30, and then supplies the digital code CODE of the first AD converter ADC[1] to the bus wiring line 100. Next, the digital code CODE of the second AD converter ADC[2] is supplied to the bus wiring line 100. In this way, the digital codes CODE are transferred to the controller 40 in order from the AD converter ADC on the left (in transfer order F) as the image signal DATA0.

(Regarding Diagnosis Process)

Next, a diagnosis process of the imaging device 1 is described in detail.

FIG. 13 schematically illustrates an overall operation example of a diagnosis process of the imaging device 1. This diagnosis process is performed in parallel with a normal imaging operation using the pixel P1 in the normal pixel region R1. The readout section 30 and the diagnosis processing section 45 are included in the diagnosis unit 49.

The address generation section 41 of the controller 40 first determines the pixel line L to be driven in the pixel array 10, and generates the address signal ADR indicating the address corresponding to the pixel line L. The address generation section 41 then supplies this address signal ADR to the scanning units 20L and 20R.

The two scanning units 20L and 20R drive the pixel P1, the light-shielded pixel P2, and the dummy pixel P3 belonging to the pixel line L corresponding to the address indicated by the address signal ADR on the basis of an instruction from the controller 40.

The eleven dummy pixels P3 in the dummy pixel region R31 and the eleven dummy pixels P3 in the dummy pixel region R32 of the pixel array 10 each generate the signal SIG, and each supply the generated signal SIG to the readout section 30. The AD converters ADC of the readout section 30 generate the respective digital codes CODE on the basis of these signals SIG.

Each of the dummy pixels P3 in the dummy pixel regions R31 and R32 is the dummy pixel P3A (FIG. 3A) or the dummy pixel P3B (FIG. 3B). As illustrated in FIG. 3A, the source of the transistor TG of the dummy pixel P3A is coupled to the power line PL. The dummy pixel P3A therefore outputs the reset voltage Vreset as the signal SIG in the P-phase period TP, and outputs a voltage corresponding to the power supply voltage VDD as the signal SIG in the D-phase period TD. In addition, as illustrated in FIG. 3B, the source of the transistor TG of the dummy pixel P3B is coupled to the voltage supply line VL0. The dummy pixel P3B therefore outputs the reset voltage Vreset as the signal SIG in the P-phase period TP, and outputs a voltage corresponding to the voltage VR as the signal SIG in the D-phase period TD. The AD converters ADC of the readout section 30 generate the respective digital codes CODE on the basis of these signals SIG.

FIG. 14 illustrates the relationship between the signals SIG and the digital codes CODE in the dummy pixels P3A and P3B. The dummy pixel P3A outputs a voltage corresponding to the power supply voltage VDD as the signal SIG in the D-phase period TD. This causes the digital code CODE converted by the AD converter ADC to be a code close to a zero code. In addition, the dummy pixel P3B outputs a voltage corresponding to the voltage VR as the signal SIG in the D-phase period TD. This causes the digital code CODE converted by the AD converter ADC to be a code close to a full code in this example.

In this way, the plurality of AD converters ADC of the readout section 30 each generates the digital code CODE. The column scanning section 43 of the controller 40 generates the control signals SSW to cause the plurality of AD converters ADC of the readout section 30 to be sequentially subjected to data transfer operations. This causes the readout section 30 to supply the image signal DATA0 to the controller 40. The image signal DATA0 includes the eleven digital codes CODE for the eleven dummy pixels P3 in the dummy pixel region R31 and the eleven digital codes CODE for the eleven dummy pixels P3 in the dummy pixel region R32.

The diagnosis processing section 45 of the controller 40 obtains the line identification information INFL on the basis of the digital code CODE for the dummy pixel P3 included in the image signal DATA0, and compares the address indicated by the address signal ADR and this line identification information INFL to diagnose whether or not the imaging device 1 is performing a desired operation.

Specifically, the diagnosis processing section 45 first uses a threshold TH set between a zero code and a full code to perform a binarization process on each of the eleven digital codes CODE for the eleven dummy pixels P3 in the dummy pixel region R31. As illustrated in FIG. 14, the digital code CODE for the dummy pixel P3A is a code close to a zero code and thus has "0" while the digital code CODE for the dummy pixel P3B is a code close to a full code and thus has "1". This causes the diagnosis processing section 45 to obtain a 11-bit binary number. This 11-bit binary number is the line identification information INFL illustrated in FIG. 5. The diagnosis processing section 45 then compares the address indicated by the address signal ADR and this line identification information INFL to diagnose whether or not the imaging device 1 is performing a desired operation.

The same applies to the dummy pixel region R32. That is, the diagnosis processing section 45 first performs a binarization process on each of the eleven digital codes CODE for the eleven dummy pixels P3 in the dummy pixel region R32, thereby obtaining the line identification information INFL. The diagnosis processing section 45 then compares the address indicated by the address signal ADR and this line identification information INFL to diagnose whether or not the imaging device 1 is performing a desired operation. For example, the address indicated by the address signal ADR is "00000000000" in a case where the address signal ADR indicates the 0th pixel line L[0]. The address indicated by the address signal ADR is "00000000001" in a case where the address signal ADR indicates the first pixel line L[1]. The address indicated by the address signal ADR is "00000000010" in a case where the address signal ADR indicates the second pixel line L[2].

For example, the diagnosis processing section 45 determines that the imaging device 1 is performing a desired operation, in a case where the line identification information INFL acquired from the digital codes CODE for the dummy pixel region R31 and the address indicated by the address signal ADR match each other, and the line identification information INFL acquired from the digital codes CODE for the dummy pixel region R32 and the address indicated by the address signal ADR match each other.

In addition, for example, the diagnosis processing section 45 determines that the imaging device 1 has a malfunction, in a case where the line identification information INFL acquired from the digital codes CODE for the dummy pixel region R31 and the address indicated by the address signal ADR do not match each other, or in a case where the line identification information INFL acquired from the digital codes CODE for the dummy pixel region R32 and the address indicated by the address signal ADR do not match each other.

The mismatch between the line identification information INFL acquired from the digital codes CODE for the dummy pixel region R31 and the address indicated by the address signal ADR may be caused, for example, by a connection malfunction between the address generation section 41 and the scanning unit 20L, a malfunction of the scanning unit 20L, a connection malfunction between the scanning unit 20L and the dummy pixel P3 in the dummy pixel region R31, a malfunction of the dummy pixel P3 in the dummy pixel region R31, a connection malfunction between the dummy pixel P3 in the dummy pixel region R31 and the AD converter ADC, a malfunction of the AD converter ADC, or the like.

In addition, the mismatch between the line identification information INFL acquired from the digital codes CODE for the dummy pixel region R32 and the address indicated by the address signal ADR may be caused, for example, by a connection malfunction between the address generation section 41 and the scanning unit 20R, a malfunction of the scanning unit 20R, a connection malfunction between the scanning unit 20R and the dummy pixel P3 in the dummy pixel region R32, a malfunction of the dummy pixel P3 in the dummy pixel region R32, a connection malfunction between the dummy pixel P3 in the dummy pixel region R32 and the AD converter ADC, a malfunction of the AD converter ADC, or the like.

The diagnosis processing section 45 performs a diagnosis process in this way. The diagnosis processing section 45 then outputs a result of the diagnosis process as the diagnosis result RES.

As described above, the imaging device 1 is provided with the dummy pixel regions R31 and R32. In each pixel line L, the dummy pixel region R31 is provided with the plurality of (eleven in this example) dummy pixels P3, and the dummy pixel region R32 is provided with the plurality of (eleven in this example) dummy pixels P3. These dummy pixels P3 include the dummy pixels P3A (FIG. 3A) or the dummy pixels P3B (FIG. 3B) the sources of the respective transistors TG of which have different coupling destinations. This allows the imaging device 1 to fix and set information regarding each pixel line L by using the disposition of the dummy pixels P3 like so-called mask ROM (Read Only Memory). In this example, the disposition of the dummy pixels P3 is used to set the line identification information INFL for identifying the pixel line L. Accordingly, performing a self-diagnosis makes it possible to detect a trouble of address control and a trouble of pixel control.

Especially, the imaging device 1 has the eleven dummy pixels P3 arranged like the arrangement corresponding to the cardinal number of the pixel line L expressed as a binary number as illustrated in FIG. 5. This makes it possible to simplify the configuration of a circuit that compares the line identification information INFL and the address indicated by the address signal ADR.

In addition, the imaging device 1 is provided with the two dummy pixel regions R31 and R32 on the left and right of the normal pixel region R1, respectively. A diagnosis process is performed in parallel with a normal imaging operation using the pixel P1 in the normal pixel region R1. This makes it possible, for example, to detect a trouble in a timely manner. That is, for example, in a case where a diagnosis process is performed in a blanking period T20, the blanking period T20 is short. It is thus difficult to perform a diagnosis process on all the pixel lines L in the one blanking period T20. Accordingly, a diagnosis process is performed on all the pixel lines L by using the plurality of blanking periods T20. In this case, however, when a trouble occurs, it may not be possible to detect the trouble in a timely manner. In contrast, the imaging device 1 performs a diagnosis process on all the pixel lines L while performing a normal imaging operation. This allows the imaging device 1 to perform a diagnosis process on all the pixel lines L within a 1-frame period. As a result, the imaging device 1 is able to detect a trouble in a timely manner.

[Effects]

As described above, in the present embodiment, there is provided a dummy pixel region. In each pixel line L, the dummy pixel region is provided with a plurality of dummy pixels. The plurality of these dummy pixels includes two types of pixels the source of the respective transistors TG of which have different coupling destinations. According, performing a self-diagnosis makes it possible to detect a malfunction of an imaging device.

In the present embodiment, the imaging device 1 is provided with two dummy pixel regions on the left and right of a normal pixel region, respectively. A diagnosis process is performed in parallel with a normal imaging operation using a pixel in the normal pixel region. This makes it possible, for example, to detect a trouble in a timely manner.

[Modification Example 1-1]

In the above-described embodiment, the two scanning units 20L and 20R are provided, but this is not limitative. Instead thereof, there may be provided one scanning unit like an imaging device 1B illustrated in FIG. 15. This imaging device 1B includes the one scanning unit 20L, a pixel array 10B, a readout section 30B, and a controller 40B. That is, the imaging device 1B is obtained by removing the scanning unit 20R from the imaging device 1 (FIG. 1) according to the above-described embodiment, and replacing the pixel array 10, the readout section 30, and the controller 40 with the pixel array 10B, the readout section 30B, and the controller 40B, respectively.

The pixel array 10B is obtained by removing the dummy pixel region R31 from the pixel array 10 (FIG. 1) according to the above-described embodiment. The readout section 30B performs AD conversion on the basis of the signal SIG supplied from the pixel array 10B through the signal line SGL, thereby generating the image signal DATA0. The controller 40B supplies the scanning unit 20L and the readout section 30B with control signals to control the operation of the imaging device 1B. The controller 40B includes a column scanning section 43B and a diagnosis processing section 45B. The column scanning section 43B determines the AD converter ADC to be subjected to a data transfer operation in the readout section 30B, and generates the control signal SSW on the basis of a result of the determination. The diagnosis processing section 45B performs a binarization process on each of the eleven digital codes CODE for the eleven dummy pixels P3 in the dummy pixel region R32, thereby obtaining the line identification information INFL. The diagnosis processing section 45B compares the address indicated by the address signal ADR and this line identification information INFL, thereby diagnosing whether or not the imaging device 1 is performing a desired operation.

In the imaging device 1B, the scanning unit 20L drives the pixel P1, the light-shielded pixel P2, and the dummy pixel P3 belonging to the pixel line L corresponding to the address indicated by the address signal ADR on the basis of an instruction from the controller 40B. The eleven dummy pixels P3 in the dummy pixel region R32 of the pixel array 10B each generate the signal SIG, and each supply the generated signal SIG to the readout section 30B. The scanning unit 20L is disposed on the left of the pixel array 10B, and the dummy pixel region R32 is provided at the right end of the pixel array 10B. That is, the imaging device 1B is provided with the dummy pixel region R32 in the farthest place from the scanning unit 20L in the pixel array 10B, and performing a diagnosis process thus makes it possible to diagnose the driving performance of the driver section 23L of the scanning unit 20L. In addition, the imaging device 1B is provided with the dummy pixel region R32 in the farthest place from the scanning unit 20L in this way, thereby making it possible to diagnose even disconnections of the control lines TGL, RSTL, and SELL and the power line PL in the light-shielded pixel region R21, the normal pixel region R1, and the light-shielded pixel region R22.

[Modification Example 1-2]

In the above-described embodiment, the dummy pixel P3 includes any of the two dummy pixels P3A and P3B, but this is not limitative. Instead thereof, for example, any of three or more dummy pixels may be included. The following describes an imaging device 1C in detail. The dummy pixels P3 of the imaging device 1C include four dummy pixels P3C, P3D, P3E, and P3F.

Similarly to the imaging device 1 according to the above-described embodiment, the imaging device 1C includes a pixel array 10C, a readout section 30C, and a controller 40C.

The pixel array 10C includes the plurality of dummy pixels P3 (dummy pixels P3C, P3D, P3E, and P3F). The plurality of dummy pixels P3 is disposed in dummy pixel regions R31 and R32.

FIGS. 16A to 16D each illustrate a configuration example of the dummy pixel P3 in each of the dummy pixel regions R31 and R32. FIG. 16A illustrates an example of the dummy pixel P3C. FIG. 16B illustrates an example of the dummy pixel P3D. FIG. 16C illustrates an example of the dummy pixel P3E. FIG. 16D illustrates an example of the dummy pixel P3F. The pixel array 10C includes a plurality of voltage supply lines VL1 to VL3 in the dummy pixel regions R31 and R32. A voltage generation section 42C (described below) applies a single voltage signal SVR1 to the plurality of voltage supply lines VL1. This voltage signal SVR1 is a signal that changes between a predetermined voltage VR1 and the power supply voltage VDD. The voltage signal SVR1 is set at the voltage VR1 in the D-phase period TD. The voltage generation section 42C applies a single voltage signal SVR2 to the plurality of voltage supply lines VL2. This voltage signal SVR2 is a signal that changes between a predetermined voltage VR2 and the power supply voltage VDD. The voltage signal SVR2 is set at the voltage VR2 in the D-phase period TD. The voltage generation section 42C applies a single voltage signal SVR3 to the plurality of voltage supply lines VL3. This voltage signal SVR3 is a signal that changes between a predetermined voltage VR3 and the power supply voltage VDD. The voltage signal SVR3 is set at the voltage VR3 in the D-phase period TD. The voltage VR1 is a voltage lower than the power supply voltage VDD. The voltage VR2 is a voltage lower than the voltage VR1. The voltage VR3 is a voltage lower than the voltage VR2.

The dummy pixels P3 (dummy pixels P3C and P3F) each include the pixel circuit CKT. The sources of the respective transistors TG of the dummy pixels P3C to P3E have different coupling destinations. Specifically, as illustrated in FIG. 16A, the source of the transistor TG of the dummy pixel P3C is coupled to the power line PL. As illustrated in FIG. 16B, the source of the transistor TG of the dummy pixel P3D is coupled to the voltage supply line VL1. As illustrated in FIG. 16C, the source of the transistor TG of the dummy pixel P3E is coupled to the voltage supply line VL2. As illustrated in FIG. 16D, the source of the transistor TG of the dummy pixel P3F is coupled to the voltage supply line VL3.

The source of the transistor TG of the dummy pixel P3C is coupled to the power line PL, and thus the voltage of the floating diffusion FD in the D-phase period TD is the power supply voltage VDD. This causes the dummy pixel P3C to output the voltage corresponding to the power supply voltage VDD as the signal SIG in the D-phase period TD. In addition, the source of the transistor TG of the dummy pixel P3D is coupled to the voltage supply line VL1. The voltage of the voltage signal SVR1 applied to this voltage supply line VL1 is set at the voltage VR1 in the D-phase period TD, and thus the voltage of the floating diffusion FD in the D-phase period TD is the voltage VR1. This causes the dummy pixel P3D to output the voltage corresponding to the voltage VR1 as the signal SIG in the D-phase period TD. Similarly, the source of the transistor TG of the dummy pixel P3E is coupled to the voltage supply line VL2. Accordingly, the dummy pixel P3E outputs a voltage corresponding to the voltage VR2 as the signal SIG in the D-phase period TD. In addition, the source of the transistor TG of the dummy pixel P3F is coupled to the voltage supply line VL3. Accordingly, the dummy pixel P3F outputs a voltage corresponding to the voltage VR3 as the signal SIG in the D-phase period TD.

In this example, the one pixel line L includes the six dummy pixels P3 (dummy pixels P3[5] to P3[0]) in the dummy pixel region R31. Each of these dummy pixels P3[5] to P3[0] is any of the dummy pixel P3C (FIG. 16A), the dummy pixel P3D (FIG. 16B), the dummy pixel P3E (FIG. 16C), or the dummy pixel P3F (FIG. 16D).

FIG. 17 illustrates the arrangement of the dummy pixels P3C to P3F in the dummy pixel region R31. In FIG. 17, "00" represents the dummy pixel P3C, "01" represents the dummy pixel P3D, "10" represents the dummy pixel P3E, and "11" represents the dummy pixel P3F. For example, the 0th pixel line L[0] has "00", "00", "00", "00", "00", and "00" as the arrangement of the dummy pixels P3. That is, all the six dummy pixels P3[5] to P3[0] are the dummy pixels P3C. The first pixel line L[1] has "00", "00", "00", "00", "00", and "01" as the arrangement of the dummy pixels P3. That is, the dummy pixel P3[0] is the dummy pixel P3D, and the other dummy pixels P3[5] to P3[1] are the dummy pixels P3C. The second pixel line L[2] has "00", "00", "00", "00", "00", and "10" as the arrangement of the dummy pixels P3. That is, the dummy pixel P3[0] is the dummy pixel P3E, and the other dummy pixels P3[5] to P3[1] are the dummy pixels P3C. The third pixel line L[3] has "00", "00", "00", "00", "00", and "11" as the arrangement of the dummy pixels P3. That is, the dummy pixel P3[0] is the dummy pixel P3F, and the other dummy pixels P3[5] to P3[1] are the dummy pixels P3C. The fourth pixel line L[4] has "00", "00", "00", "00", "01", and "00" as the arrangement of the dummy pixels P3. That is, the dummy pixel P3[1] is the dummy pixel P3D, and the other dummy pixels P3[5] to P3[2] and P3[0] are the dummy pixels P3C. The arrangement of the six dummy pixels P3 functions as the line identification information INFL for identifying the pixel line L. The arrangement of the dummy pixels P3 in the dummy pixel region R32 is the same as the arrangement (FIG. 17) of the dummy pixels P3 in the dummy pixel region R31.

The AD converters ADC of the readout section 30C generate the respective digital codes CODE on the basis of the signals SIG supplied from the pixel array 10C. The readout section 30C then supplies, as the image signal DATA0, the controller 40C with the six digital codes CODE for the six dummy pixels P3 in the dummy pixel region R31 and the six digital codes CODE for the six dummy pixels P3 in the dummy pixel region R32.

A diagnosis processing section 45C of the controller 40C obtains the line identification information INFL on the basis of the digital code CODE for the dummy pixel P3 included in the image signal DATA0, and compares the address indicated by the address signal ADR and this line identification information INFL to diagnose whether or not the imaging device 1C is performing a desired operation.

FIG. 18 illustrates the relationship between the signals SIG and the digital codes CODE in the dummy pixels P3C to P3F. The diagnosis processing section 45C first performs conversion into four codes "00", "01", "10", and "11" by using three thresholds TH1 to TH3 each set between a zero code and a full code on the basis of each of the six digital codes CODE for the six dummy pixels P3 in the dummy pixel region R31. The digital code CODE for the dummy pixel P3C is converted into the code "00", the digital code CODE for the dummy pixel P3D is converted into the code "01", the digital code CODE for the dummy pixel P3E is converted into the code "10", and the digital code CODE for the dummy pixel P3F is converted into the code "11". This causes the diagnosis processing section 45C to obtain the line identification information INFL illustrated in FIG. 17. The diagnosis processing section 45C then compares the address indicated by the address signal ADR and this line identification information INFL to diagnose whether or not the imaging device 1C is performing a desired operation. The same applies to the dummy pixel region R32.

[Modification Example 1-3]

In the above-described embodiment, information indicated by the arrangement of the dummy pixels P3 includes the line identification information INFL, but this is not limitative. For example, as illustrated in FIG. 19, still other information may also be included. In this example, the information indicated by the arrangement of the dummy pixels P3 includes 2-bit line attribute information INFP in addition to the line identification information INFL. The 2-bit line attribute information INFP indicates an attribute for each pixel line L. This line attribute information INFP may be, for example, information regarding a color filter for the pixel line L. In addition, for example, in a case where pixels are different in size between the pixel lines L, the line attribute information INFP may be information regarding the size of pixels. In addition, for example, in a case where the accumulation periods T10 are different in length between the pixel lines L, the line attribute information INFP may be information regarding the length of the accumulation periods T10. The diagnosis processing section 45 may obtain this line attribute information INFP on the basis of the digital codes CODE, and output this line attribute information INFP.

[Modification Example 1-4]

The imaging device 1 includes the two semiconductor chips 201 and 202 that are bonded to each other as in the implementation example E2 (FIG. 8). For example, a copper (Cu) wiring line is formed on the surface of the semiconductor chip 201 and a copper wiring line is formed on the surface of the semiconductor chip 202. These copper wiring lines may be joined together by a so-called Cu—Cu junction. The following describes this configuration in detail.

FIG. 20 illustrates a configuration example of an imaging device 431 according to the present modification example. The imaging device 431 includes a stacked semiconductor chip 432 obtained by bonding a first semiconductor chip 426 and a second semiconductor chip 428 together. A pixel array 434 is formed in the first semiconductor chip 426. A logic circuit 455 is formed in the second semiconductor chip 428. The first semiconductor chip 426 corresponds to the semiconductor chip 201, and the second semiconductor chip 428 corresponds to the semiconductor chip 202.

In the first semiconductor chip 426, a semiconductor well 430 is formed on a thinned semiconductor substrate 433, and the pixel array 434 is formed a region corresponding to this semiconductor well 430. In this pixel array 434, a plurality of pixels is two-dimensionally arranged. The plurality of pixels includes photodiodes PD and a plurality of pixel transistors Tr1 and Tr2. The photodiodes PD are formed in a region corresponding to an effective pixel array 442 and an optical black region 441 in the pixel array 434. In addition, a plurality of MOS transistors is formed on the semiconductor substrate 433. The plurality of MOS transistors is included in a control circuit (not illustrated) that controls the pixel array 434. A multilayer wiring layer 437 is formed on a front surface 433a side of the semiconductor substrate 433. The multilayer wiring layer 437 includes wiring lines 435 (wiring lines 435a to 435d) of first to fourth metal wiring layers M1 to M4 and a coupling wiring line 436 of a fifth metal wiring layer M5 with an interlayer insulation film 453 interposed therebetween. The wiring lines 435 and the coupling wiring line 436 are copper (Cu) wiring lines formed by a dual damascene method. A light-shielding film 439 is formed in a region including the optical black region 441 with an insulation film 438 interposed therebetween on the back surface side of the semiconductor substrate 433. A planarization film 443 is then formed over the entire region thereon, and a color filter 444 and a lens array 445 are formed in a region corresponding to the effective pixel array 442 on this planarization film 443.

In the multilayer wiring layer 437 of the first semiconductor chip 426, a pixel transistor and the wiring line 435 are coupled to each other through an electrically-conductive via 452. Similarly, the two wiring lines 435 adjacent to each other in the up-down direction are coupled to each other through the electrically-conductive via 452. In the multilayer wiring layer 437, the coupling wiring line 436 of the fifth metal wiring layer M5 is further formed on a junction surface 440 with the second semiconductor chip 428. The coupling wiring line 436 is coupled to a wiring line 435d1 of the fourth metal wiring layer M4 through the electrically-conductive via 452.

In the second semiconductor chip 428, a semiconductor well 450 is formed on a second semiconductor substrate 454, and a logic circuit 455 serving as a peripheral circuit is formed in a region corresponding to this semiconductor well 450. The logic circuit 455 includes a plurality of MOS transistors Tr11 to Tr14 including CMOS transistors. A multilayer wiring layer 459 is formed on the front surface side of the second semiconductor substrate 454. The multilayer wiring layer 459 includes wiring lines 457 (wiring lines 457a to 457c) of first to third metal wiring layers M11 to M13 and a coupling wiring line 458 of a fourth metal wiring layer M14 with an interlayer insulation film 456 interposed therebetween. The wiring lines 457 and the coupling wiring line 458 are copper (Cu) wiring lines formed by a dual damascene method.

In the multilayer wiring layer 459 of the second semiconductor chip 428, the MOS transistors Tr11 to Tr14 and the wiring line 457 are coupled to each other through an electrically-conductive via 464. The two wiring lines 457 adjacent to each other in the up-down direction are coupled to each other through the electrically-conductive via 464. In the multilayer wiring layer 459, the coupling wiring line 458 of the fourth metal wiring layer M14 is further formed on the junction surface 440 with the first semiconductor chip 426. The coupling wiring line 458 is coupled to a wiring line 457c of the third metal wiring layer M13 through the electrically-conductive via 464.

The first semiconductor chip 426 and the second semiconductor chip 428 are joined together to cause the multilayer wiring layer 437 and the multilayer wiring layer 459 to face each other. The coupling wiring line 436 and the coupling wiring line 458 are electrically coupled by being directly joined together with the junction surface 440 interposed therebetween. The coupling wiring lines 436 and 458 that are copper (Cu) wiring lines are joined together with a thermal diffusion junction. In addition, insulating thin films (not illustrated) may be formed on the respective surfaces of the multilayer wiring layer 437 and the multilayer wiring layer 459 to join the coupling wiring lines 436 and 458 together with a plasma junction or the like. Directly joining these coupling wiring lines 436 and 458 that are copper (Cu) wiring lines is a Cu—Cu junction.

[Modification Example 1-5]

The imaging device 1 includes the two semiconductor chips 201 and 202 that are bonded to each other as in the implementation example E2 (FIG. 8), but this is not limitative. The imaging device 1 may include three stacked semiconductor chips (first semiconductor chip 501, second semiconductor chip 502, and third semiconductor chip 503).

For example, the first semiconductor chip 501 may correspond to the semiconductor chip 201, and the third semiconductor chip 503 may correspond to the semiconductor chip 202. For example, DRAM (Dynamic Random Access Memory) may be formed in the second semiconductor chip 502. The DRAM stores a captured image (image signal DATA). In this case, the signal SIG outputted from a pixel array 511 of the first semiconductor chip 501 is directly supplied to the AD converter of the third semiconductor chip 503. Therefore, it is possible to use, for example, a through electrode 512 such as TSV (Through Silicon Via) for this connection, for example, as illustrated in FIG. 21. The through electrode 512 is coupled to a contact of the first semiconductor chip 501, and coupled to an aluminum pad of the third semiconductor chip 503.

In addition, for example, a comparator included in an AD converter may be formed in the second semiconductor chip 502, and a counter included in an AD converter may be formed in the third semiconductor chip 503. In this case, in this case, the signal SIG outputted from the pixel array 511 of the first semiconductor chip 501 is supplied to the comparator of the second semiconductor chip 502, and the output signal of the comparator is supplied to the counter of the third semiconductor chip 503. Accordingly, as illustrated in FIG. 22, it is possible to use a through electrode 512a such as TSV for a connection between the first semiconductor chip 501 and the second semiconductor chip 502. Similarly, it is possible to use a through electrode 512c such as TSV for a connection between the second semiconductor chip 502 and the third semiconductor chip 503.

[Modification Example 1-6]

WCSP(Waferlevel Chip Size Package) may be applied to the imaging device 1 according to the present embodiment. The following describes the present modification example in detail.

FIG. 23 schematically illustrates a configuration example of an imaging device 801 according to the present modification example. The imaging device 801 includes a stacked structure 853 in which a first structure 851 and a second structure 852 are stacked, a plurality of external terminals 854, and a protective substrate 858 formed above the first structure 851. It is to be noted that the first structure 851 corresponds to the semiconductor chip 201, and the second structure 852 corresponds to the semiconductor chip 202. A color filter 855 and an on-chip lens 856 are formed on the light incidence surface of the first structure 851. The protective substrate 858 is then disposed on the on-chip lens 856 with a glass seal resin 857 interposed therebetween. The external terminal 854 is an input/output terminal for exchanging signals with an external circuit of the imaging device 801, and includes, for example, a solder ball.

FIG. 24 illustrates a circuit disposition example of the imaging device 801. A pixel array 864 including a plurality of pixels 871 is formed in the first structure 851.

Scanning units 862 among pixel peripheral circuit portions of the imaging device 801 are disposed in the first structure 851 and the second structure 852. For example, a driver section of the scanning units 862 is disposed in the first structure 851, and an address decoder is disposed in the second structure 852. The scanning unit 862 disposed in the first structure 851 is disposed outside the pixel array 864 in the row direction (lateral direction), and at least a portion of the scanning unit 862 disposed in the second structure 852 is disposed on the lower layer side of the scanning unit 862 in the first structure 851. Wiring line coupling units 869 are disposed outside the scanning unit 862 disposed in the first structure 851 and outside the scanning unit 862 disposed in the second structure 852. The wiring line coupling units 869 couple these two scanning units 862 to each other.

Readout sections 865 among pixel peripheral circuit portions included in the imaging device 801 are disposed in the first structure 851 and the second structure 852. For example, a current source and a comparator of the readout sections 865 are disposed in the first structure 851, and a counter and a latch are disposed in the second structure 852. The readout section 865 disposed in the first structure 851 is disposed outside the pixel array 864 in the column direction (longitudinal direction), and at least a portion of the readout section 865 disposed in the second structure 852 is disposed on the lower layer side of the readout section 865 in the first structure 851. The wiring line coupling units 869 are disposed outside the readout section 865 disposed in the first structure 851 and outside the readout section 865 disposed in the second structure 852. The wiring line coupling units 869 couple these two readout sections 865 to each other.

An image signal processing unit 866 is disposed inside the scanning unit 862 and the readout section 865 disposed in the second structure 852.

In the second structure 852, a plurality of input/output circuit portions 889 is disposed in a region corresponding to the lower layer side of the pixel array 864 of the first structure 851. The plurality of input/output circuit portions 889 is provided in association with the plurality of respective external terminals 854.

FIG. 25 illustrates an example of the cross-sectional structure of the imaging device 801. FIG. 25 illustrates the cross-sectional structure taken along an A-A' line in FIG. 24. The pixel array 864 is disposed in the first structure 851 and a portion above. There is provided a pixel transistor region 1001 in the region (pixel array region) in which the pixel array 864 is formed. The pixel transistor region 1001 is a region in a pixel where a transistor is formed. The plurality of external terminals 854 is disposed in a region corresponding to the pixel array 864 of the first structure 851 on the lower surface of a semiconductor substrate 921 of the second structure 852. The plurality of external terminals 854 is coupled to the input/output circuit portions 889 through a through via 928 and an electrically-conductive pad 1022.

A wiring line coupling structure that couples a wiring line included in a multilayer wiring layer 942 of the first structure 851 and a wiring line included in a multilayer wiring layer 922 of the second structure 852 is referred to as upper/lower wiring line coupling structure. This upper/lower wiring line coupling structure is provided in an upper/lower wiring line coupling region 1014. The upper/lower wiring line coupling region 1014 is provided outside a pixel peripheral circuit region 1013. The upper/lower wiring line coupling structure includes a through electrode 949, a through electrode 945, and a coupling wiring line 946. The through electrode 949 is a silicon through electrode (TSV; Through Silicon Via) that penetrates a semiconductor substrate 941 from the upper surface of the first structure 851 to the multilayer wiring layer 942. The through electrode 945 is a chip penetrating electrode that penetrates the semiconductor substrate 941 and the multilayer wiring layer 942 from the upper surface of the first structure 851 to the multilayer wiring layer 922 of the second structure 852. The coupling wiring line 946 couples these two through electrodes. Such an upper/lower wiring line coupling structure is also referred to as twin contact structure.

FIG. 26 illustrates another example of the cross-sectional structure of the imaging device 801. An upper/lower wiring line coupling structure in this example is different from the upper/lower wiring line coupling structure illustrated in FIG. 25. In this example, in the pixel peripheral circuit region 1013, a portion of the wiring lines in the multilayer wiring layer 942 of the first structure 851 is disposed on the lowermost surface of the multilayer wiring layer 942. That is, a portion of the wiring lines in the multilayer wiring layer 942 is disposed on the junction surface between the first structure 851 and the second structure 852. Similarly, a portion of the wiring lines in the multilayer wiring layer 922 of the second structure 852 is disposed on the uppermost surface of the multilayer wiring layer 922. That is, a portion of the wiring lines in the multilayer wiring layer 922 is disposed on the junction surface between the first structure 851 and the second structure 852. These respective portions of the wiring lines in the multilayer wiring layer 942 and the wiring lines in the multilayer wiring layer 922 are disposed at substantially the same positions on this junction surface, and these wiring lines are electrically coupled to each other.

FIG. 27 illustrates a configuration example of the imaging device 801 having a twin contact structure. FIG. 27 illustrates the cross-sectional structure of a portion around the outer periphery of the imaging device 801.

The multilayer wiring layer 922 is formed on the upper side (first structure 851 side) of the semiconductor substrate 921 of the second structure 852. The multilayer wiring layer 922 includes a plurality of wiring layers 923 and interlayer insulation films 924. The plurality of wiring layers 923 includes an uppermost wiring layer 923a, a middle wiring layer 923b, a lowermost wiring layer 923c, and the like. The uppermost wiring layer 923a is the closest to the first structure 851. The lowermost wiring layer 923c is the closest to the semiconductor substrate 921. The interlayer insulation films 924 are formed between the respective wiring layers 923.

At a predetermined position on the semiconductor substrate 921, a silicon through hole 925 is formed that penetrates the semiconductor substrate 921, and a coupling conductor 927 is embedded in the inner wall of the silicon through hole 925 with an insulation film 926 interposed therebetween, thereby forming a through via (TSV: Through Silicon Via) 928. The coupling conductor 927 of the through via 928 is coupled to a wiring line 930 formed on the lower surface side of the semiconductor substrate 921, and the wiring line 930 is coupled to the external terminal 854. In addition, a solder mask (solder resist) 931 is formed on the lower surface side of the semiconductor substrate 921 to cover the wiring line 930 and the insulation film 926 except for a region in which the external terminal 854 is formed.

The multilayer wiring layer 942 is formed on the lower side (second structure 852 side) of the semiconductor substrate 941 of the first structure 851. The multilayer wiring layer 942 includes a plurality of wiring layers 943 and interlayer insulation films 944. The plurality of wiring layers 943 includes an uppermost wiring layer 943a, a middle wiring layer 943b, a lowermost wiring layer 943c, and the like. The uppermost wiring layer 943a is the closest to the semiconductor substrate 941. The lowermost wiring layer 943c is the closest to the second structure 852. The interlayer insulation films 944 are formed between the respective wiring layers 943.

The through electrode 949 that is a silicon through electrode and the through electrode 945 that is a chip penetrating electrode are formed in a predetermined region on the semiconductor substrate 941 where no color filter 855 or no on-chip lens 856 is formed. The through electrode 949 couples the wiring layers 943 of the first structure 851 and the coupling wiring line 946 formed on the upper surface of the semiconductor substrate 941, and the through electrode 945 couples the wiring layers 923 of the second structure 852 and the coupling wiring line 946. In addition, insulation films 947 are formed between the through electrode 949 and the semiconductor substrate 941 and between the through electrode 945 and the semiconductor substrate 941.

A planarization film 948 is formed between a photodiode 891 and the color filter 855 of the semiconductor substrate 941, and a planarization film 950 is also formed between the on-chip lens 856 and the glass seal resin 857.

It is to be noted that the present modification example is not limited to such a configuration. For example, as illustrated in FIG. 28A, the external terminal 854 may be formed at the position overlapping with the position of the through via 928. This eliminates the necessity of space on the back surface side of the imaging device 801 to form the wiring line 930. Accordingly, it is possible to dispose the external terminals 854 more densely as illustrated in FIG. 28B.

In addition, for example, as illustrated in FIG. 29, in the stacked structure 853, the wiring layer 943 of the second structure 852 and the wiring layer 923 of the first structure 851 may be coupled by the two through electrodes of the through electrode 949 and the through electrode 945, and the wiring layer 923 of the first structure 851 and the external terminal 854 may be coupled by the through via (TSV: Through Silicon Via) 928 and the wiring line 930.

In addition, for example, as illustrated in FIG. 30, the through via 928 may be filled with the solder mask (solder resist) 931, and a portion where the through via 928 is formed may be diced.

[Other Modification Examples]

In addition, two or more of these modifications may be combined.

2. Second Embodiment

Next, an imaging device 2 according to a second embodiment is described. In the present embodiment, identification information of an AD converter ADC is set for a readout section, and this identification information is used to perform a diagnosis process. It is to be noted that the same reference sign is used to refer to substantially the same component as that of the imaging device 1 according to the above-described first embodiment, and explanation thereof is omitted as necessary.

FIG. 31 illustrates a configuration example of the imaging device 2 according to the present embodiment. The imaging device 2 includes a pixel array 50, the two scanning units 20L and 20R, a readout section 60, and a controller 70.

The pixel array 50 includes the plurality of pixels P1 and the plurality of light-shielded pixels P2. The plurality of pixels P1 is disposed in the normal pixel region R1, and the plurality of light-shielded pixels P2 is disposed in the light-shielded pixel regions R21 and R22. In this example, in the pixel array 50, the light-shielded pixel region R21, the normal pixel region R1, and the light-shielded pixel region R22 are provided in this order from left to right in the horizontal direction (lateral direction in FIG. 31).

The readout section 60 performs AD conversion on the basis of the signal SIG supplied from the pixel array 50 through the signal line SGL, thereby generating the image signal DATA0.

FIG. 32 illustrates a configuration example of the readout section 60. It is to be noted that the controller 70 is also drawn in FIG. 32 in addition to the readout section 60. The readout section 60 includes a readout controller 61, the reference signal generator 32, the plurality of AD converters ADC (AD converters ADC[0], ADC[1], ADC[2], . . . ), a plurality of selectors SL (selectors SL[0], SL[1], SL[2], . . . ), the plurality of switches SW (switches SW[0], SW[1], SW[2], . . . ), and the bus wiring line 100.

The readout controller 61 controls a readout operation of the readout section 60 on the basis of an instruction from the controller 70. Specifically, the readout controller 61 supplies a control signal to the reference signal generator 32, thereby causing the reference signal generator 32 to generate the reference signal REF. In addition, the readout controller 61 supplies the clock signal CLK and the control signal CC to the plurality of AD converters ADC, thereby controlling AD conversion operations of the plurality of AD converters ADC. In addition, the readout controller 61 supplies the plurality of selectors SL with control signals CTL, thereby controlling respective selection operations of the plurality of selectors SL.

The selectors SL select and output one of the digital codes CODE supplied from the AD converters ADC or fixed digital codes CODE2 associated with the AD converters ADC on the basis of the control signals CTL. The plurality of selectors SL is provided in association with the plurality of AD converters ADC. Specifically, the 0th selector SL[0] is provided in association with the 0th AD converter ADC [0], the first selector SL[1] is provided in association with the first AD converter ADC[1], and the second selector SL[2] is provided in association with the second AD converter ADC[2].

Each of the digital codes CODE2 is a 12-bit code in this example. The selectors SL each include an input terminal that is supplied with this 12-bit digital code CODE2. The readout section 60 includes two voltage supply lines VHL and VLL. A voltage generation section 72 (described below) applies a high level voltage VH to the voltage supply line VHL, and the voltage generation section 72 applies a low level voltage VL to the voltage supply line VLL. The respective input terminals of the selectors SL for 12 bits are coupled to the voltage supply line VHL or the voltage supply line VLL. That is, the digital codes CODE2 are each fixed and set by a connection.

FIG. 33 illustrates examples of the 12-bit digital codes CODE2. For example, the digital code CODE2 corresponding to the 0th AD converter ADC[0] is "000000000000", the digital code CODE2 corresponding to the first AD converter ADC[1] is "000000000001", and the digital code CODE2 corresponding to the second AD converter ADC[2] is "000000000010". In this way, the digital codes CODE2 are set to be different from each other. Especially in this example, each of the digital codes CODE2 is a code corresponding to the cardinal number of the AD converter ADC expressed as a binary number. In this example, the digital code CODE2 is a 12-bit code, and it is thus possible to express the cardinal numbers of the 4096 AD converters ADC. That is, the digital code CODE2 functions as identification information INFA for identifying the AD converter ADC.

The switches SW then supply the digital codes outputted from the selectors SL to the bus wiring line 100 on the basis of the control signals SSW supplied from the controller 40.

The controller 70 (FIG. 31) supplies the scanning units 20L and 20R and the readout section 60 with control signals to control the operation of the imaging device 2. The controller 70 includes the address generation section 41, the voltage generation section 72, a column scanning section 73, the image processing section 44, and a diagnosis processing section 75.

The voltage generation section 72 generates the high level voltage VH, the low level voltage VL, and the power supply voltage VDD. The voltage generation section 72 supplies the generated high level voltage VH to the voltage supply line VHL in the readout section 60, supplies the generated low level voltage VL to the voltage supply line VLL in the readout section 60, and supplies the generated power supply voltage VDD to the plurality of power lines PL in the pixel array 50.

The column scanning section 73 determines the selector SL to be subjected to a data transfer operation in the readout section 30, and generates the control signal SSW on the basis of a result of the determination. The column scanning section 43 then supplies the generated control signal SSW to the plurality of switches SW of the readout section 60.

The diagnosis processing section 75 performs a diagnosis process on the basis of the control signal SSW generated by the column scanning section 43 and the image signal DATA0. Specifically, the diagnosis processing section 75 generates a code indicating the selector SL to be subjected to a data transfer operation on the basis of the control signal SSW. Specifically, for example, in a case where the 0th selector SL[0] is to be subjected to a data transfer operation, the diagnosis processing section 75 generates a code "000000000000". In a case where the first selector SL[1] is to be subjected to a data transfer operation, the diagnosis processing section 75 generates a code "000000000001". In a case where the second selector SL[2] is to be subjected to a data transfer operation, the diagnosis processing section 75 generates a code "000000000010". The diagnosis processing section 75 then compares the code generated on the basis of the control signal SSW and the digital code CODE2 included in the image signal DATA0 to diagnose whether or not the imaging device 2 is performing a desired operation.

Here, the AD converters ADC correspond to specific examples of a "first conversion circuit" and a "second conversion circuit" in the present disclosure. The selectors SL correspond to specific examples of a "first selector" and a "second selector" in the present disclosure. The switch SW corresponds to a specific example of a "transfer section" in the present disclosure. The diagnosis processing section 75 corresponds to a specific example of a "diagnosis unit" in the present disclosure.

FIG. 34 schematically illustrates an overall operation example of a diagnosis process of the imaging device 2.

The readout controller 61 of the readout section 60 supplies the control signals CTL to the plurality of selectors SL on the basis of an instruction from the controller 70, thereby controlling the respective operations of the plurality of selectors SL to cause the fixed digital codes CODE2 to be selected and outputted.

The column scanning section 43 of the controller 70 then generates the control signals SSW to cause the selectors SL to be sequentially subjected to data transfer operations. This causes the readout section 60 to supply the controller 70 with the digital codes CODE2 outputted by the plurality of selectors SL as the image signal DATA0.

The diagnosis processing section 75 of the controller 70 generates a code indicating the selector SL to be subjected to a data transfer operation on the basis of the control signal SSW. The diagnosis processing section 75 then compares the code generated on the basis of the control signal SSW and the digital code CODE2 included in the image signal DATA0 to diagnose whether or not the imaging device 2 is performing a desired operation.

For example, in a case where the code generated on the basis of the control signal SSW and the digital code CODE2 included in the image signal DATA0 match each other, the diagnosis processing section 75 diagnoses that the imaging device 2 is performing a desired operation.

In addition, for example, in a case where the code generated on the basis of the control signal SSW and the digital code CODE2 included in the image signal DATA0 do not match each other, the diagnosis processing section 75 diagnoses that the imaging device 2 has a malfunction. The mismatch between the generated code and the digital code CODE2 included in the image signal DATA0 may be caused, for example, by a malfunction of the column scanning section 73, a connection malfunction between the column scanning section 73 and the plurality of switches SW, a malfunction of the plurality of switches SW, a connection malfunction between the readout section 60 and the diagnosis processing section 75, or the like.

The diagnosis processing section 75 performs a diagnosis process in this way. The diagnosis processing section 75 then outputs a result of the diagnosis process as the diagnosis result RES.

As described above, the imaging device 2 is provided with the selector SL between the AD converter ADC and the switch SW. The selector SL selects and outputs one of the digital code CODE supplied from the AD converter ADC or the fixed digital code CODE2 associated with the AD converter ADC. Accordingly, performing a self-diagnosis makes it possible to detect a trouble of data transfer control.

As described above, in the present embodiment, there is provided a selector between an AD converter and a switch. The selector is able to output a fixed digital code associated with the AD converter. Accordingly, performing a self-diagnosis makes it possible to detect a malfunction of an imaging device.

[Modification Example 2-1]

For example, the technology according to the first embodiment and the technology according to the second embodiment may be combined.

[Modification Example 2-2]

The respective modification examples of the above-described first embodiment may be applied to the imaging device 2 according to the above-described embodiment.

3. Usage Examples of Imaging Device

FIG. 35 illustrates a usage example of the imaging devices 1 and 2 according to the above-described embodiments. For example, the above-described imaging devices 1 and 2 are usable in a variety of cases of sensing light such as visible light, infrared light, ultraviolet light, and X-ray as follows.

Devices that shoot images for viewing such as digital cameras and mobile devices having a camera function Devices for traffic use such as onboard sensors that shoot images of the front, back, surroundings, inside, and so on of an automobile for safe driving such as automatic stop and for recognition of a driver's state, monitoring cameras that monitor traveling vehicles and roads, and distance measuring sensors that measure vehicle-to-vehicle distance Devices for use in home electrical appliances such as televisions, refrigerators, and air-conditioners to shoot images of a user's gesture and operate the appliances in accordance with the gesture Devices for medical care and healthcare use such as endoscopes and devices that shoot images of blood vessels by receiving infrared light Devices for security use such as monitoring cameras for crime prevention and cameras for individual authentication Devices for beauty care use such as skin measuring devices that shoot images of skin and microscopes that shoot images of scalp Devices for sports use such as action cameras and wearable cameras for sports applications, etc.

Devices for agricultural use such as cameras for monitoring fields and crops

4. Example of Application to Mobile Body

The technology (the present technology) according to the present disclosure is applicable to various products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

FIG. 36 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 36, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 36, an audio speaker 12061, a display section 12062, and an instrument panel 12063 are illustrated as the output device. The display section 12062 may, for example, include at least one of an on-board display and a head-up display.

FIG. 37 is a diagram depicting an example of the installation position of the imaging section 12031.

In FIG. 37, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 37 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure may be applied has been described above. The technology according to the present disclosure may be applied to the imaging section 12031 among the components described above. Accordingly, in the vehicle control system 12000, performing a diagnosis process makes it possible to diagnose whether or not the imaging section 12031 operates properly. Then, in a case where the imaging section 12031 has a malfunction, for example, the microcomputer 12051 is notified of a result of the diagnosis. This allows the vehicle control system 12000 to apprehend that the imaging section 12031 has a malfunction. For example, this allows the vehicle control system 12000 to perform an appropriate process such as calling a driver's attention, making it possible to increase reliability. In addition, in the vehicle control system 12000, it is possible to restrict a function of controlling a vehicle on the basis of a result of a diagnosis process. Specific examples of the function of controlling the vehicle include a function of collision avoidance or shock mitigation for the vehicle, a function of following driving based on vehicle-to-vehicle distance, a function of vehicle speed maintaining driving, a function of a warning of collision of the vehicle, a function of a warning of deviation of the vehicle from a lane, etc. In a case where it is determined as a result of the diagnosis process that the imaging section 12031 has a malfunction, it is possible to restrict or disable the function of controlling the vehicle. This allows the vehicle control system 12000 to prevent an accident resulting from a detection error based on the malfunction in the imaging section 12031.

The present technology has been described above by using some embodiments, modification examples, and specific application examples thereof. However, the present technology is not limited to these embodiments, etc., but may be modified in a variety of manners.

For example, the technology according to the first embodiment and the technology according to the second embodiment may be combined.

It is to be noted that the effects described in the present specification are merely illustrative, but not limited. Other effects may be included.

It is to be noted that the present technology may be configured as below.

(1)

An imaging device including:

a plurality of pixel circuits each including a first terminal, a second terminal, a third terminal, an accumulation unit, a first transistor, a second transistor, and an output unit, the accumulation unit being configured to accumulate an electric charge, the first transistor being configured to couple the third terminal to the accumulation unit on the basis of a voltage of the first terminal, the second transistor being configured to supply a predetermined voltage to the accumulation unit on the basis of a voltage of the second terminal, the output unit being configured to output a signal corresponding to a voltage in the accumulation unit, the plurality of pixel circuits including a first pixel circuit, a second pixel circuit, and a third pixel circuit;

a first control line extending in a first direction, the first control line being coupled to the respective first terminals of the first pixel circuit, the second pixel circuit, and the third pixel circuit;

a second control line extending in the first direction, the second control line being coupled to the respective second terminals of the first pixel circuit, the second pixel circuit, and the third pixel circuit;

a first voltage supply line coupled to the third terminal of the first pixel circuit;

a second voltage supply line coupled to the third terminal of the second pixel circuit;

a first light-receiving element coupled to the third terminal of the third pixel circuit; and a diagnosis unit configured to perform a diagnosis process on the basis of a first signal and a second signal, the first signal being outputted from the output unit of the first pixel circuit, the second signal being outputted from the output unit of the second pixel circuit.

(2)

The imaging device according to (1), further including:

an address generation section configured to generate an address signal; and a driving unit configured to drive the first control line and the second control line on the basis of the address signal, in which the diagnosis unit performs the diagnosis process on the basis of the address signal, the first signal, and the second signal.

(3)

The imaging device according to (2), in which the diagnosis unit includes a conversion circuit configured to generate a first digital code by performing AD conversion on the basis of the first signal, and generate a second digital code by performing AD conversion on the basis of the second signal, and a diagnosis circuit configured to perform the diagnosis process on the basis of the address signal, the first digital code, and the second digital code.

(4)

The imaging device according to (2) or (3), in which the first control line, the second control line, the first voltage supply line, the second voltage supply line, the plurality of pixel circuits, and the first light-receiving element are formed on a first semiconductor substrate, and the address generation section and the driving unit are formed on a second semiconductor substrate, the second semiconductor substrate being bonded to the first semiconductor substrate.

(5)

The imaging device according to any of (1) to (4), in which the plurality of pixel circuits each belongs to any of a plurality of pixel lines, the first pixel circuit, the second pixel circuit, and the third pixel circuit belong to a first pixel line of the plurality of pixel lines, a predetermined number of pixel circuits the respective third terminals of which are coupled to the first voltage supply line or the second voltage supply line belong to the plurality of respective pixel lines, the predetermined number being greater than or equal to two, and a number of the plurality of pixel lines is less than or equal to a number that is expressible by a coupling combination of the respective third terminals with the first voltage supply line or the second voltage supply line in the predetermined number of pixel circuits.

(6)

The imaging device according to (5), in which first information includes second information, the first information being indicated by the coupling combination of the respective third terminals with the first voltage supply line or the second voltage supply line in the predetermined number of pixel circuits, the predetermined number of pixel circuits belonging to the first pixel line, the second information being configured to identify the first pixel line.

(7)

The imaging device according to (6), in which the first information further includes third information, the third information indicating an attribute of the first pixel line.

(8)

The imaging device according to any of (1) to (7), further including:

a third control line and a fourth control line each extending in the first direction; and a signal line coupled to the output unit of the first pixel circuit, in which the plurality of pixel circuits includes a fourth pixel circuit, the first terminal of the fourth pixel circuit is coupled to the third control line, the second terminal of the fourth pixel circuit is coupled to the fourth control line, the output unit of the fourth pixel circuit is coupled to the signal line, and the third terminal of the fourth pixel circuit is coupled to the second voltage supply line.

(9)

The imaging device according to any of (1) to (8), further including a second light-receiving element for which light is blocked, in which the plurality of pixel circuits includes a fifth pixel circuit, the first terminal of the fifth pixel circuit is coupled to the first control line, the second terminal of the fifth pixel circuit is coupled to the second control line, and the third terminal of the fifth pixel circuit is coupled to the second light-receiving element.

(10)

The imaging device according to any of (1) to (9), further including a voltage supply section configured to apply a first voltage signal to the first voltage supply line, the first voltage signal having a first voltage and a second voltage.

(11)

The imaging device according to (10), in which the first voltage includes the predetermined voltage, and the first voltage signal has the first voltage in a first period in which the first transistor and the second transistor are both turned on, and has the second voltage in a second period outside the first period.

(12)

The imaging device according to any of (1) to (11), further including a third voltage supply line, in which the plurality of pixel circuits includes a sixth pixel circuit, the first terminal of the sixth pixel circuit is coupled to the first control line, the second terminal of the sixth pixel circuit is coupled to the second control line, and the third terminal of the sixth pixel circuit is coupled to the third voltage supply line.

(13)

The imaging device according to any of (1) to (12), further including a first driving unit configured to drive the first control line, in which the first control line has a first end to which the first driving unit is coupled, and a second end, the first pixel circuit and the second pixel circuit are disposed in a first region, the third pixel circuit is disposed in a second region, and the first region and the second region are disposed in this order in a direction from the second end to the first end.

(14)

The imaging device according to (13), further including a second driving unit coupled to the second end of the first control line, the second driving unit being configured to drive the first control line.

(15)

The imaging device according to (14), in which the plurality of pixel circuits includes a seventh pixel circuit and an eighth pixel circuit, the respective first terminals of the seventh pixel circuit and the eighth pixel circuit are coupled to the first control line, the respective second terminals of the seventh pixel circuit and the eighth pixel circuit are coupled to the second control line, the third terminal of the seventh pixel circuit is coupled to the first voltage supply line, the third terminal of the eighth pixel circuit is coupled to the second voltage supply line, the seventh pixel circuit and the eighth pixel circuit are disposed in the third region, and the first region, the second region, and the third region are disposed in this order in a direction from the second end to the first end.

(16)

An imaging device including:

a plurality of pixel circuits each including a first terminal, a second terminal, a third terminal, an accumulation unit, a first transistor, a second transistor, and an output unit, the accumulation unit being configured to accumulate an electric charge, the first transistor being configured to couple the third terminal to the accumulation unit on the basis of a voltage of the first terminal, the second transistor being configured to supply a predetermined voltage to the accumulation unit on the basis of a voltage of the second terminal, the output unit being configured to output a signal corresponding to a voltage in the accumulation unit, the plurality of pixel circuits including a first pixel circuit, a second pixel circuit, and a third pixel circuit;

a first control line extending in a first direction, the first control line being coupled to the respective first terminals of the first pixel circuit, the second pixel circuit, and the third pixel circuit;

a second control line extending in the first direction, the second control line being coupled to the respective second terminals of the first pixel circuit, the second pixel circuit, and the third pixel circuit;

a first voltage supply line coupled to the third terminal of the first pixel circuit;

a second voltage supply line coupled to the third terminal of the second pixel circuit; and a first light-receiving element coupled to the third terminal of the third pixel circuit.

(17)

An imaging device including:

a first pixel circuit;

a first signal line coupled to the first pixel circuit;

a first conversion circuit configured to generate a first digital code by performing AD conversion on the basis of a signal in the first signal line;

a first selector including a first input terminal and a second input terminal, the first input terminal being supplied with the first digital code, the second input terminal being supplied with a first fixed digital code, the first selector being configured to select and output any one of the first digital code or the first fixed digital code;

a transfer section configured to transfer a digital code outputted from the first selector; and a diagnosis unit configured to perform a diagnosis process on the basis of the first fixed digital code transferred by the transfer section.

(18)

The imaging device according to (17), further including:

a second pixel circuit;

a second signal line coupled to the second pixel circuit;

a second conversion circuit configured to generate a second digital code by performing AD conversion on the basis of a signal in the second signal line; and a second selector including a first input terminal and a second input terminal, the first input terminal being supplied with the second digital code, the second input terminal being supplied with a second fixed digital code, the second selector being configured to select and output any one of the second digital code or the second fixed digital code, in which the second fixed digital code includes a digital code different from the first fixed digital code, the transfer section further transfers a digital code outputted from the second selector, and the diagnosis unit performs the diagnosis process on the basis of the first fixed digital code and the second fixed digital code, the first fixed digital code and the second fixed digital code being transferred by the transfer section.

(19)

The imaging device according to (17) or (18), in which the first fixed digital code includes information, the information being configured to identify the first conversion circuit.

This application claims the benefit of Japanese Priority Patent Application JP2017-234360 filed with Japan Patent Office on Dec. 6, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device comprising:
a plurality of pixel circuits each including a first terminal, a second terminal, a third terminal, an accumulation unit, a first transistor, a second transistor, and an output unit, the accumulation unit being configured to accumulate an electric charge, the first transistor being configured to couple the third terminal to the accumulation unit on a basis of a voltage of the first terminal, the second transistor being configured to supply a predetermined voltage to the accumulation unit on a basis of a voltage of the second terminal, the output unit being configured to output a signal corresponding to a voltage in the accumulation unit, the plurality of pixel circuits including a first pixel circuit, a second pixel circuit, and a third pixel circuit;
a first control line extending in a first direction, the first control line being coupled to the respective first terminals of the first pixel circuit, the second pixel circuit, and the third pixel circuit;

a second control line extending in the first direction, the second control line being coupled to the respective second terminals of the first pixel circuit, the second pixel circuit, and the third pixel circuit;

a first voltage supply line coupled to the third terminal of the first pixel circuit;

a second voltage supply line coupled to the third terminal of the second pixel circuit;

a first light-receiving element coupled to the third terminal of the third pixel circuit; and a diagnosis unit configured to perform a diagnosis process on a basis of a first signal and a second signal, the first signal being outputted from the output unit of the first pixel circuit, the second signal being outputted from the output unit of the second pixel circuit.

2. The imaging device according to claim 1, further comprising:

an address generation section configured to generate an address signal; and a driving unit configured to drive the first control line and the second control line on a basis of the address signal, wherein the diagnosis unit performs the diagnosis process on a basis of the address signal, the first signal, and the second signal.

3. The imaging device according to claim 2, wherein the diagnosis unit includes a conversion circuit configured to generate a first digital code by performing AD conversion on a basis of the first signal, and generate a second digital code by performing AD conversion on a basis of the second signal, and a diagnosis circuit configured to perform the diagnosis process on a basis of the address signal, the first digital code, and the second digital code.

4. The imaging device according to claim 2, wherein the first control line, the second control line, the first voltage supply line, the second voltage supply line, the plurality of pixel circuits, and the first light-receiving element are formed on a first semiconductor substrate, and the address generation section and the driving unit are formed on a second semiconductor substrate, the second semiconductor substrate being bonded to the first semiconductor substrate.

5. The imaging device according to claim 1, wherein the plurality of pixel circuits each belongs to any of a plurality of pixel lines, the first pixel circuit, the second pixel circuit, and the third pixel circuit belong to a first pixel line of the plurality of pixel lines, a predetermined number of pixel circuits the respective third terminals of which are coupled to the first voltage supply line or the second voltage supply line belong to the plurality of respective pixel lines, the predetermined number being greater than or equal to two, and a number of the plurality of pixel lines is less than or equal to a number that is expressible by a coupling combination of the respective third terminals with the first voltage supply line or the second voltage supply line in the predetermined number of pixel circuits.

6. The imaging device according to claim 5, wherein first information includes second information, the first information being indicated by the coupling combination of the respective third terminals with the first voltage supply line or the second voltage supply line in the predetermined number of pixel circuits, the predetermined number of pixel circuits belonging to the first pixel line, the second information being configured to identify the first pixel line.

7. The imaging device according to claim 6, wherein the first information further includes third information, the third information indicating an attribute of the first pixel line.

8. The imaging device according to claim 1, further comprising:

a third control line and a fourth control line each extending in the first direction; and a signal line coupled to the output unit of the first pixel circuit, wherein the plurality of pixel circuits includes a fourth pixel circuit, the first terminal of the fourth pixel circuit is coupled to the third control line, the second terminal of the fourth pixel circuit is coupled to the fourth control line, the output unit of the fourth pixel circuit is coupled to the signal line, and the third terminal of the fourth pixel circuit is coupled to the second voltage supply line.

9. The imaging device according to claim 1, further comprising a second light-receiving element for which light is blocked, wherein the plurality of pixel circuits includes a fifth pixel circuit, the first terminal of the fifth pixel circuit is coupled to the first control line, the second terminal of the fifth pixel circuit is coupled to the second control line, and the third terminal of the fifth pixel circuit is coupled to the second light-receiving element.

10. The imaging device according to claim 1, further comprising a voltage supply section configured to apply a first voltage signal to the first voltage supply line, the first voltage signal having a first voltage and a second voltage.

11. The imaging device according to claim 10, wherein the first voltage includes the predetermined voltage, and the first voltage signal has the first voltage in a first period in which the first transistor and the second transistor are both turned on, and has the second voltage in a second period outside the first period.

12. The imaging device according to claim 1, further comprising a third voltage supply line, wherein the plurality of pixel circuits includes a sixth pixel circuit, the first terminal of the sixth pixel circuit is coupled to the first control line, the second terminal of the sixth pixel circuit is coupled to the second control line, and the third terminal of the sixth pixel circuit is coupled to the third voltage supply line.

13. The imaging device according to claim 1, further comprising a first driving unit configured to drive the first control line, wherein the first control line has a first end to which the first driving unit is coupled, and a second end, the first pixel circuit and the second pixel circuit are disposed in a first region, the third pixel circuit is disposed in a second region, and the first region and the second region are disposed in this order in a direction from the second end to the first end.

14. The imaging device according to claim 13, further comprising a second driving unit coupled to the second end of the first control line, the second driving unit being configured to drive the first control line.

15. The imaging device according to claim 14, wherein the plurality of pixel circuits includes a seventh pixel circuit and an eighth pixel circuit, the respective first terminals of the seventh pixel circuit and the eighth pixel circuit are coupled to the first control line, the respective second terminals of the seventh pixel circuit and the eighth pixel circuit are coupled to the second control line, the third terminal of the seventh pixel circuit is coupled to the first voltage supply line, the third terminal of the eighth pixel circuit is coupled to the second voltage supply line, the seventh pixel circuit and the eighth pixel circuit are disposed in the third region, and the first region, the second region, and the third region are disposed in this order in a direction from the second end to the first end.

16. An imaging device comprising:

a plurality of pixel circuits each including a first terminal, a second terminal, a third terminal, an accumulation unit, a first transistor, a second transistor, and an output unit, the accumulation unit being configured to accumulate an electric charge, the first transistor being configured to couple the third terminal to the accumulation unit on a basis of a voltage of the first terminal, the second transistor being configured to supply a predetermined voltage to the accumulation unit on a basis of a voltage of the second terminal, the output unit being configured to output a signal corresponding to a voltage in the accumulation unit, the plurality of pixel circuits including a first pixel circuit, a second pixel circuit, and a third pixel circuit;

a first control line extending in a first direction, the first control line being coupled to the respective first terminals of the first pixel circuit, the second pixel circuit, and the third pixel circuit;

a second control line extending in the first direction, the second control line being coupled to the respective second terminals of the first pixel circuit, the second pixel circuit, and the third pixel circuit;

a first voltage supply line coupled to the third terminal of the first pixel circuit;

a second voltage supply line coupled to the third terminal of the second pixel circuit; and a first light-receiving element coupled to the third terminal of the third pixel circuit.

17. An imaging device comprising:

a first pixel circuit;

a first signal line coupled to the first pixel circuit;

a first conversion circuit configured to generate a first digital code by performing AD conversion on a basis of a signal in the first signal line;

a first selector including a first input terminal and a second input terminal, the first input terminal being supplied with the first digital code, the second input terminal being supplied with a first fixed digital code, the first selector being configured to output a selected digital code by selecting between any one of the first digital code or the first fixed digital code;

a transfer section configured to transfer the selected digital code that is output from the first selector; and a diagnosis unit configured to perform a diagnosis process on a basis of the selected digital code that is transferred by the transfer section.

18. The imaging device according to claim 17, further comprising:

a second pixel circuit;

a second signal line coupled to the second pixel circuit;

a second conversion circuit configured to generate a second digital code by performing AD conversion on a basis of a signal in the second signal line; and a second selector including a first input terminal and a second input terminal, the first input terminal being supplied with the second digital code, the second input terminal being supplied with a second fixed digital code, the second selector being configured to output a second selected digital code by selecting between any one of the second digital code or the second fixed digital code, wherein the second fixed digital code is different from the first fixed digital code, the transfer section further transfers the second selected digital code that is output from the second selector, and the diagnosis unit further configured to perform the diagnosis process on a basis of the selected digital code and the second selected digital code that are transferred by the transfer section.

19. The imaging device according to claim 17, wherein the first fixed digital code includes information that identifies the first conversion circuit.

* * * * *